(12) United States Patent
Yamazaki et al.

(10) Patent No.: US 11,588,137 B2
(45) Date of Patent: Feb. 21, 2023

(54) FUNCTIONAL PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Shunpei Yamazaki, Setagaya (JP); Shingo Eguchi, Atsugi (JP); Koji Kusunoki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 153 days.

(21) Appl. No.: 16/885,725

(22) Filed: May 28, 2020

(65) Prior Publication Data

US 2020/0388790 A1     Dec. 10, 2020

(30) Foreign Application Priority Data

Jun. 5, 2019 (JP) ............................. JP2019-105180
Jun. 5, 2019 (JP) ............................. JP2019-105181

(51) Int. Cl.
| | |
|---|---|
| *H01L 27/32* | (2006.01) |
| *H01L 51/52* | (2006.01) |
| *H01L 51/50* | (2006.01) |
| *G06F 3/041* | (2006.01) |
| *G09G 3/3225* | (2016.01) |

(52) U.S. Cl.
CPC .......... *H01L 51/5275* (2013.01); *G06F 3/041* (2013.01); *G09G 3/3225* (2013.01);
(Continued)

(58) Field of Classification Search
CPC .... G02B 6/003; G02B 6/0036; G02B 3/0056; G09F 13/18; G09F 9/33; G02F 1/133616;
(Continued)

(56) References Cited

U.S. PATENT DOCUMENTS

| | | |
|---|---|---|
| 5,107,175 A | 4/1992 | Hirano et al. |
| 5,124,204 A | 6/1992 | Yamashita et al. |
(Continued)

FOREIGN PATENT DOCUMENTS

| | | |
|---|---|---|
| CN | 101676615 A | 3/2010 |
| JP | 08-083688 A | 3/1996 |
(Continued)

OTHER PUBLICATIONS

Reineke.S et al., "White organic light-emitting diodes with fluorescent tube efficiency", Nature, May 14, 2009, vol. 459, pp. 234-239.
(Continued)

*Primary Examiner* — Duc Q Dinh
(74) *Attorney, Agent, or Firm* — Robinson Intellectual Property Law Office; Eric J. Robinson

(57) ABSTRACT

A novel functional panel that is highly convenient, useful, or reliable is provided. The functional panel includes a pixel including a microlens array and a light-emitting device. The light-emitting device emits first light. The microlens array collects the first light. The microlens array includes a plurality of microlenses. The microlenses have a cross section having a shape with which they can be arranged with a filling factor higher than that of a circle on a plane parallel to the light-emitting device. The microlenses have a curved surface on a plane orthogonal to the plane parallel to the light-emitting device. The convex side of the curved surface faces the light-emitting device.

21 Claims, 27 Drawing Sheets

(52) U.S. Cl.
CPC ........ *H01L 27/322* (2013.01); *H01L 27/3246* (2013.01); *H01L 51/5004* (2013.01); *G09G 2354/00* (2013.01); *G09G 2360/141* (2013.01); *G09G 2360/144* (2013.01); *H01L 2251/552* (2013.01)

(58) Field of Classification Search
CPC ......... G02F 1/133526; G02F 1/133614; G02F 1/133555; G02F 1/133345; G02F 1/136227; G02F 1/133553; G02F 1/133512; G02F 1/13338; H04N 1/02865; H04N 9/045; H04N 13/218; H04N 13/305; H04N 13/322; H01L 51/5271; H01L 33/405; H01L 33/60; H01L 51/5275; H01L 27/3209; H01L 33/504; H01L 2251/5353; H01L 2251/552; H01L 27/3211; H01L 27/322; H01L 27/3244; H01L 27/3246; H01L 51/5004; G09G 2354/00; G09G 2360/141
See application file for complete search history.

(56) References Cited

U.S. PATENT DOCUMENTS

| | | | |
|---|---|---|---|
| 5,189,405 A | 2/1993 | Yamashita et al. | |
| 5,315,377 A | 5/1994 | Isono et al. | |
| 5,317,349 A | 5/1994 | Vanderwerf | |
| 5,686,360 A | 11/1997 | Harvey et al. | |
| 5,693,956 A | 12/1997 | Shi et al. | |
| 5,757,126 A | 5/1998 | Harvey et al. | |
| 5,771,562 A | 6/1998 | Harvey et al. | |
| 5,811,177 A | 9/1998 | Shi et al. | |
| 5,952,778 A | 9/1999 | Haskal et al. | |
| 5,962,962 A | 10/1999 | Fujita et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,219,113 B1 | 4/2001 | Takahara | |
| 6,268,695 B1 | 7/2001 | Affinito | |
| 6,274,887 B1 | 8/2001 | Yamazaki et al. | |
| 6,413,645 B1 | 7/2002 | Graff et al. | |
| 6,771,021 B2 | 8/2004 | Cok | |
| 6,847,163 B1 | 1/2005 | Tsutsui et al. | |
| 6,965,195 B2 | 11/2005 | Yamazaki et al. | |
| 6,987,613 B2 | 1/2006 | Pocius et al. | |
| 7,144,752 B2* | 12/2006 | Yotsuya ............. H01L 51/5275 438/99 |
| 7,182,481 B2 | 2/2007 | Shimura | |
| 7,202,504 B2 | 4/2007 | Ikeda et al. | |
| 7,245,429 B2 | 7/2007 | Yoshikawa et al. | |
| 7,473,928 B1 | 1/2009 | Yamazaki et al. | |
| 7,554,263 B2 | 6/2009 | Takahashi | |
| 7,663,312 B2 | 2/2010 | Anandan | |
| 7,692,199 B2 | 4/2010 | Arai | |
| 7,722,965 B2 | 5/2010 | Juni et al. | |
| 7,755,097 B2 | 7/2010 | Kim | |
| 7,859,627 B2 | 12/2010 | Nishida et al. | |
| 7,956,349 B2 | 6/2011 | Tsutsui et al. | |
| 8,003,993 B2 | 8/2011 | Cho et al. | |
| 8,004,003 B2 | 8/2011 | Kim | |
| 8,042,975 B2 | 10/2011 | Shyu et al. | |
| 8,496,341 B2 | 7/2013 | Kawata et al. | |
| 8,686,630 B2 | 4/2014 | Hiyama et al. | |
| 8,853,724 B2 | 10/2014 | Seo et al. | |
| 9,977,152 B2* | 5/2018 | Zhang ............ G02B 3/0012 |
| 11,271,054 B2* | 3/2022 | Lee ............... H01L 51/5284 |
| 2001/0035713 A1 | 11/2001 | Kimura | |
| 2001/0053082 A1 | 12/2001 | Chipalkatti et al. | |
| 2003/0007359 A1 | 1/2003 | Sugawara et al. | |
| 2004/0217702 A1 | 11/2004 | Garner et al. | |
| 2005/0142379 A1 | 6/2005 | Juni et al. | |
| 2005/0199599 A1 | 9/2005 | Li et al. | |
| 2005/0258436 A1 | 11/2005 | Arai | |
| 2006/0007552 A1 | 1/2006 | Takakuwa et al. | |
| 2006/0139953 A1 | 6/2006 | Chou et al. | |
| 2006/0237735 A1 | 10/2006 | Naulin et al. | |
| 2007/0222372 A1 | 9/2007 | Cok et al. | |
| 2008/0018231 A1 | 1/2008 | Hirakata | |
| 2008/0121918 A1 | 5/2008 | Denbaars et al. | |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2008/0213931 A1 | 9/2008 | Asabe | |
| 2009/0162623 A1 | 6/2009 | Foresti et al. | |
| 2009/0190237 A1* | 7/2009 | Silverstein ......... G02F 1/133606 359/726 |
| 2009/0267092 A1 | 10/2009 | Fukshima et al. | |
| 2010/0006882 A1 | 1/2010 | Arai | |
| 2010/0013372 A1 | 1/2010 | Oikawa et al. | |
| 2010/0019664 A1 | 1/2010 | Mishima | |
| 2010/0046236 A1 | 2/2010 | Nishiwaki | |
| 2010/0090234 A1 | 4/2010 | Cho et al. | |
| 2010/0110551 A1 | 5/2010 | Lamansky et al. | |
| 2010/0295443 A1 | 11/2010 | Roberts et al. | |
| 2011/0038028 A1 | 2/2011 | Dharmatilleke | |
| 2011/0134647 A1 | 6/2011 | Nishida et al. | |
| 2011/0147777 A1 | 6/2011 | Konno et al. | |
| 2011/0205468 A1 | 8/2011 | Hirakata et al. | |
| 2011/0210332 A1 | 9/2011 | Jintyou et al. | |
| 2012/0097982 A1 | 4/2012 | Wakimoto et al. | |
| 2012/0097991 A1 | 4/2012 | Ikeda et al. | |
| 2012/0099331 A1 | 4/2012 | Yamazaki et al. | |
| 2012/0126268 A1 | 5/2012 | Seo et al. | |
| 2012/0204566 A1 | 8/2012 | Hartzell et al. | |
| 2013/0249384 A1* | 9/2013 | Sawabe ............. H01L 51/524 313/504 |
| 2016/0043145 A1* | 2/2016 | Choi ............... H01L 51/5253 257/40 |
| 2017/0372669 A1* | 12/2017 | Takesue ............. G09G 3/3413 |
| 2019/0103442 A1* | 4/2019 | Choi ............... H01L 51/5209 |
| 2019/0198573 A1* | 6/2019 | Kim ................ H01L 51/5281 |
| 2019/0329803 A1* | 10/2019 | Beier .............. G08G 1/095 |
| 2020/0064528 A1* | 2/2020 | Uto ................. F21V 7/22 |
| 2020/0091463 A1* | 3/2020 | Guo ................ H01L 51/56 |

FOREIGN PATENT DOCUMENTS

| | | |
|---|---|---|
| JP | 2002-299039 A | 10/2002 |
| JP | 2005-332773 A | 12/2005 |
| JP | 2007-173424 A | 7/2007 |
| JP | 2008-010317 A | 1/2008 |
| JP | 2008-066027 A | 3/2008 |
| JP | 2008-098083 A | 4/2008 |
| WO | WO-2010/090207 | 8/2010 |

OTHER PUBLICATIONS

Taiwanese Office Action (Application No. 100141657) dated Dec. 21, 2015.
Motoyama. Y et al., "High-efficiency OLED microdisplay with microlens array", J. Soc. Inf. Display (Journal of The Society for Information Display), Apr. 16, 2019, vol. 27, No. 6, pp. 354-360.
Park.Y et al., "A Highly Mass-producible Nano-lens Array Technology for Optically Efficient Full-color Organic Light Emitting Diode Display Applications", SID Digest '19 : SID International Symposium Digest of Technical Papers, May 12, 2019, vol. 50, No. 1, pp. 149-152.
Chen.C et al., "3D Pixel Configurations for Optical Out-Coupling of OLED Displays—Part II:Experimental Validation", SID Digest '19 : SID International Symposium Digest of Technical Papers, May 12, 2019, vol. 50, No. 1, pp. 145-148.
Hwang.C et al., "Unique Belt Plane Source Evaporation Techniques for the Mass Production of 2250ppi AMOLED and 77" QQ OLED TV", SID Digest '19 : SID International Symposium Digest of Technical Papers, May 12, 2019, vol. 50, No. 1, pp. 949-952.

* cited by examiner

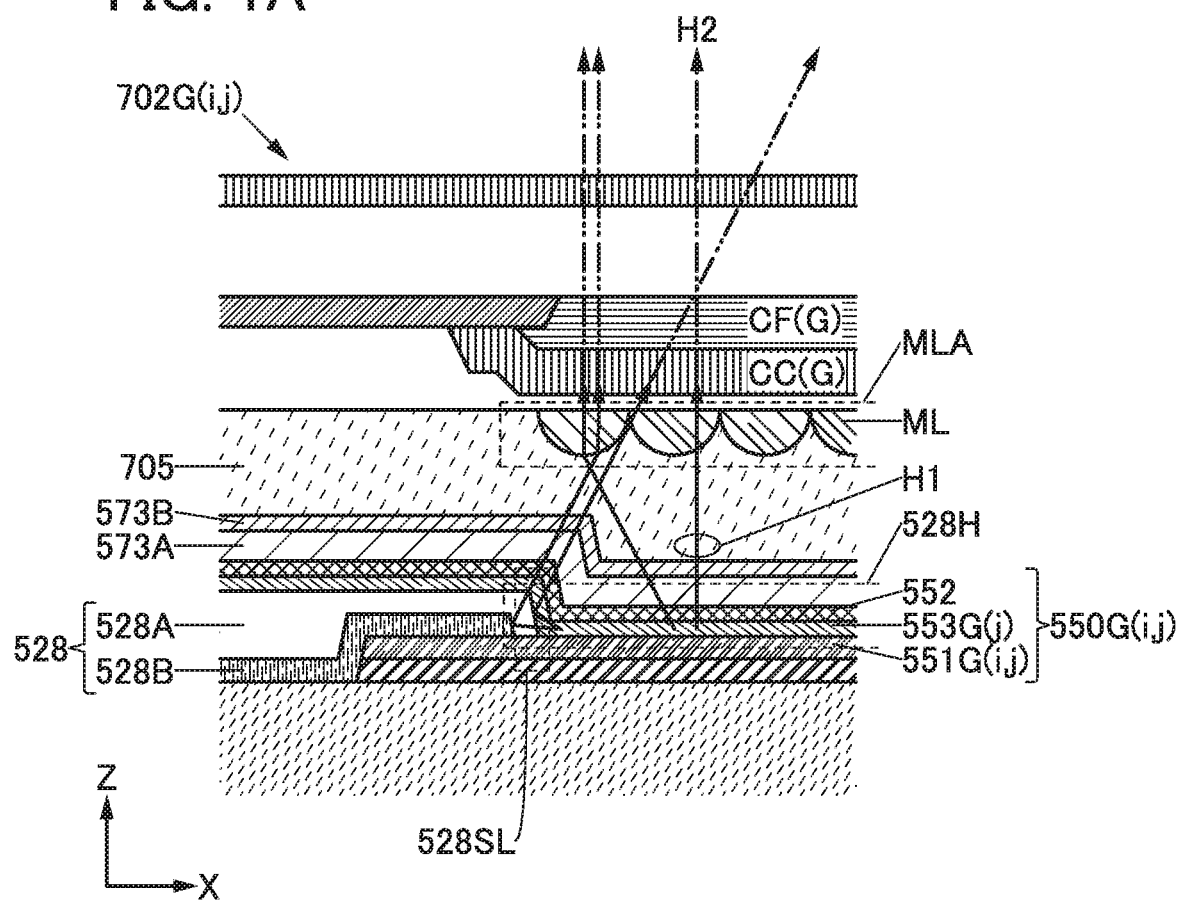
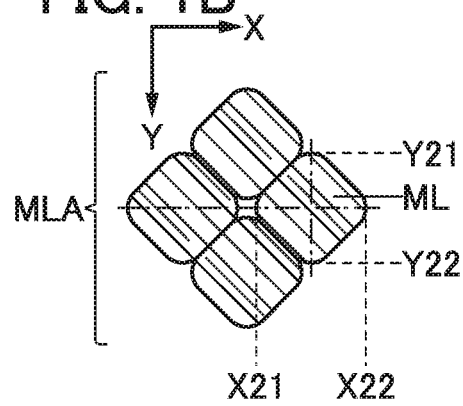
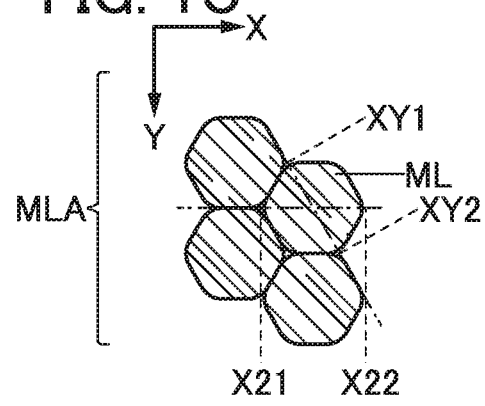
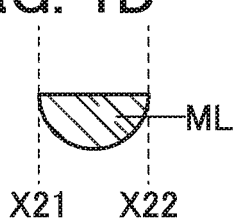
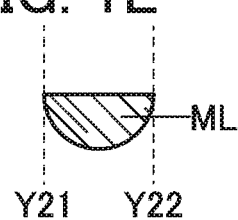
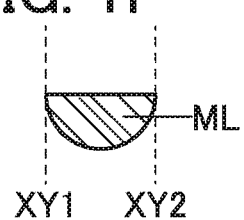

FUNCTIONAL PANEL, DISPLAY DEVICE, INPUT/OUTPUT DEVICE, AND DATA PROCESSING DEVICE

BACKGROUND OF THE INVENTION

1. Field of the Invention

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method of driving any of them, and a method of manufacturing any of them.

2. Description of the Related Art

A high-efficiency organic EL microdisplay that focuses on the increase in out-coupling efficiency using a microlens array and has an efficiency three times that of a conventional organic light-emitting diode is known (Non-Patent Document 1).

There is known a technique for increasing the current efficiency of a red organic light-emitting diode by 1.57 times with the use of a nano-lens array formed by a vacuum evaporation process (Non-Patent Document 2).

There is also known a technique for increasing the efficiency of extracting light from an organic light-emitting diode with the use of a concave structure that is formed by filling a bank opening with a high-index filler (Non-Patent Document 3).

A technique for forming a high-resolution organic light-emitting diode on a large-sized glass substrate by using a belt-shaped evaporation source is known (Non-Patent Document 4).

REFERENCE

Non-Patent Document

[Non-Patent Document 1] Yosuke Motoyama et al., Journal of the Society for Information Display, 2019, pp. 1-7.
[Non-Patent Document 2] Young-Sam Park et al., SID Symposium Digest of Technical Papers, 2019, volume 50, issue 1, pp. 149-152.
[Non-Patent Document 3] Chung-China Chen et al., SID Symposium Digest of Technical Papers, 2019, volume 50, issue 1, pp. 145-148.
[Non-Patent Document 4] Changhun Hwang et al., SID Symposium Digest of Technical Papers, 2019, volume 50, issue 1, pp. 949-952.

SUMMARY OF THE INVENTION

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the description of these objects does not preclude the existence of other objects. One embodiment of the present invention does not have to achieve all these objects. Other objects will be apparent from and can be derived from the description of the specification, the drawings, the claims, and the like.

(1) One embodiment of the present invention is a functional panel including a pixel.

The pixel includes a microlens array and a light-emitting device. The light-emitting device emits first light.

The microlens array collects the first light and includes a plurality of microlenses.

The microlenses have a cross section having a shape with which they can be arranged with a filling factor higher than a filling factor of a circle on a plane parallel to the light-emitting device. Moreover, each of the microlenses has a curved surface on a plane orthogonal to the plane parallel to the light-emitting device, and a convex side of the curved surface faces the light-emitting device.

Accordingly, without a reduction in the light-receiving area, the thickness of the microlenses can be reduced compared to a structure where one microlens is used to collect light. Alternatively, the microlenses can be provided closer to the light-emitting device. Alternatively, the thickness of the functional panel can be small. Alternatively, a plurality of microlenses can be arranged densely. Alternatively, the area can be effectively used. Thus, a novel functional panel that is highly convenient, useful, or reliable can be provided.

(2) Another embodiment of the present invention is a functional panel including a pixel.

The pixel includes a microlens and a light-emitting device. The light-emitting device emits first light.

The microlens collects the first light. A convex portion of the microlens faces the light-emitting device. The microlens is a Fresnel lens.

Accordingly, without a reduction in the light-receiving area, the thickness of the microlenses can be reduced compared to a structure where a lens with the same focal length is used to collect light. Alternatively, the microlenses can be provided closer to the light-emitting device. Alternatively, the thickness of the functional panel can be small. Thus, a novel functional panel that is highly convenient, useful, or reliable can be provided.

(3) Another embodiment of the present invention is the above functional panel including an insulating film.

The insulating film has an opening. The opening overlaps with the light-emitting device. The opening has an inclined surface on a side wall. The inclined surface reflects the first light toward the microlens.

Accordingly, the first light emitted from the light-emitting device can be collected and focused on the microlens. Alternatively, the first light emitted from the light-emitting device can be effectively used. Thus, a novel functional panel that is highly convenient, useful, or reliable can be provided.

(4) Another embodiment of the present invention is the above functional panel in which the pixel includes a color conversion layer.

The microlens is placed between the light-emitting device and the color conversion layer, and collects and focuses the first light on the color conversion layer, The conversion layer converts the first light into second light. The intensity of long-wavelength light in a spectrum of the second light is higher than the intensity of long-wavelength light in a spectrum of the first light.

Accordingly, the first light emitted from the light-emitting device can be collected and focused on the color conversion layer. Alternatively, the first light emitted from the light-emitting device can be collected and then converted into the second light. The first light emitted from the light-emitting device can be efficiently collected because of its higher directivity than that of light transmitted through the color conversion layer. Alternatively, the first light emitted from the light-emitting device can be used more efficiently than in the case of collecting light transmitted through the color conversion layer. Thus, a novel functional panel that is highly convenient, useful, or reliable can be provided.

(5) Another embodiment of the present invention is the above functional panel in which the color conversion layer include a quantum dot and a light-transmitting resin.

Accordingly, the spectral width of the second light can be narrowed. Alternatively, light with a narrow spectral half-width can be used. Alternatively, a color with high saturation can be displayed. Alternatively, aggregation of the quantum dots can be prevented. Thus, a novel functional panel that is highly convenient, useful, or reliable can be provided.

(6) Another embodiment of the present invention is the above functional panel including a light-blocking layer. The light-blocking layer has an opening, and the opening overlaps with the light-emitting device.

(7) Another embodiment of the present invention is the above functional panel including a coloring layer. The coloring layer has a lower transmittance of the first light than a transmittance of the second light.

Accordingly, the amount of external light that reaches the color conversion layer can be reduced. Alternatively, unintentional conversion of external light by the color conversion layer can be inhibited. Alternatively, a reduction in contrast due to external light can be inhibited. Alternatively, the display quality can be improved. As a result, a novel functional panel that is highly convenient, useful, or reliable can be provided.

(8) Another embodiment of the present invention is the above functional panel in which the light-emitting device includes a first layer, a second layer, a third layer, and a fourth layer.

The third layer is placed between the second layer and the fourth layer.

The second layer is placed between the first layer and the third layer.

The first layer contains a first material and a second material. The second layer contains a third material. The third layer contains a light-emitting material and a fourth material. The fourth layer contains a fifth material and a sixth material.

The first material has a HOMO level higher than or equal to −5.7 eV and lower than or equal to −5.4 eV. The second material has an acceptor property.

The third material has a lower HOMO level than the first material.

The fourth material has a lower HOMO level than the third material.

The fifth material has a HOMO level higher than or equal to −6 eV The sixth material is an organic complex of alkali metal or an organic complex of alkaline earth metal.

(9) Another embodiment of the present invention is the above functional panel in which the fifth material has an electron mobility higher than or equal to $1\times10^{-7}$ cm$^2$/Vs and lower than or equal to $5\times10^{-5}$ cm$^2$/Vs when the square root of the electric field strength [V/cm] is 600.

Accordingly, a reduction in display quality, a reduction in color reproducibility, or a reduction in luminance that would occur after the functional panel starts being used can be inhibited. Alternatively, entry of impurities from the outside that would degrade characteristics can be inhibited. Alternatively, a bright color can be displayed. Alternatively, the productivity is high. Thus, a novel functional panel that is highly convenient, useful, or reliable can be provided.

(10) Another embodiment of the present invention is the above functional panel in which the light-emitting device includes a first light-emitting unit, a second light-emitting unit, and an intermediate layer.

The intermediate layer includes a region positioned between the first light-emitting unit and the second light-emitting unit. The intermediate layer supplies a hole to one of the first light-emitting unit and the second light-emitting unit and supplies an electron to the other of the first light-emitting unit and the second light-emitting unit.

Accordingly, the light emission efficiency can be increased. Alternatively, power consumption can be reduced. Thus, a novel functional panel that is highly convenient, useful, or reliable can be provided.

(11) Another embodiment of the present invention is the above functional panel including a set of pixels. The set of pixels includes the pixel and another pixel.

The pixel includes a first pixel circuit. The another pixel includes a second pixel circuit and a photoelectric conversion device.

The light-emitting device is electrically connected to the first pixel circuit. The photoelectric conversion device is electrically connected to the second pixel circuit.

(12) Another embodiment of the present invention is the above functional panel including a functional layer.

The functional layer includes the first pixel circuit, and the first pixel circuit includes a first transistor. The functional layer also includes the second pixel circuit, and the second pixel circuit includes a second transistor. Moreover, the functional layer includes a driver circuit, and the driver circuit includes a third transistor.

The first transistor includes a semiconductor film. The second transistor includes a semiconductor film that can be formed in a step of forming the semiconductor film of the first transistor. Moreover, the third transistor includes a semiconductor film that can be formed in the step of forming the semiconductor film of the first transistor.

Accordingly, the pixel circuit can be formed in the functional layer. Alternatively, the driver circuit can be formed in the functional layer. Alternatively, for example, the semiconductor film used in the driver circuit can be formed in the step of forming the semiconductor film used in the pixel circuit. Alternatively, the process of manufacturing the functional panel can be simplified. As a result, a novel functional panel that is highly convenient, useful, or reliable can be provided.

(13) Another embodiment of the present invention is a display device including any of the above functional panels and a control unit.

The control unit is supplied with image data and control data. The control unit generates data on the basis of the image data. The control unit generates a control signal on the basis of the control data. The control unit supplies the data and the control signal.

The functional panel is supplied with the data and the control signal. The pixel emits light on the basis of the data.

Accordingly, the image data can be displayed using the light-emitting device. Consequently, a novel display device that is highly convenient, useful, or reliable can be provided.

(14) Another embodiment of the present invention is an input/output device including an input unit and a display unit. The display unit includes the above functional panel.

The input unit includes a sensing region and senses an object approaching the sensing region. The sensing region includes a region overlapping with the pixel.

Accordingly, an object that approaches the region overlapping with the display unit can be sensed while image data is displayed using the display unit. Alternatively, a finger or the like that approaches the display unit can be used as a pointer to input positional data. Alternatively, positional data can be associated with image data displayed on the display unit. Consequently, a novel input/output device that is highly convenient, useful, or reliable can be provided.

(15) Another embodiment of the present invention is a data processing device including an arithmetic device and an input/output device.

The arithmetic device is supplied with input data or sensing data. The arithmetic device generates control data and image data on the basis of the input data or the sensing data. The arithmetic device supplies the control data and the image data.

The input/output device supplies the input data and the sensing data. The input/output device is supplied with the control data and the image data. The input/output device includes a display unit, an input unit, and a sensor unit.

The display unit includes the above functional panel. The display unit displays the image data on the basis of the control data. The input unit generates the input data, and the sensor unit generates the sensing data.

Accordingly, the control data can be generated on the basis of the input data or the sensing data. Alternatively, the image data can be displayed on the basis of the input data or the sensing data. Consequently, a novel data processing device that is highly convenient, useful, or reliable can be provided.

(16) Another embodiment of the present invention is a data processing device including the above functional panel and at least one of a keyboard, a hardware button, a pointing device, a touch sensor, an illuminance sensor, an imaging device, an audio input device, an eye-gaze input device, and an attitude sensing device.

The above structure allows the arithmetic device to generate image data or control data on the basis of data supplied using a variety of input devices. Consequently, a novel data processing device that is highly convenient, useful, or reliable can be provided.

Although the block diagram attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

In this specification, one of a first electrode and a second electrode of a transistor refers to a source electrode and the other refers to a drain electrode.

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 1A to 1F illustrate a structure of a functional panel of one embodiment;

DETAILED DESCRIPTION OF THE INVENTION

Figure 2A:
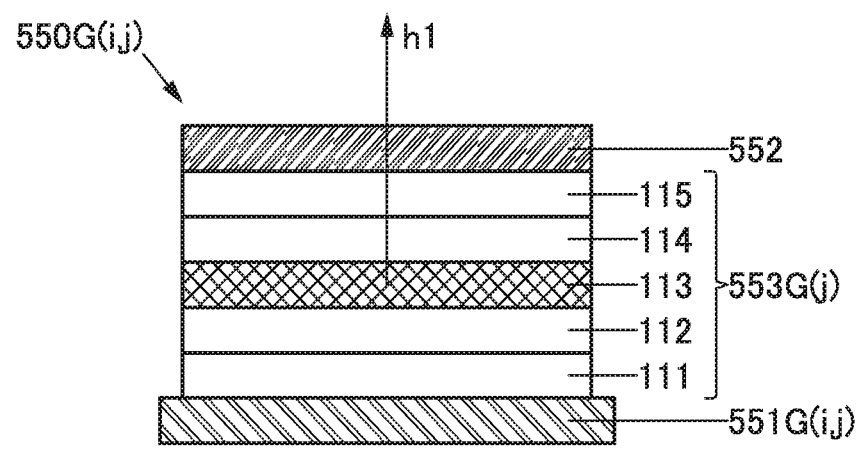
FIGS. 2A and 2B each illustrate a structure of a light-emitting element of a functional panel of one embodiment.

A functional panel of one embodiment of the present invention includes a pixel. The pixel includes a microlens array and a light-emitting element. The light-emitting element emits first light. The microlens array collects the first light. The microlens array includes a plurality of microlenses. The microlenses have a cross section having a shape with which they can be arranged with a filling factor higher than that of a circle on a plane parallel to the light-emitting element. Each of the microlenses has a curved surface on a plane orthogonal to the plane parallel to the light-emitting element. The convex side of the curved surface faces the light-emitting element.

Accordingly, without a reduction in the light-receiving area, the thickness of the microlenses can be reduced compared to a structure where one microlens is used to collect light. Alternatively, the microlenses can be provided closer to the light-emitting element. Alternatively, the thickness of the functional panel can be small. Alternatively, the plurality of microlenses can be arranged densely. Alternatively, the area can be effectively used. Thus, a novel functional panel that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a functional panel of one embodiment of the present invention will be described with reference to FIGS. 1A to 1F, FIGS. 2A and 2B, and FIGS. 3A and 3B.

FIG. 1A is a cross-sectional view illustrating part of a pixel 702G(i,j) in a functional panel of one embodiment of the present invention. FIG. 1B is a bottom view illustrating part of FIG. 1A. FIG. 1C is a bottom view illustrating part of FIG. 1A which has a structure different from that in FIG. 1B. FIG. 1D is a cross-sectional view along the line X21-X22 in FIG. 1B. FIG. 1E is a cross-sectional view along the line Y21-Y22 in FIG. 1B. FIG. 1F is a cross-sectional view along the line XY1-XY2 in FIG. 1C.

Figure 2B:
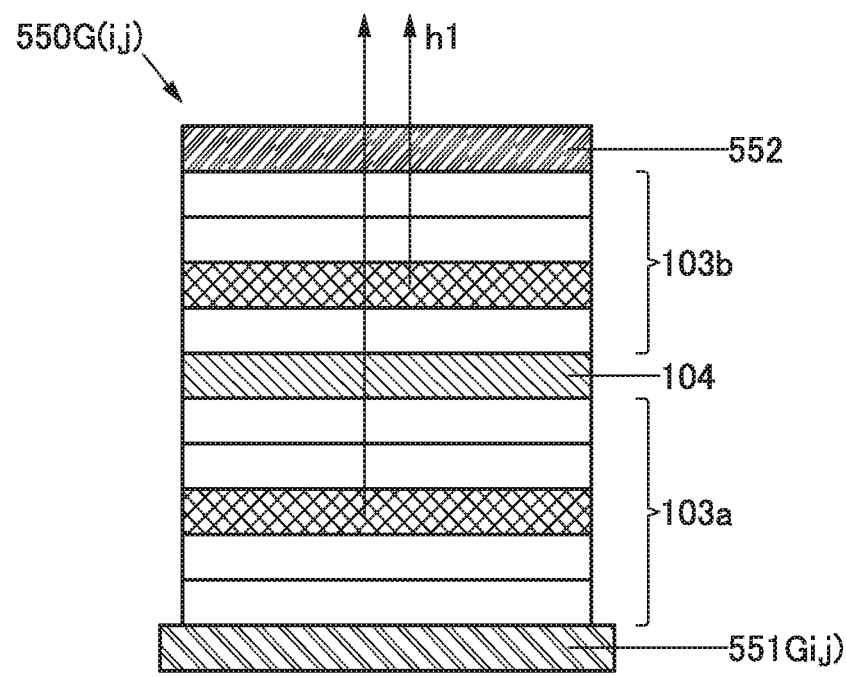

FIGS. 2A and 2B are cross-sectional views each illustrating a structure of a light-emitting element 550G(i,j) that can be used in a functional panel of one embodiment of the present invention.

Figure 3A:
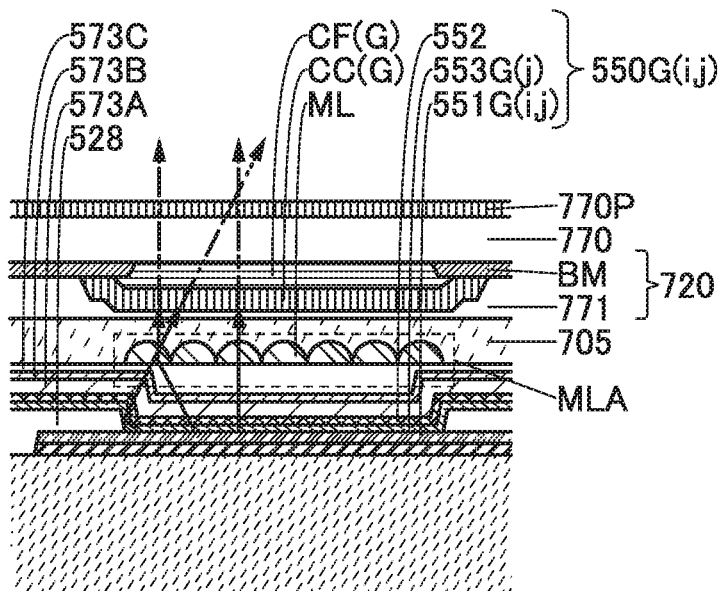
FIGS. 3A and 3B each illustrate a structure of a functional panel of one embodiment.
Figure 3B:
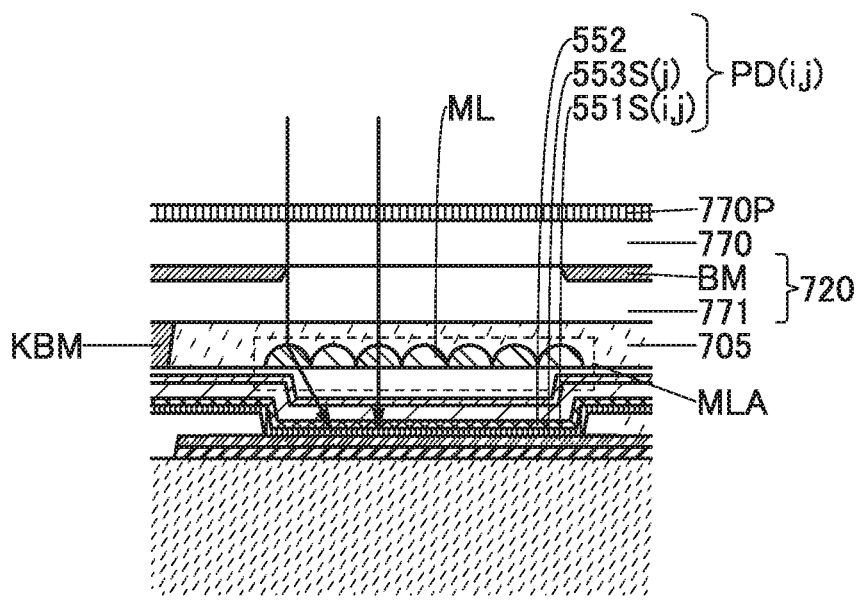

FIG. 3A illustrates a structure of a functional panel of one embodiment of the present invention and is a cross-sectional view illustrating a structure of the pixel 702G(i,j) different from that in FIG. 1A. FIG. 3B is a cross-sectional view illustrating a structure of a pixel 702S(i,j) in a functional panel of one embodiment of the present invention.

Figure 24:
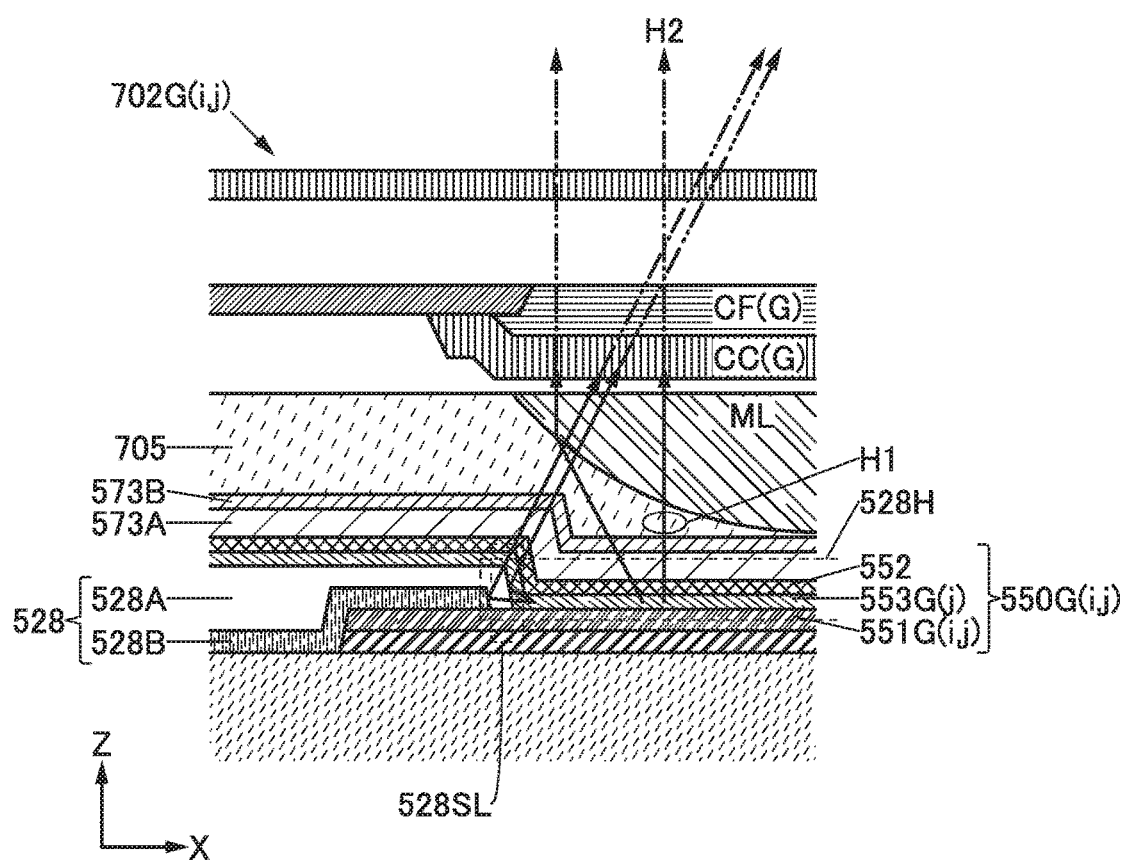
FIG. 24 illustrates a structure of a functional panel of one embodiment.

FIG. 24 is a cross-sectional view illustrating part of the pixel 702G(i,j) that can be used in a functional panel of one embodiment of the present invention.

Figure 25A:
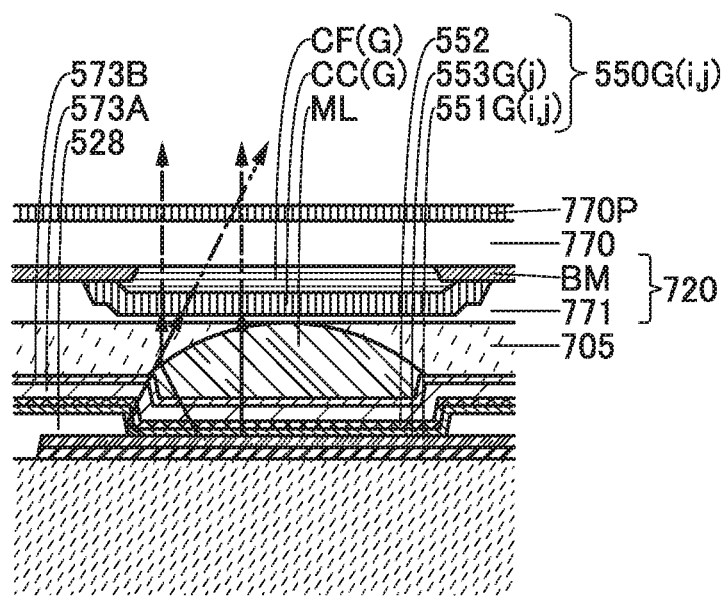
FIGS. 25A and 25B each illustrate a structure of a functional panel of one embodiment.
Figure 25B:
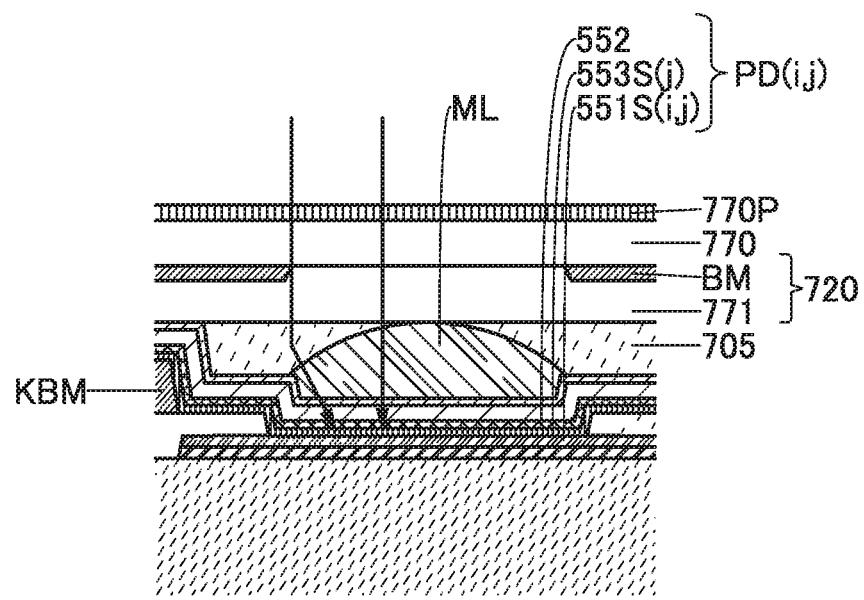

FIGS. 25A and 25B illustrate a structure of a functional panel of one embodiment of the present invention. FIG. 25A is a cross-sectional view illustrating a structure of the pixel 702G(i,j) different from that in FIG. 24. FIG. 25B is a cross-sectional view illustrating a structure of the pixel 702S(i,j) in a functional panel of one embodiment of the present invention.

Note that in this specification, an integer variable of 1 or more may be used for reference numerals. For example, "(p)" where p is an integer variable of 1 or more may be used for part of a reference numeral that specifies any one of components (p components at a maximum). For another example, "(m,n)" where each of m and n is an integer variable of 1 or more may be used for part of a reference numeral that specifies any one of components (m×n components at a maximum).

<Structure Example 1 of Functional Panel 700>

The functional panel described in this embodiment includes the pixel 702G(i,j).

«Structure Example 1 of Pixel 702G(i,j)»

The pixel 702G(i,j) includes a microlens array MLA and the light-emitting element 550G(i,j) (see FIG. 1A). Note that in this specification, a light-emitting element is interchangeable with a light-emitting device, and a photoelectric conversion element is interchangeable with a photoelectric conversion device.

The light-emitting element 550G(i,j) emits light H1.

«Structure Example 1 of Microlens Array MLA»

The microlens array MLA collects the light H1. The microlens array MLA includes a plurality of microlenses ML (see FIG. 1B).

The microlens ML has a cross section having a shape with which the microlenses ML can be arranged with a filling factor higher than that of a circle on a plane parallel to the light-emitting element 550G(i,j) (e.g., a plane XY, a light-emitting region extended in a planar manner, or a plane where a plurality of light-emitting elements are arranged).

The microlens ML has a curved surface on a plane orthogonal to the plane XY (e.g., a plane XZ or a plane YZ) (see FIGS. 1D to 1F). The convex side of the curved surface faces the light-emitting element 550G(i,j) (see FIG. 1A). For example, a spherical surface or an aspherical surface can be used as the curved surface. In the case where a sealant 705, for example, is provided between the microlens ML and the light-emitting element 550G(i,j), the microlens ML has a refractive index different from that of the sealant 705. Specifically, a material having a higher refractive index than the sealant 705 can be used for the microlens ML.

Accordingly, without a reduction in the light-receiving area, the thickness of the microlenses ML can be reduced compared to a structure where one microlens is used to collect light. Alternatively, the microlenses ML can be provided closer to the light-emitting element 550G(i,j). Alternatively, the thickness of the functional panel can be small. Alternatively, a plurality of microlenses can be arranged densely. Alternatively, the area can be effectively used. As a result, a novel functional panel that is highly convenient, useful, or reliable can be provided.

«Structure Example 2 of Pixel 702G(i,j)»

The pixel 702G(i,j) includes the microlens ML and the light-emitting element 550G(i,j).

The light-emitting element 550G(i,j) emits the light H1.

«Structure Example 1 of Microlens ML»

The microlens ML collects the light H1. The convex portion of the microlens ML faces the light-emitting element 550G(i,j). The microlens ML is a Fresnel lens.

Accordingly, without a reduction in the light-receiving area, the thickness of the microlenses ML can be reduced compared to a structure where one microlens is used to collect light. Alternatively, the microlenses ML can be provided closer to the light-emitting element 550G(i,j). Alternatively, the thickness of the functional panel can be small. Alternatively, a plurality of microlenses can be arranged densely. Alternatively, the area can be effectively used. As a result, a novel functional panel that is highly convenient, useful, or reliable can be provided.

«Structure Example 3 of Pixel 702G(i,j)»

The pixel 702G(i,j) includes a color conversion layer CC(G) (see FIG. 1A).

The microlens ML is placed between the light-emitting element 550G(i,j) and the color conversion layer CC(G). The microlens ML collects and focuses the light H1 on the color conversion layer CC(G).

«Structure Example 1 of Color Conversion Layer CC(G)»

The conversion layer CC(G) converts the light H1 into light H2. The light H2 has a spectrum where the intensity of long wavelength light is higher than that in the spectrum of the light H1.

Accordingly, the light H1 emitted from the light-emitting element 550G(i,j) can be collected and focused on the color conversion layer CC(G). Alternatively, the light H1 emitted from the light-emitting element 550G(i,j) can be collected and then converted into the light H2. The light H1 emitted from the light-emitting element 550G(i,j) can be efficiently collected because of its higher directivity than that of light transmitted through the color conversion layer CC(G). Alternatively, the light H1 emitted from the light-emitting element 550G(i,j) can be used more efficiently than in the case of collecting light transmitted through the color conversion layer CC(G). Thus, a novel functional panel that is highly convenient, useful, or reliable can be provided.

«Structure Example 2 of Microlens ML»

For example, the microlens ML can have a shape such that its convex portion faces the color conversion layer CC(G) (see FIG. 3A).

<Structure Example 2 of Functional Panel 700>

The functional panel described in this embodiment includes an insulating film 528.

«Insulating Film 528»

The insulating film 528 has an opening 528H, and the opening 528H overlaps with the light-emitting element 550G(i,j) (see FIG. 1A). Note that the insulating film 528 has a function of separating a plurality of adjacent pixels and thus can be referred to as a partition. The insulating film 528 may partly include a conductive film as long as the insulating film 528 has a function of separating a plurality of pixels.

The opening 528H has an inclined surface 528SL on its side wall. The inclined surface 528SL reflects the light H1 toward the microlens ML. A material having high reflectivity for the light H1 can be used for the insulating film 528. For example, a film 528A and a film 528B can be used as the insulating film 528. Specifically, a metal film having high reflectivity can be used as the film 528B, and an end portion of the film 528B can be covered with the film 528A having an insulating property (see FIG. 1A). For example, when the sealant 705 is provided, the film 528A has a refractive index different from that of the sealant 705. Specifically, a material having a higher refractive index than the sealant 705 can be used for the microlens.

Accordingly, the light H1 emitted from the light-emitting element 550G(i,j) can be collected and focused on the microlens ML. Alternatively, the light H1 emitted from the light-emitting element 550G(i,j) can be effectively used. Thus, a novel functional panel that is highly convenient, useful, or reliable can be provided.

«Structure Example 2 of Color Conversion Layer CC(G)»

The color conversion layer CC(G) includes quantum dots and a light-transmitting resin. For example, the quantum dots can be covered with a film that has a light-transmitting property and is less likely to generate or transmit a gas. Alternatively, a resin polymerized with quantum dots can be used. Alternatively, a photosensitive polymer that covers quantum dots can be used. With the use of a photosensitive polymer, a fine color conversion layer CC(G) can be formed.

Accordingly, the spectral width of the light H2 can be narrowed. Alternatively, light with a narrow spectral half-width can be used. Alternatively, a color with high saturation can be displayed. Alternatively, aggregation of the quantum dots can be prevented. Thus, a novel functional panel that is highly convenient, useful, or reliable can be provided.

<Structure Example 3 of Functional Panel 700>

A functional panel of one embodiment of the present invention includes a light-blocking layer BM and a coloring film CF(G).

«Light-Blocking Layer BM»

The light-blocking layer BM has an opening, and the opening overlaps with the light-emitting element 550G(i,j).

«Coloring Film CF(G)»

In the coloring film CF(G), the transmittance of the light H1 is lower than the transmittance of the light H2.

Accordingly, the amount of external light that reaches the color conversion layer CC(G) can be reduced. Alternatively, unintentional conversion of external light by the color conversion layer CC(G) can be inhibited. Alternatively, a reduction in contrast due to external light can be inhibited. Alternatively, the display quality can be improved. As a result, a novel functional panel that is highly convenient, useful, or reliable can be provided.

«Structure Example 1 of Light-Emitting Element 550G(i,j)»

The light-emitting element 550G(i,j) includes a layer 111, a layer 112, a layer 113, and a layer 114 (see FIG. 2A). Moreover, a layer 115 can be used in the light-emitting element 550G(i,j). The layer 111, the layer 112, the layer 113, and the layer 114 can be formed by a variety of known film formation methods. For example, a vacuum evaporation method or a printing method can be used. Specifically, a resistive heating vacuum evaporation method, an ink-jet method, or the like can be used.

The layer 113 is placed between the layer 112 and the layer 114. The layer 112 is placed between the layer 111 and the layer 113.

The layer 111 contains a material HT1 and a material AM.

The layer 112 contains a material HT2.

The layer 113 contains a light-emitting material EM and a material HOST.

The layer 114 contains a material ET and a material OMC.

[Material HT1]

The material HT1 has a HOMO level higher than or equal to −5.7 eV and lower than or equal to −5.4 eV. For example, the material HT1 is preferably a hole-transport material and can be a material having any of a carbazole skeleton, a dibenzofuran skeleton, a dibenzothiophene skeleton, and an anthracene skeleton. Moreover, as the material HT1, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group can be used. Thus, holes are easily injected into the layer 112.

Specific examples of compounds that can be used as the material HT1 include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4,4'-diphenyl-4''-(6;1'-binaphthyl-2-yl)triphenylamine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yltriphenylamine (abbreviation: BBAPβNB-03), 4,4'-diphenyl-4''-(6;2-binaphthyl-2-yl)triphenylamine (abbreviation: BBA(βN2)B), 4,4'-diphenyl-4''-(7;2'-binaphthyl-2-yl)triphenylamine (abbreviation: BBA(βN2)B-03), 4,4'-diphenyl-4''-(4;2'-binaphthyl-1-yl)triphenylamine (abbreviation: BBAβNαNB), 4,4'-diphenyl-4''-(5;2'-binaphthyl-1-yl)triphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

[Material AM]

The material AM has an acceptor property. For example, as the material AM, an organic compound that has an electron-withdrawing group (particularly a cyano group or a halogen group such as a fluoro group) and exhibits an electron-accepting property with respect to the material HT1 can be selected as appropriate. Examples of such an organic compound include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), and 2-(7-dicyanomethylene-1,3,4,5,6,8,9,10-octafluoro-7H-pyren-2-ylidene)malononitrile. In particular, a compound in which electron-withdrawing groups are bonded to a condensed aromatic ring having a plurality of heteroatoms, such as HAT-CN, is preferred because it is thermally stable. A [3]radialene derivative having an electron-withdrawing group (in particular, a cyano group or a halogen group such as a fluoro group) has a very high electron-accepting property and thus is preferred. Specific examples include α,α',α''-1,2,3-cyclopropanetriylidenetris[4-cyano-2,3,5,6-tetrafluorobenzeneacetonitrile], α,α',α''-1,2,3- cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile].

[Material HT2]

The material HT2 has a lower HOMO level than the material HT1. For example, the material HT2 can be a material selected appropriately from the above compounds shown as the compounds that can be used as the material HT1.

[Material HOST]

The material HOST has a lower HOMO level than the material HT2.

For example, a variety of carrier-transport materials such as an electron-transport material, a hole-transport material, and a TADF material can be used as the material HOST. Specifically, as a hole-transport material and an electron-transport material, one or more kinds of materials can be selected appropriately from the materials described in this specification or known materials, for example.

[Light-Emitting Material EM]

For example, a substance exhibiting fluorescence (fluorescent substance), a substance exhibiting phosphorescence (phosphorescent substance), a substance exhibiting thermally activated delayed fluorescence (thermally activated delayed fluorescent (TADF) material), or other light-emitting substances can be used as the light-emitting material EM.

[Material ET]

The material ET has a HOMO level higher than or equal to −6.0 eV. Moreover, the material ET has an electron mobility higher than or equal to $1 \times 10^{-7}$ cm$^2$/Vs and lower than or equal to $5 \times 10^{-5}$ cm$^2$/Vs when the square root of the electric field strength [V/cm] is 600. Thus, the use of the material ET for the layer 114 changes the carrier balance in the light-emitting element 550G(i,j), whereby recombination in the layer 114 is less likely to occur. Controlling the carrier balance in the layer 114 cancels out a drastic luminance reduction caused in an initial stage of driving of a light-emitting device, that is, initial decay; thus, a long-life light-emitting device can be provided. Note that in this specification and the like, the structure of a light-emitting element containing the material ET may be referred to as a Recombination-Site Tailoring Injection structure (ReSTI structure).

For example, a compound having an anthracene skeleton can be used as the material ET, and preferably, a compound having an anthracene skeleton and a heterocyclic skeleton is used. The heterocyclic skeleton is preferably a nitrogen-containing five-membered ring skeleton. The nitrogen-containing five-membered ring skeleton preferably includes two heteroatoms in a ring, like a pyrazol ring, an imidazole ring, an oxazole ring, or, a thiazole ring.

[Material OMC]

The material OMC is an organic complex of alkali metal or an organic complex of alkaline earth metal. For example, an organic complex of lithium is preferable, and 8-quinolinolato-lithium (abbreviation: Liq) is particularly preferable.

Note that an anion may be generated in a region of the layer 113 that is close to the layer 114. Alternatively, the light-emitting element 550G(i,j) may be degraded by an anion after the start of use. Alternatively, the luminance of the light-emitting element 550G(i,j) may be decreased.

Accordingly, a reduction in display quality, a reduction in color reproducibility, or a reduction in luminance that would occur after the functional panel starts being used can be inhibited. Alternatively, entry of impurities from the outside that would degrade characteristics can be inhibited. Alternatively, a bright color can be displayed. Alternatively, the productivity is high. Thus, a novel functional panel that is highly convenient, useful, or reliable can be provided.

«Structure Example 2 of Light-Emitting Element 550G(i,j)»

The light-emitting element 550G(i,j) includes a light-emitting unit 103a, a light-emitting unit 103b, and an intermediate layer 104 (see FIG. 2B).

The intermediate layer 104 includes a region positioned between the light-emitting unit 103a and the light-emitting unit 103b. The intermediate layer 104 supplies holes to one of the light-emitting units 103a and 103b and supplies electrons to the other of the light-emitting units 103a and 103b. The light-emitting unit 103a and the light-emitting unit 103b may have identical structures or different structures. Note that the term "different structures" means, for example, that the light-emitting unit 103a contains a fluorescent substance and the light-emitting unit 103b contains a phosphorescent substance. In addition, the term "identical structures" means, for example, that the light-emitting unit 103a and the light-emitting unit 103b each contain a fluorescent substance. Light emitted from the light-emitting unit 103a and light emitted from the light-emitting unit 103b may have the same color or different colors. For example, when the light-emitting unit 103a and the light-emitting unit 103b have a function of emitting blue light, a light-emitting element that can be driven at low voltage and has low power consumption can be achieved. Note that the light-emitting element 550G(i,j) having the structure illustrated in FIG. 2B may be referred to as a stacked element or a tandem element.

Accordingly, the light emission efficiency can be increased. Alternatively, power consumption can be reduced. Thus, a novel functional panel that is highly convenient, useful, or reliable can be provided.

<Structure Example 4 of Functional Panel 700>

The functional panel described in this embodiment includes the pixel 702G(i,j).

«Structure Example 2 of Pixel 702G(i,j)»

The pixel 702G(i,j) includes the microlens ML, the light-emitting element 550G(i,j), and the color conversion layer CC(G) (see FIG. 24). Note that in this specification, a light-emitting element can also be referred to as a light-emitting device, and a photoelectric conversion element as a photoelectric conversion device.

The light-emitting element 550G(i,j) emits the light H1.

«Structure Example 3 of Microlens ML»

The microlens ML is placed between the light-emitting element 550G(i,j) and the color conversion layer CC(G). The microlens ML collects and focuses the light H1 on the color conversion layer CC(G). For example, the microlens ML can have a shape such that its convex portion faces the light-emitting element 550G(i,j). In the case where the sealant 705, for example, is provided between the microlens ML and the light-emitting element 550G(i,j), the microlens ML has a refractive index different from that of the sealant 705. Specifically, a material having a higher refractive index than the sealant 705 can be used for the microlens.

«Structure Example 3 of Color Conversion Layer CC(G)»

The conversion layer CC(G) converts the light H1 into the light H2. The light H2 has a spectrum where the intensity of long wavelength light is higher than that in the spectrum of the light H1.

Accordingly, the light H1 emitted from the light-emitting element 550G(i,j) can be collected and focused on the color conversion layer CC(G). Alternatively, the light H1 emitted from the light-emitting element 550G(i,j) can be collected and then converted into the light H2. Alternatively, the light H1 emitted from the light-emitting element 550G(i,j) is more directional than light transmitted through the color conversion layer CC(G); hence, highly directional light can be efficiently collected. Alternatively, the light H1 emitted from the light-emitting element 550G(i,j) can be used more efficiently than in the case of collecting light transmitted through the color conversion layer CC(G). Thus, a novel functional panel that is highly convenient, useful, or reliable can be provided.

Note that this embodiment can be combined with any of the other embodiments in this specification as appropriate.

Embodiment 2

In this embodiment, a structure of a functional panel of one embodiment of the present invention will be described with reference to FIGS. 4A and 4B, FIGS. 5A to 5C, FIG. 6, and FIG. 7.

Figure 4A:
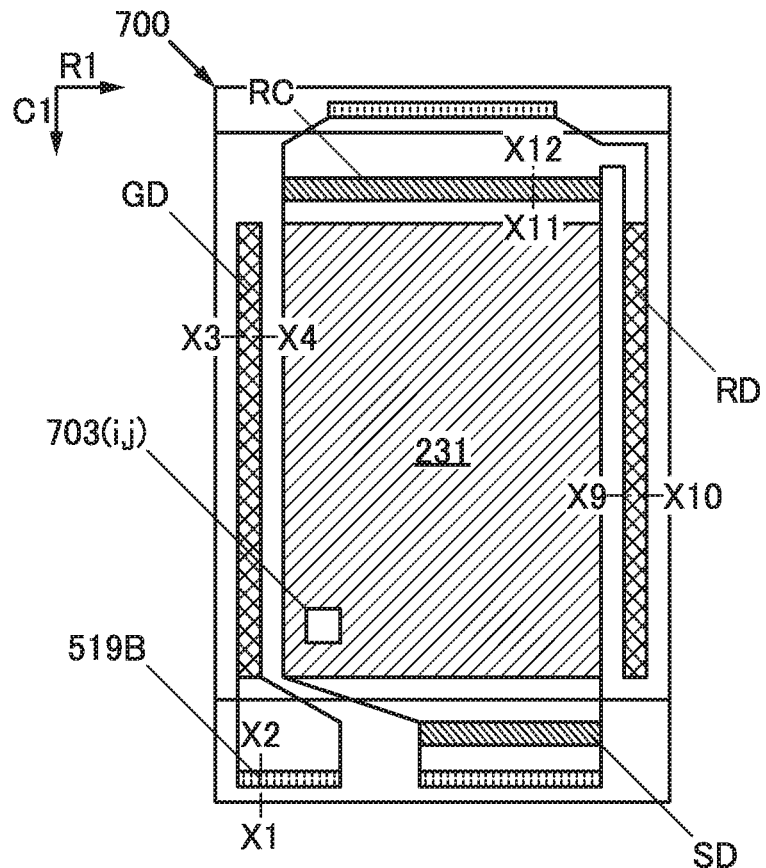
FIGS. 4A and 4B illustrate a structure of a functional panel of one embodiment.
Figure 4B:
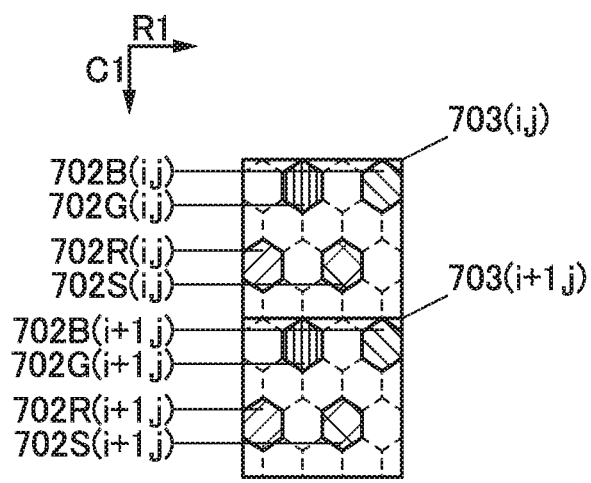

FIGS. 4A and 4B illustrate a structure of a functional panel of one embodiment of the present invention. FIG. 4A is a top view illustrating the structure of the functional panel of one embodiment of the present invention, and FIG. 4B illustrates part of FIG. 4A.

Figure 5A:
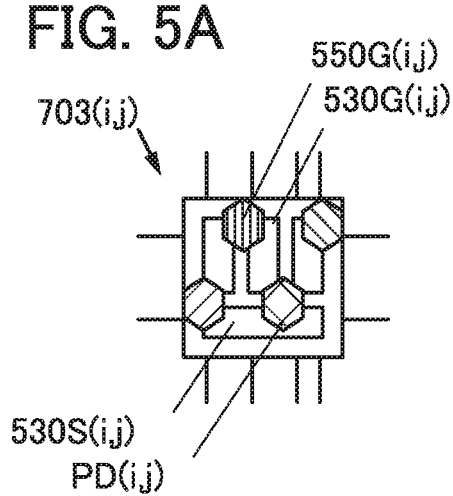
FIGS. 5A to 5C illustrate a structure of a functional panel of one embodiment.
Figure 5B:
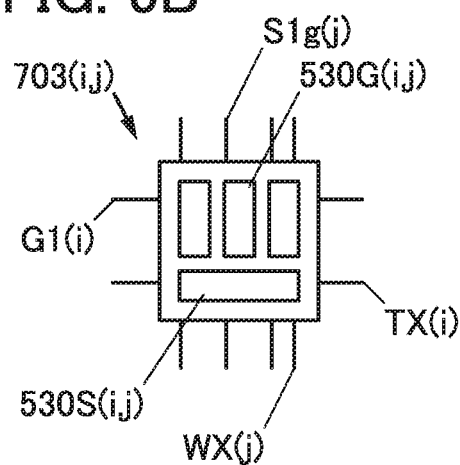
Figure 5C:
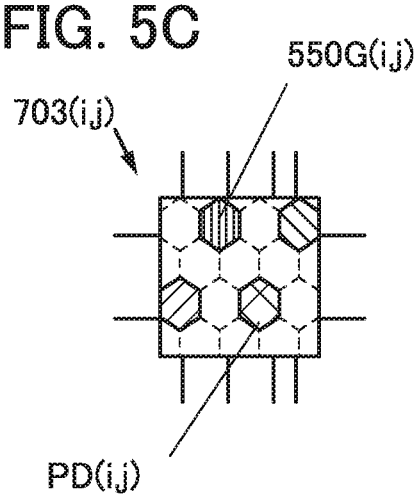

FIG. 5A illustrates part of FIG. 4A, FIG. 5B illustrates part of FIG. 5A, and FIG. 5C illustrates part of FIG. 5A.

Figure 6:
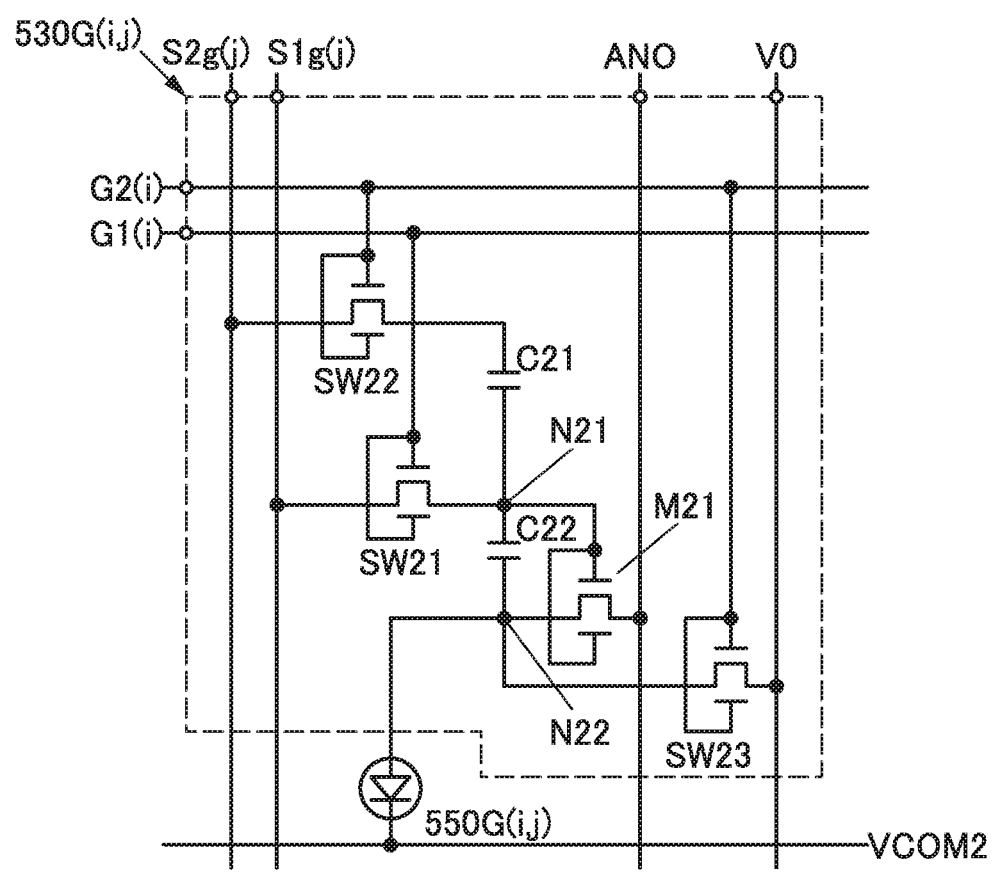
FIG. 6 is a circuit diagram illustrating a structure of a functional panel of one embodiment.

FIG. 6 illustrates a structure of a functional panel of one embodiment of the present invention. Specifically, FIG. 6 illustrates a configuration of a pixel circuit.

Figure 7:
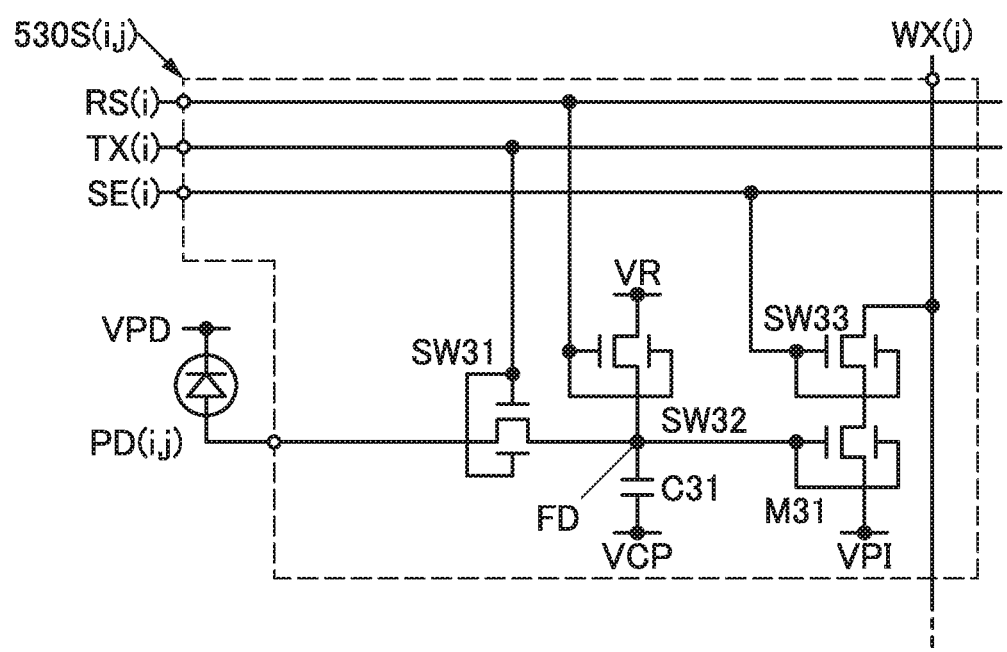
FIG. 7 is a circuit diagram illustrating a structure of a functional panel of one embodiment.

FIG. 7 illustrates a structure of a functional panel of one embodiment of the present invention. Specifically, FIG. 7 is a circuit diagram illustrating a configuration of a pixel circuit in the functional panel of one embodiment of the present invention.

<Structure Example 1 of Functional Panel 700>

The functional panel 700 includes a set of pixels 703(i,j) (see FIG. 4A).

«Structure Example 1 of Pixel 703(i,j)»

The set of pixels 703(i,j) includes the pixel 702G(i,j) (see FIG. 4B). The pixel 702G(i,j) includes a pixel circuit 530G(i,j) and the light-emitting element 550G(i,j), and the light-emitting element 550G(i,j) is electrically connected to the pixel circuit 530G(i,j) (see FIG. 5A).

«Structure Example 1 of Pixel Circuit 530G(i,j)»

The pixel circuit 530G(i,j) includes a switch SW21, a switch SW22, a transistor M21, a capacitor C21, and a node N21 (see FIG. 6).

The transistor M21 includes a gate electrode electrically connected to the node N21, a first electrode electrically connected to the light-emitting element 550G(i,j), and a second electrode electrically connected to a conductive film ANO.

The switch SW21 includes a first terminal electrically connected to the node N21 and a second terminal electrically connected to a conductive film S1g(j). The switch SW21 has a function of controlling its on/off state on the basis of the potential of a conductive film G1(i).

The switch SW22 includes a first terminal electrically connected to a conductive film S2g(j), and has a function of controlling its on/off state on the basis of the potential of a conductive film G2(i).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting element 550G(i,j) can be controlled with the potential of the node N21. As a result, a novel functional panel that is highly convenient, useful, or reliable can be provided.

«Structure Example 1 of Light-Emitting Element 550G(i,j)»

For example, an organic electroluminescent element, an inorganic electroluminescent element, a light-emitting diode, or a quantum-dot LED (QDLED) can be used as the light-emitting element 550G(i,j).

«Structure Example 2 of Pixel 703(i,j)»

The pixel 703(i,j) includes a pixel circuit 530S(i,j) and a photoelectric conversion element PD(i,j), and the photoelectric conversion element PD(i,j) is electrically connected to the pixel circuit 530S(i,j).

«Structure Example 1 of Pixel Circuit 530S(i,j)»

The pixel circuit 530S(i,j) includes a switch SW31, a switch SW32, a switch SW33, a transistor M31, a capacitor C31, and a node FD (see FIG. 7).

The switch SW31 includes a first terminal electrically connected to the photoelectric conversion element PD(i,j), and a second terminal electrically connected to the node FD. The switch SW31 has a function of controlling its on/off state on the basis of the potential of a conductive film TX(i).

The switch SW32 includes a first terminal electrically connected to the node FD and a second terminal electrically connected to a conductive film VR. The switch SW32 has a function of controlling its on/off state on the basis of the potential of a conductive film RS(i).

The capacitor C31 includes a conductive film electrically connected to the node FD and a conductive film electrically connected to a conductive film VCP.

The transistor M31 includes a gate electrode electrically connected to the node FD and a first electrode electrically connected to a conductive film VPI.

The switch SW33 includes a first terminal electrically connected to a second electrode of the transistor M31, and a second terminal electrically connected to a conductive film WX(j). The switch SW33 has a function of controlling its on/off state on the basis of the potential of a conductive film SE(i).

Accordingly, an imaging signal generated by the photoelectric conversion element PD(i,j) can be transferred to the node FD using the switch SW31. Alternatively, an imaging signal generated by the photoelectric conversion element PD(i,j) can be stored in the node FD using the switch SW31. Alternatively, electrical continuity between the pixel circuit 530S(i,j) and the photoelectric conversion element PD(i,j) can be broken by the switch SW31. Alternatively, a correlated double sampling method can be used. Alternatively, noise in an imaging signal can be reduced. Thus, a novel functional panel that is highly convenient, useful, or reliable can be provided.

«Structure Example 1 of Photoelectric Conversion Element PD(i,j)»

For example, a heterojunction photoelectric conversion element or a bulk heterojunction photoelectric conversion element can be used as the photoelectric conversion element PD(i,j).

«Structure Example 3 of Pixel 703(i,j)»

A plurality of pixels can be used in the pixel 703(i,j). For example, a plurality of pixels that show colors of different hues can be used. Note that a plurality of pixels can be referred to as subpixels. In addition, a set of subpixels can be referred to as a pixel.

Such a structure enables additive mixture or subtractive mixture of colors shown by the plurality of pixels. Alternatively, it is possible to express a color of a hue that an individual pixel cannot show.

Specifically, a pixel 702B(i,j) for showing blue, the pixel 702G(i,j) for showing green, and a pixel 702R(i,j) for showing red can be used in the pixel 703(i,j). The pixel 702B(i,j), the pixel 702G(i,j), and the pixel 702R(i,j) can each be referred to as a subpixel (see FIG. 4B).

As another example, a pixel for showing white or the like in addition to the above set can be used in the pixel 703(i,j). Moreover, a pixel for showing cyan, a pixel for showing magenta, and a pixel for showing yellow can be used in the pixel 703(i,j).

As another example, a pixel emitting infrared rays in addition to the above set can be used in the pixel 703(i,j). Specifically, a pixel that emits light including light with a wavelength of greater than or equal to 650 nm and less than or equal to 1000 nm can be used in the pixel 703(i,j).

Note that this embodiment can be combined with any of the other embodiments in this specification as appropriate.

Embodiment 3

In this embodiment, a structure of a functional panel of one embodiment of the present invention will be described with reference to FIG. 8, FIGS. 9A and 9B, FIGS. 10A and 10B, and FIGS. 11A and 11B.

Figure 8:
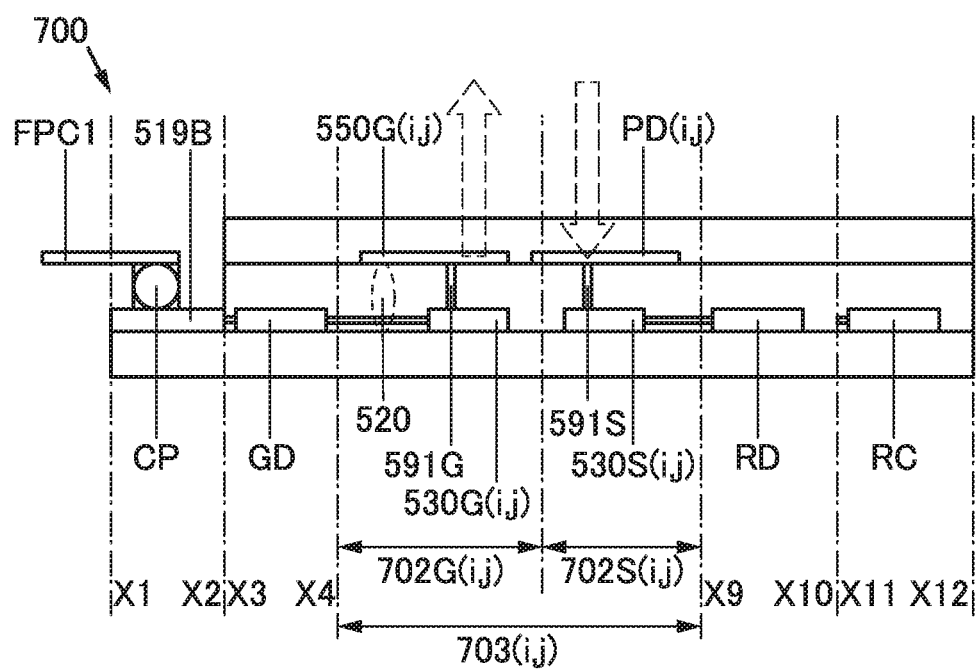
FIG. 8 is a cross-sectional view illustrating a structure of a functional panel of one embodiment.

FIG. 8 illustrates a structure of a functional panel of one embodiment of the present invention. FIG. 8 shows a cross section of the pixel as well as cross sections along the lines X1-X2, X3-X4, X9-X10, and X11-X12 in FIG. 4A.

Figure 9A:
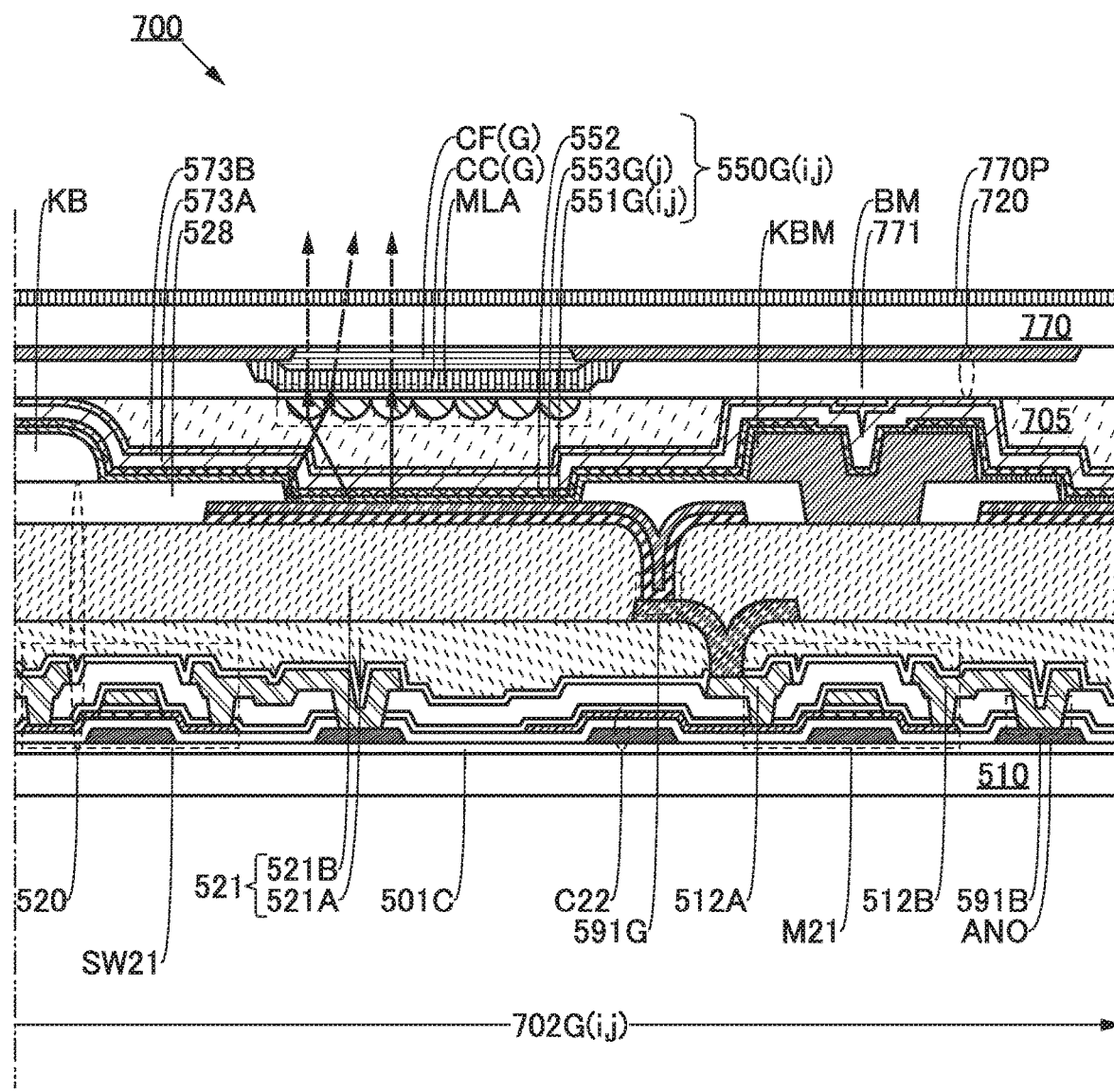
FIGS. 9A and 9B are cross-sectional views illustrating a structure of a functional panel of one embodiment.
Figure 9B:
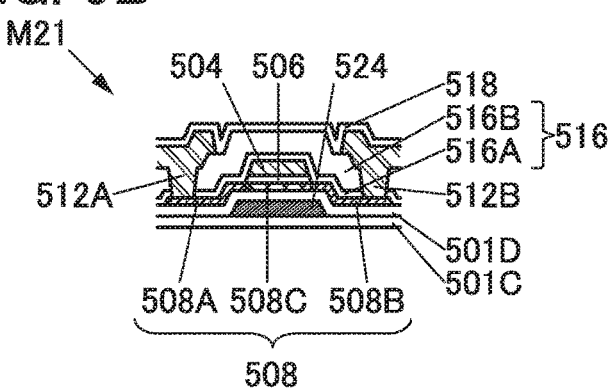

FIGS. 9A and 9B illustrate a structure of a functional panel of one embodiment of the present invention. FIG. 9A is a cross-sectional view of the pixel 702G(i,j) in FIG. 4B. FIG. 9B is a cross-sectional view illustrating part of FIG. 9A.

Figure 10A:
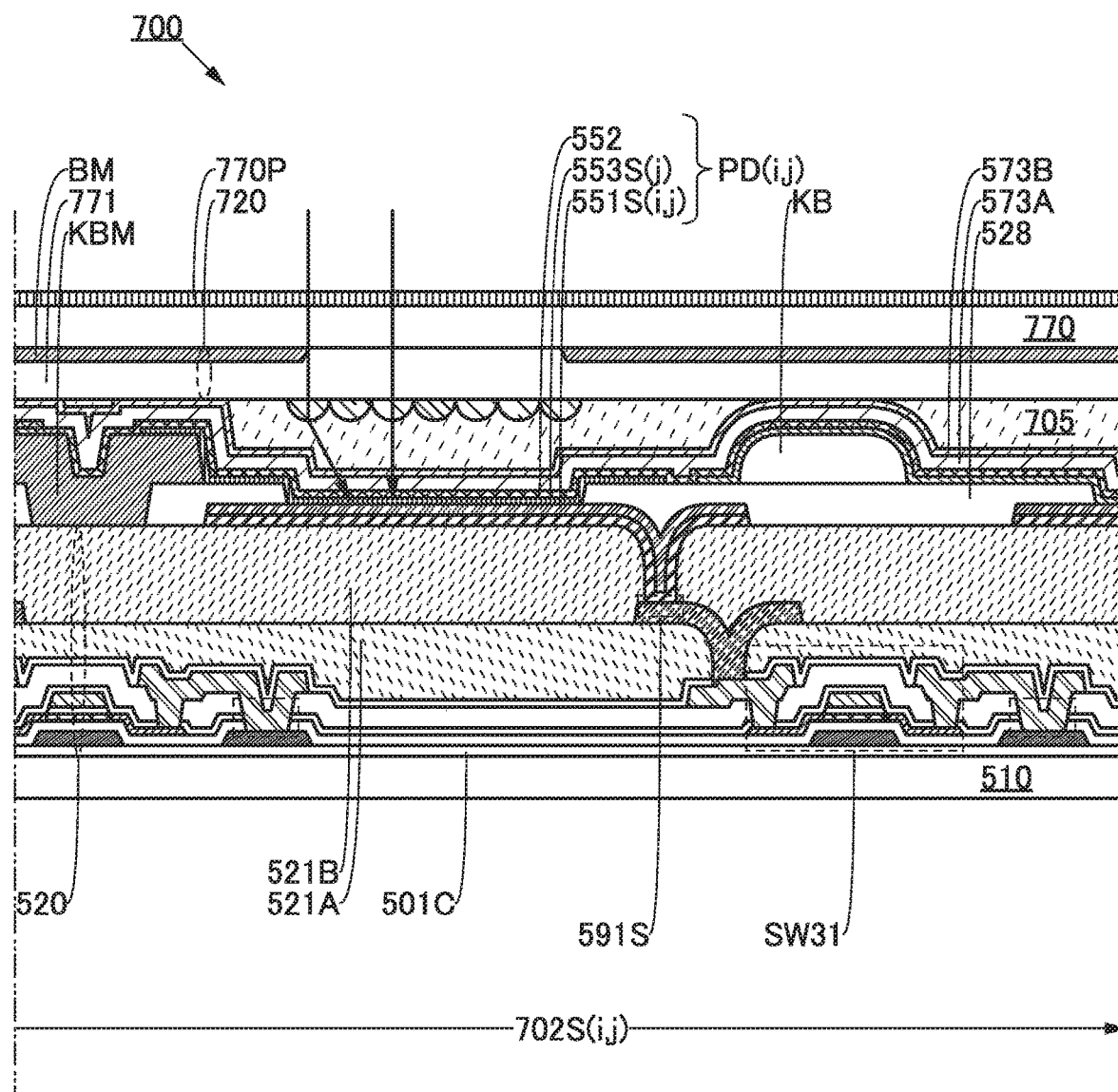
FIGS. 10A and 10B are cross-sectional views illustrating a structure of a functional panel of one embodiment.
Figure 10B:
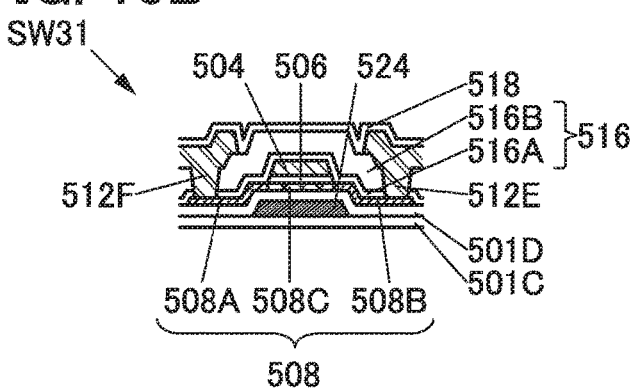

FIGS. 10A and 10B illustrate a structure of a functional panel of one embodiment of the present invention. FIG. 10A is a cross-sectional view of the pixel 702S(i,j) in FIG. 4B. FIG. 10B is a cross-sectional view illustrating part of FIG. 10A.

Figure 11A:
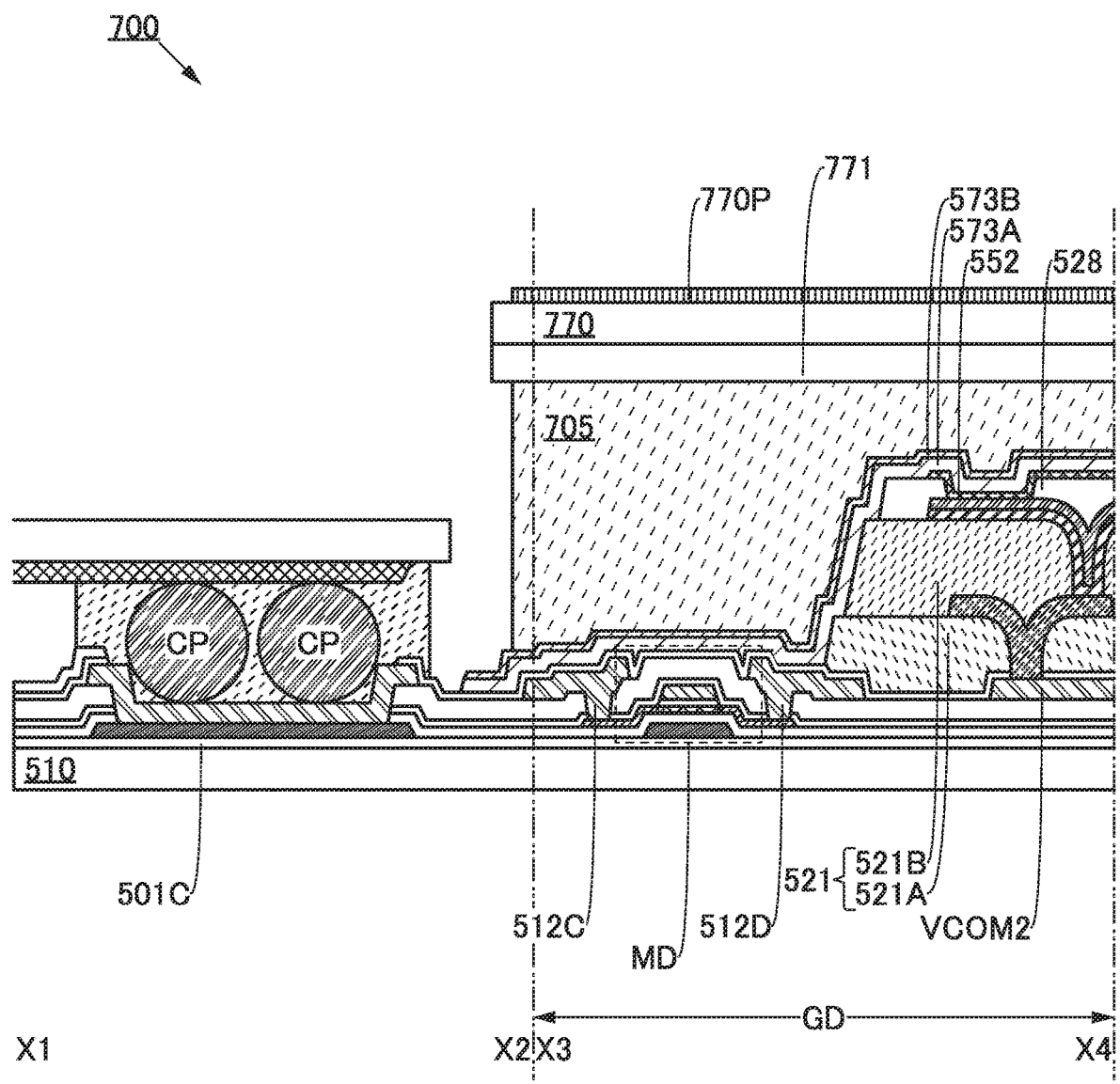
FIGS. 11A and 11B are cross-sectional views illustrating a structure of a functional panel of one embodiment.
Figure 11B:
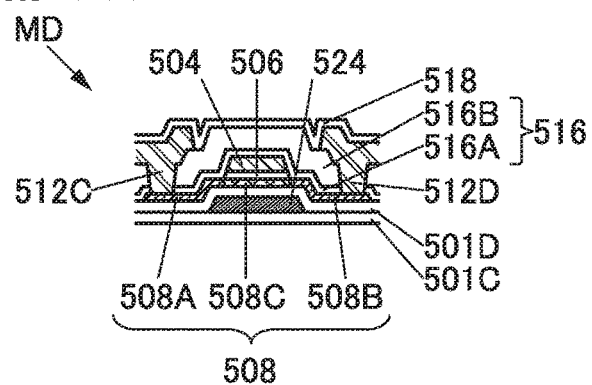

FIGS. 11A and 11B illustrate a structure of a functional panel of one embodiment of the present invention. FIG. 11A is a cross-sectional view along the lines X1-X2 and X3-X4 in FIG. 4A. FIG. 11B is a cross-sectional view illustrating part of FIG. 11A.

Figure 26A:
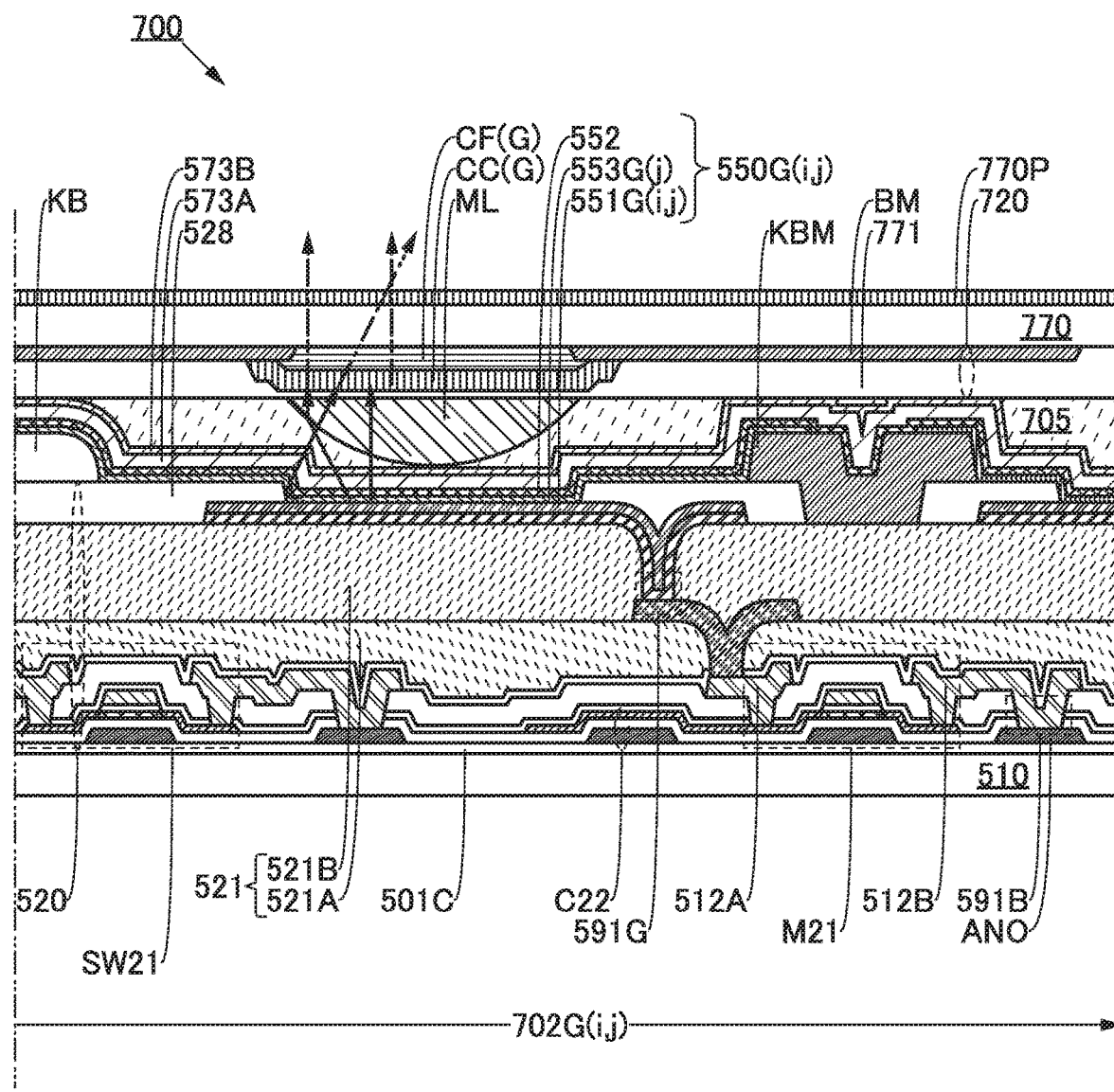
FIGS. 26A and 26B are cross-sectional views illustrating a structure of a functional panel of one embodiment.
Figure 26B:
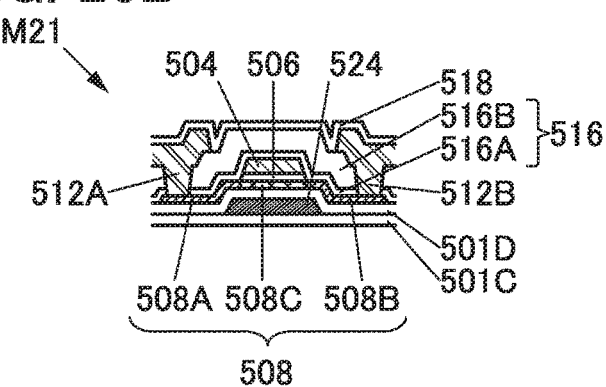

FIGS. 26A and 26B illustrate a structure of a functional panel of one embodiment of the present invention. FIG. 26A is a cross-sectional view of the pixel 702G(i,j) having a structure different from that in FIG. 9B. FIG. 26B illustrates part of FIG. 26A.

Figure 27A:
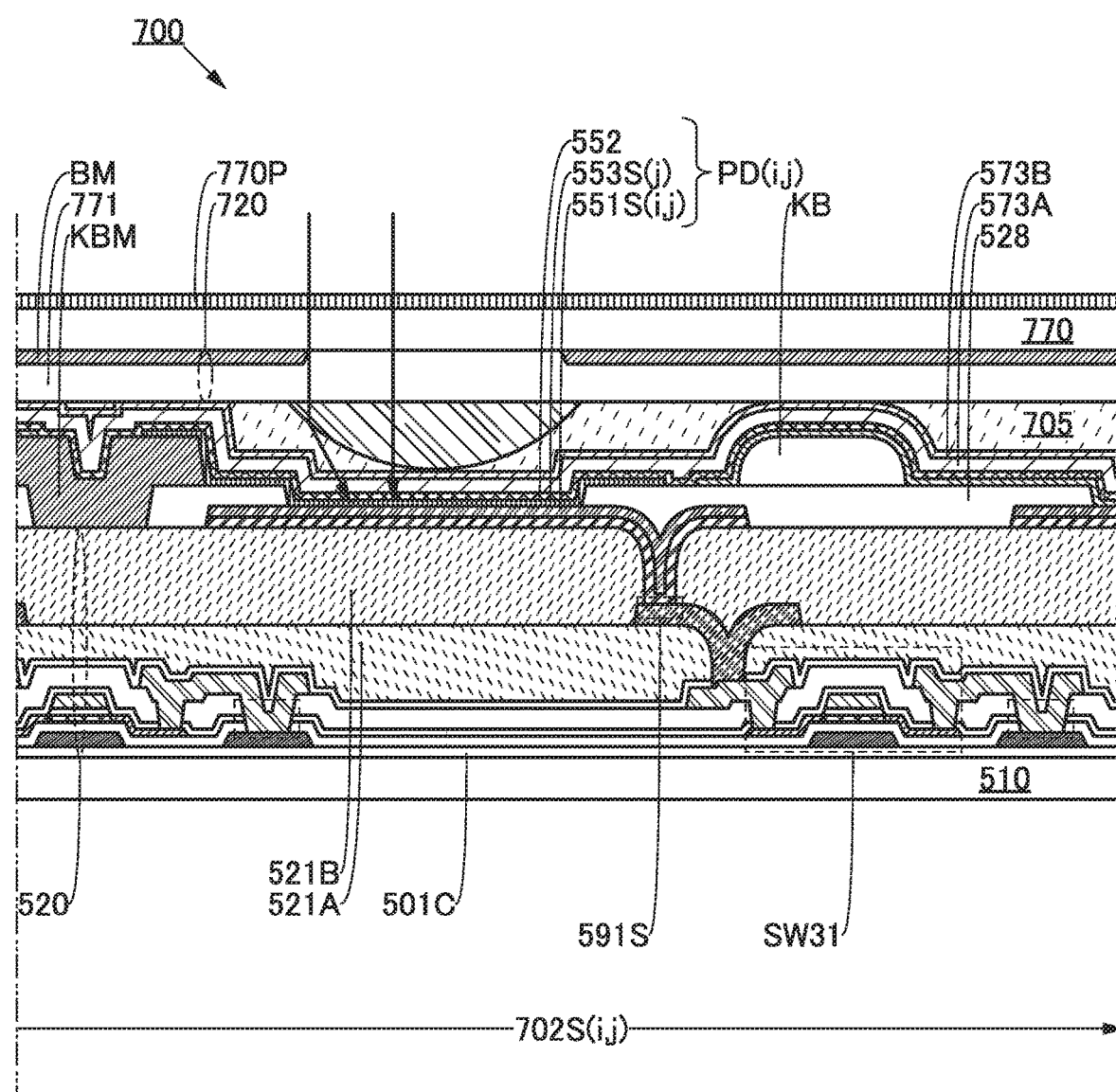
FIGS. 27A and 27B are cross-sectional views illustrating a structure of a functional panel of one embodiment.
Figure 27B:
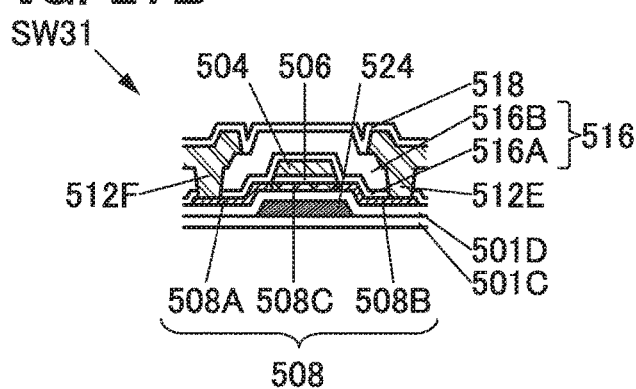

FIGS. 27A and 27B illustrate a structure of a functional panel of one embodiment of the present invention. FIG. 27A is a cross-sectional view of the pixel 702S(i,j) having a structure different from that in FIG. 10B. FIG. 27B illustrates part of FIG. 27A.

<Structure Example 1 of Functional Panel 700>

A functional panel of one embodiment of the present invention includes a functional layer 520 (see FIG. 8).

«Structure Example 1 of Functional Layer 520»

The functional layer 520 includes the pixel circuit 530G (i,j) (see FIG. 8). The functional layer 520 includes, for example, the transistor M21 used in the pixel circuit 530G (i,j) (see FIG. 6 and FIG. 9A).

The functional layer 520 has an opening 591G. The pixel circuit 530G(i,j) is electrically connected to the light-emitting element 550G(i,j) through the opening 591G (see FIG. 8 and FIG. 9A). The functional layer 520 can also have an opening 591B.

«Structure Example 2 of Functional Layer 520»

The functional layer 520 includes the pixel circuit 530S (i,j) (see FIG. 8). The functional layer 520 includes, for example, a transistor used as the switch SW31 in the pixel circuit 530S(i,j) (see FIG. 8 and FIG. 10A).

The functional layer 520 has an opening 591S, and the pixel circuit 530S(i,j) is electrically connected to the photoelectric conversion element PD(i,j) through the opening 591S (see FIG. 8 and FIG. 10A).

Accordingly, the pixel circuit 530G(i,j) can be formed in the functional layer 520. Alternatively, the pixel circuit 530S(i,j) can be formed in the functional layer 520. Alternatively, for example, the semiconductor film used in the pixel circuit 530S(i,j) can be formed in the step of forming the semiconductor film used in the pixel circuit 530G(i,j). Alternatively, the process of manufacturing the functional panel can be simplified. As a result, a novel functional panel that is highly convenient, useful, or reliable can be provided.

«Structure Example 3 of Functional Layer 520»

The functional layer 520 includes a driver circuit GD (see FIG. 4A and FIG. 8). The functional layer 520 includes, for example, the transistor MD used in the driver circuit GD (see FIG. 8 and FIG. 11A).

The functional layer 520 includes a driver circuit RD and a read circuit RC (see FIG. 8).

Accordingly, for example, the semiconductor film used in the driver circuit GD can be formed in the step of forming the semiconductor film used in the pixel circuit 530G(i,j). As another example, the semiconductor films used in the driver circuit RD and the read circuit RC can be formed in the step of forming the semiconductor film used in the pixel circuit 530G(i,j). Alternatively, the process of manufacturing the functional panel can be simplified. Thus, a novel functional panel that is highly convenient, useful, or reliable can be provided.

«Structure Example of Transistor»

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 9B). Alternatively, the transistor includes a conductive film 512C and a conductive film 512D (see FIG. 11B). Alternatively, the transistor includes a conductive film 512E and a conductive film 512F (see FIG. 10B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other.

A conductive film 524 can be used in the transistor. The semiconductor film 508 is sandwiched between the conductive film 504 and a region of the conductive film 524. The conductive film 524 has a functions of a second gate electrode.

Note that in a step of forming the semiconductor film used in the transistor of the pixel circuit, the semiconductor film used in the transistor of the driver circuit can be formed.

«Structure Example 1 of Semiconductor Film 508»

For example, a semiconductor including a Group 14 element can be used for the semiconductor film 508. Specifically, a semiconductor including silicon can be used for the semiconductor film 508.

[Hydrogenated Amorphous Silicon]

For example, hydrogenated amorphous silicon can be used for the semiconductor film 508. Microcrystalline silicon or the like can also be used for the semiconductor film 508. Thus, it is possible to provide a functional panel having less display unevenness than a functional panel using polysilicon for the semiconductor film 508, for example. Alternatively, the size of the functional panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for manufacture of the transistor can be lower than that required for a transistor using single crystal silicon, for example.

The semiconductor film used in the transistor of the driver circuit can be formed in the same step as the semiconductor film used in the transistor of the pixel circuit. Alternatively, the driver circuit can be formed over a substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a functional panel using hydrogenated amorphous silicon for the semiconductor film 508. Alternatively, a functional panel having less display unevenness than a functional panel using polysilicon for the semiconductor film 508, for example, can be provided. For another example, smart glasses or a head mounted display can be provided.

«Structure Example 2 of Semiconductor Film 508»

For example, a metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of a data processing device can be reduced, and power consumption for driving can be reduced.

Moreover, the pixel circuit can hold an imaging signal for a longer time than a pixel circuit including a transistor that uses amorphous silicon for the semiconductor film. Accordingly, images can be taken by a global shutter method. Furthermore, an image of an object in motion can be taken with little distortion.

For example, a transistor using an oxide semiconductor can be used. Specifically, an oxide semiconductor including indium or an oxide semiconductor including indium, gallium, and zinc can be used for the semiconductor film.

For example, a transistor having a lower leakage current in an off state than a transistor using amorphous silicon for a semiconductor film can be used. Specifically, a transistor using an oxide semiconductor for a semiconductor film can be used as a switch or the like. In that case, the potential of the floating node can be held for a longer time than in a circuit in which a transistor using amorphous silicon is used as a switch.

For example, a 25-nm-thick film including indium, gallium, and zinc can be used as the semiconductor film 508.

For example, a conductive film in which a 10-nm-thick film including tantalum and nitrogen and a 300-nm-thick film including copper are stacked can be used as the conductive film 504. The film including copper includes a region provided such that a film including tantalum and nitrogen is positioned between the film including copper and the insulating film 506.

For example, a stacked-layer film in which a 400-nm-thick film including silicon and nitrogen and a 200-nm-thick film including silicon, oxygen, and nitrogen are stacked can be used as the insulating film 506. The film including silicon and nitrogen includes a region provided such that the film including silicon, oxygen, and nitrogen is positioned between the film including silicon and nitrogen and the semiconductor film 508.

For example, a conductive film in which a 50-nm-thick film including tungsten, a 400-nm-thick film including aluminum, and a 100-nm-thick film including titanium are stacked in this order can be used as the conductive film 512A or the conductive film 512B. The film including tungsten includes a region in contact with the semiconductor film 508.

A manufacturing line for a bottom-gate transistor using amorphous silicon as a semiconductor, for example, can be easily remodeled into a manufacturing line for a bottom-gate transistor using an oxide semiconductor as a semiconductor. For another example, a manufacturing line for a top-gate transistor using polysilicon as a semiconductor can be easily remodeled into a manufacturing line for a top-gate transistor using an oxide semiconductor as a semiconductor. In any case, a conventional manufacturing line can be effectively utilized.

Accordingly, flickering can be suppressed. Alternatively, power consumption can be reduced, a moving image of high-speed motion can be displayed smoothly, or a photograph and the like can be displayed with a large number of gray levels. As a result, a novel functional panel that is highly convenient, useful, or reliable can be provided.

«Structure Example 3 of Semiconductor Film 508»

For example, a compound semiconductor can be used as a semiconductor of the transistor. Specifically, a semiconductor including gallium arsenide can be used.

For example, an organic semiconductor can be used as a semiconductor of the transistor. Specifically, an organic semiconductor including any of polyacenes or graphene can be used for the semiconductor film.

«Structure Example of Capacitor»

The capacitor includes one conductive film, another conductive film, and an insulating film. The insulating film includes a region positioned between these conductive films.

For example, the capacitor can include a conductive film used as the source electrode or the drain electrode of the transistor, a conductive film used as the gate electrode, and an insulating film used as the gate insulating film.

«Structure Example 4 of Functional Layer 520»

The functional layer 520 includes an insulating film 521, an insulating film 518, an insulating film 516, the insulating film 506, an insulating film 501C, and the like (see FIGS. 9A and 9B).

The insulating film 521 includes a region positioned between the pixel circuit 530G(i,j) and the light-emitting element 550G(i,j).

The insulating film 518 includes a region positioned between the insulating film 521 and the insulating film 501C.

The insulating film 516 includes a region positioned between the insulating film 518 and the insulating film 501C.

The insulating film 506 includes a region positioned between the insulating film 516 and the insulating film 501C.

[Insulating film 521]

For example, an insulating inorganic material, an insulating organic material, or an insulating composite material including an inorganic material and an organic material can be used for the insulating film 521. Note that a stack of an insulating film 521A and an insulating film 521B can be used as the insulating film 521.

Specifically, an inorganic oxide film, an inorganic nitride film, an inorganic oxynitride film, and the like, or a layered material obtained by stacking some of these films can be used for the insulating film 521.

For example, a film including any of a silicon oxide film, a silicon nitride film, a silicon oxynitride film, an aluminum oxide film, and the like, or a film including a material obtained by stacking any of these films can be used for the insulating film 521. Note that a silicon nitride film is a dense film and has an excellent function of inhibiting diffusion of impurities.

For example, polyester, polyolefin, polyamide, polyimide, polycarbonate, polysiloxane, or an acrylic resin, or a layered or composite material including resins selected from these can be used for the insulating film 521. Note that polyimide is excellent in the following properties, for example, compared with other organic materials: thermal stability, an insulating property, toughness, a low dielectric constant, a low coefficient of thermal expansion, and high chemical resistance. Accordingly, polyimide is particularly suitable for the insulating film 521 or the like.

Alternatively, the insulating film 521 may be formed using a photosensitive material. Specifically, a film formed using photosensitive polyimide, a photosensitive acrylic resin, or the like can be used as the insulating film 521.

Accordingly, the insulating film 521 can reduce steps due to various components underlying the insulating film 521, for example.

[Insulating Film 518]

For example, a material that can be used for the insulating film 521 can be used for the insulating film 518.

For example, a material that has a function of inhibiting diffusion of oxygen, hydrogen, water, alkali metal, alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

For example, a material that can be used for the insulating film 521 can be used for the insulating film 516. Note that a stack of an insulating film 516A and an insulating film 516B can be used as the insulating film 516.

Specifically, a film formed by a method different from a method for forming the insulating film 518 can be used as the insulating film 516.

[Insulating Film 506]

For example, a material that can be used for the insulating film 521 can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region positioned between the insulating film 501C and the insulating film 516.

For example, a material that can be used for the insulating film 506 can be used for the insulating film 501D.

[Insulating Film 501C]

For example, a material that can be used for the insulating film 521 can be used for the insulating film 501C. Specifically, a material containing silicon and oxygen can be used for the insulating film 501C. Thus, impurity diffusion into the pixel circuit, the light-emitting element, the photoelectric conversion element, or the like can be inhibited.

«Structure Example 5 of Functional Layer 520»

The functional layer 520 includes a conductive film, a wiring, and a terminal. A conductive material can be used for the wiring, the electrode, the terminal, the conductive film, and the like.

[Wiring and the Like]

For example, an inorganic conductive material, an organic conductive material, a metal, conductive ceramics, or the like can be used for the wiring and the like.

Specifically, for example, a metal element selected from aluminum, gold, platinum, silver, copper, chromium, tantalum, titanium, molybdenum, tungsten, nickel, iron, cobalt, palladium, and manganese can be used for the wiring and the like. Alternatively, an alloy including any of the above-described metal elements, or the like can be used for the wiring and the like. In particular, an alloy of copper and manganese is suitably used in microfabrication using a wet etching method.

Specifically, the wiring and the like can employ any of the following structures, for example: a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and is subjected to reduction, so that a film containing graphene can be formed. As a reducing method, a method with application of heat, a method using a reducing agent, or the like can be employed.

For example, a film containing a metal nanowire can be used for the wiring and the like. Specifically, a nanowire containing silver can be used.

Specifically, a conductive polymer can be used for the wiring and the like.

For example, a terminal 519B can be electrically connected to a flexible printed circuit FPC1 with the use of a conductive material (see FIG. 8). Specifically, the terminal 519B can be electrically connected to the flexible printed circuit FPC1 with the use of a conductive material CP.

<Structure Example 2 of Functional Panel 700>

The functional panel 700 includes a base 510, a base 770, and the sealant 705 (see FIG. 9A). The functional panel 700 also includes a component KB.

《Base 510 and Base 770》

A light-transmitting material can be used for the base 510 or the base 770.

For example, a flexible material can be used for the base 510 or the base 770. Thus, a functional panel having flexibility can be provided.

For example, a material with a thickness greater than or equal to 0.1 mm and less than or equal to 0.7 mm can be used. Specifically, a material polished to a thickness of approximately 0.1 mm can be used. As a result, the base 510 or the base 770 can be lightweight.

A glass substrate having any of the following sizes, for example, can be used as the base 510 or the base 770: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

For the base 510 or the base 770, an organic material, an inorganic material, a composite material of an organic material and an inorganic material, or the like can be used.

For example, an inorganic material such as glass, ceramic, or metal can be used. Specifically, non-alkali glass, soda-lime glass, potash glass, crystal glass, aluminosilicate glass, tempered glass, chemically tempered glass, quartz, sapphire, or the like can be used for the base 510 or the base 770. Alternatively, aluminosilicate glass, tempered glass, chemically tempered glass, sapphire, or the like can be favorably used for the base 510 or the base 770 that is on the side closer to a user of the functional panel. This can prevent breakage or damage of the functional panel caused by the use.

Specifically, an inorganic oxide film, an inorganic nitride film, an inorganic oxynitride film, or the like can be used. For example, a silicon oxide film, a silicon nitride film, a silicon oxynitride film, or an aluminum oxide film can be used. Stainless steel, aluminum, or the like can be used for the base 510 or the base 770.

For example, a single crystal semiconductor substrate or a polycrystalline semiconductor substrate made of silicon or silicon carbide, a compound semiconductor substrate made of silicon germanium or the like, or an SOI substrate can be used as the base 510 or the base 770. Thus, a semiconductor element can be formed on the base 510 or the base 770.

For example, an organic material such as a resin, a resin film, or plastic can be used for the base 510 or the base 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base 510 or the base 770. For example, a resin film, a resin plate, a layered material, or the like containing any of these materials can be used. As a result, the base 510 or the base 770 can be lightweight. Alternatively, for example, the functional panel can be less likely to suffer from damage by dropping or the like.

Specifically, polyethylene terephthalate (PET), polyethylene naphthalate (PEN), polyethersulfone (PES), a cyclic olefin polymer (COP), a cyclic olefin copolymer (COC), or the like can be used for the base 510 or the base 770.

For example, a composite material formed by attaching a metal plate, a thin glass plate, or a film of an inorganic material or the like and a resin film or the like can be used for the base 510 or the base 770. For example, a composite material formed by dispersing a fibrous or particulate metal, glass, inorganic material, or the like into a resin can be used for the base 510 or the base 770. For example, a composite material formed by dispersing a fibrous or particulate resin, organic material, or the like into an inorganic material can be used for the base 510 or the base 770.

Furthermore, a single-layer material or a material in which a plurality of layers are stacked can be used for the base 510 or the base 770. For example, a material in which insulating films and the like are stacked can be used. Specifically, a material in which one or more films selected from a silicon oxide layer, a silicon nitride layer, a silicon oxynitride layer, and the like are stacked can be used. Thus, diffusion of impurities contained in the base can be prevented, for example. Alternatively, diffusion of impurities contained in glass or a resin can be prevented. Alternatively, diffusion of impurities that pass through a resin can be prevented.

Alternatively, paper, wood, or the like can be used for the base 510 or the base 770.

For example, a material having heat resistance high enough to withstand heat treatment in the manufacturing process can be used for the base 510 or the base 770. Specifically, a material that is resistant to heat applied in the process of forming the transistor, the capacitor, and the like directly on the base can be used for the base 510 or the base 770.

For example, it is possible to employ a method in which an insulating film, a transistor, a capacitor, and the like are formed over a process substrate that is resistant to heat applied in the manufacturing process, and then the formed components are transferred to the base 510 or the base 770, for instance. Thus, the insulating film, the transistor, the capacitor, and the like can be formed over a flexible substrate, for example.

《Sealant 705》

The sealant 705 includes a region positioned between the functional layer 520 and the base 770, and has a function of bonding the functional layer 520 and the base 770 together (see FIG. 9A).

For the sealant 705, an inorganic material, an organic material, a composite material of an inorganic material and an organic material, or the like can be used.

For example, an organic material such as a thermally fusible resin or a curable resin can be used for the sealant 705.

For example, an organic material such as a reactive curable adhesive, a light curable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin can be used as the sealant 705.

«Component KB»

The component KB includes a region positioned between the functional layer 520 and the base 770. The component KB has a function of providing a certain space between the functional layer 520 and the base 770.

Note that this embodiment can be combined with any of the other embodiments in this specification as appropriate.

Embodiment 4

In this embodiment, a structure of a functional panel of one embodiment of the present invention will be described with reference to FIGS. 9A and 9B and FIGS. 10A and 10B.
<Structure Example 1 of Functional Panel 700>

The functional panel 700 includes the light-emitting element 550G(i,j) (see FIG. 9A).

«Structure Example 1 of Light-Emitting Element 550G(i,j)»

An electrode 551G(i,j), an electrode 552, and a layer 553G(j) containing a light-emitting material can be used in the light-emitting element 550G(i,j). The layer 553G(j) containing a light-emitting material includes a region positioned between the electrode 551G(i,j) and the electrode 552.

[Structure Example 1 of Layer 553G(j) Containing Light-Emitting Material]

For example, a layered material can be used for the layer 553G(j) containing a light-emitting material.

For example, a material that emits blue light, a material that emits green light, a material that emits red light, a material that emits infrared light, or a material that emits ultraviolet light can be used in the layer 553G(j) containing a light-emitting material.

[Structure Example 2 of Layer 553G(j) Containing Light-Emitting Material]

For example, a layered material in which materials are stacked to emit while light can be used for the layer 553G(j) containing a light-emitting material.

Specifically, a plurality of materials that emit light with different hues can be used for the layer 553G(j) containing a light-emitting material.

For example, a layered material in which a layer containing a light-emitting material including a fluorescent material that emits blue light and a layer containing materials that are other than a fluorescent material and emit green light and/or red light are stacked can be used for the layer 553G(j) containing a light-emitting material. Alternatively, a layered material in which a layer containing a light-emitting material including a fluorescent material that emits blue light and a layer containing a material that is other than a fluorescent material and emits yellow light are stacked can be used for the layer 553G(j) containing a light-emitting material.

Note that the coloring film CF(G), for example, can overlap with the layer 553G(j) containing a light-emitting material. Thus, light of a predetermined hue can be extracted from white light.

[Structure Example 3 of Layer 553G(j) Containing Light-Emitting Material]

For example, a layered material in which materials are stacked to emit blue light or ultraviolet light can be used for the layer 553G(j) containing a light-emitting material. Moreover, the color conversion layer CC(G) can overlap with the layer 553G(j) containing a light-emitting material, for example.

[Structure Example 4 of Layer 553G(j) Containing Light-Emitting Material]

The layer 553G(j) containing a light-emitting material includes a light-emitting unit. The light-emitting unit includes one region where electrons injected from one side are recombined with holes injected from the other side. The light-emitting unit contains a light-emitting material, and the light-emitting material releases energy generated by recombination of electrons and holes as light. Note that a hole-transport layer and an electron-transport layer can be used in the light-emitting unit. The hole-transport layer is positioned closer to the anode than the electron-transport layer is, and has higher hole mobility than the electron-transport layer.

For example, a plurality of light-emitting units and an intermediate layer can be used in the layer 553G(j) containing a light-emitting material. The intermediate layer includes a region positioned between two light-emitting units. The intermediate layer includes a charge-generation region and has functions of supplying holes to the light-emitting unit provided on the cathode side and supplying electrons to the light-emitting unit provided on the anode side. Note that a light-emitting element including a plurality of light-emitting units and an intermediate layer is sometimes referred to as a tandem light-emitting element.

Accordingly, the current efficiency of light emission can be increased. Alternatively, the density of current flowing through the light-emitting element at the same luminance can be reduced. Alternatively, the reliability of the light-emitting element can be increased.

For example, a light-emitting unit including a material that emits light of one hue and a light-emitting unit including a material that emits light of a different hue can be stacked and used in the layer 553G(j) containing a light-emitting material. Alternatively, a light-emitting unit including a material that emits light of one hue and another light-emitting unit including a material that emits light of the same hue can be stacked and used in the layer 553G(j) containing a light-emitting material. Specifically, two light-emitting units each containing a material that emits blue light can be stacked and used.

For example, a high molecular compound (e.g., an oligomer, a dendrimer, or a polymer), a middle molecular compound (a compound with a molecular weight of 400 to 4000 between a low molecular compound and a high molecular compound), or the like can be used for the layer 553G(j) containing a light-emitting material.

[Electrode 551G(i,j) and Electrode 552]

For example, a material that can be used for the wiring and the like can be used for the electrode 551G(i,j) or the electrode 552. Specifically, a material that transmits visible light can be used for the electrode 551G(i,j) or the electrode 552.

For example, conductive oxide, indium-containing conductive oxide, indium oxide, indium tin oxide, indium zinc oxide, zinc oxide, zinc oxide to which gallium is added, or the like can be used. Alternatively, a metal film that is thin enough to transmit light can be used. Alternatively, a material that transmits visible light can be used.

For example, a metal film that transmits part of light and reflects another part of light can be used as the electrode 551G(i,j) or the electrode 552. The distance between the electrode 551G(i,j) and the electrode 552 is adjusted using the layer 553G(j) containing a light-emitting material, for example.

Accordingly, the light-emitting element 550G(i,j) can be provided with a microcavity structure. Alternatively, light of a predetermined wavelength can be extracted more efficiently than light of the other wavelengths. Alternatively, light with a narrow spectral half-width can be extracted. Alternatively, light of a bright color can be extracted.

For example, a film that reflects light efficiently can be used as the electrode 551G(i,j) or the electrode 552. Specifically, a material containing silver, palladium, and the like or a material containing silver, copper, and the like can be used for the metal film.

The electrode 551G(i,j) is electrically connected to the pixel circuit 530G(i,j) through the opening 591G (see FIG. 9A). The electrode 551G(i,j) overlaps with an opening formed in the insulating film 528, for example, and the outer edge region of the electrode 551G(i,j) is in contact with the insulating film 528.

This structure can prevent a short circuit between the electrode 551G(i,j) and the electrode 552.

《Structure Example 1 of Photoelectric Conversion Element PD(i,j)》

The photoelectric conversion element PD(i,j) includes an electrode 551S(i,j), the electrode 552, and a layer 553S(j) containing a photoelectric conversion material (see FIG. 10A).

For example, a heterojunction photoelectric conversion element or a bulk heterojunction photoelectric conversion element can be used as the photoelectric conversion element PD(i,j).

[Structure Example 1 of Layer 553S(j) Containing Photoelectric Conversion Material]

For example, a stacked-layer film in which a p-type semiconductor film and an n-type semiconductor film are stacked in contact with each other can be used as the layer 553S(j) containing a photoelectric conversion material. Note that the photoelectric conversion element PD(i,j) in which a stacked-layer film with such a structure is used as the layer 553S(j) containing a photoelectric conversion material can be referred to as a PN photodiode.

For example, a stacked-layer film in which a p-type semiconductor film, an i-type semiconductor film, and an n-type semiconductor film are stacked so that the i-type semiconductor film is positioned between the p-type semiconductor film and the n-type semiconductor film can be used as the layer 553S(j) containing a photoelectric conversion material. Note that the photoelectric conversion element PD(i,j) in which a stacked-layer film with such a structure is used as the layer 553S(j) containing a photoelectric conversion material can be referred to as a PIN photodiode.

For example, a stacked-layer film in which a p⁺-type semiconductor film, a p⁻-type semiconductor film, a p-type semiconductor film, and an n-type semiconductor film are stacked so that the p⁻-type semiconductor film is positioned between the p⁺-type semiconductor film and the n-type semiconductor film and the p-type semiconductor film is positioned between the p⁻-type semiconductor film and the n-type semiconductor film can be used as the layer 553S(j) containing a photoelectric conversion material. Note that the photoelectric conversion element PD(i,j) in which a stacked-layer film with such a structure is used as the layer 553S(j) containing a photoelectric conversion material can be referred to as an avalanche photodiode.

[Structure Example 2 of Layer 553S(j) Containing Photoelectric Conversion Material]

For example, a semiconductor containing a Group 14 element can be used for the layer 553S(j) containing a photoelectric conversion material. Specifically, a semiconductor containing silicon can be used for the layer 553S(j) containing a photoelectric conversion material. For example, hydrogenated amorphous silicon, microcrystalline silicon, polysilicon, or single crystal silicon can be used for the layer 553S(j) containing a photoelectric conversion material.

For example, an organic semiconductor can be used for the layer 553S(j) containing a photoelectric conversion material. Specifically, part of the layer used as the layer 553G(j) containing a light-emitting material can be used as part of the layer 553S(j) containing a photoelectric conversion material.

Specifically, a hole-transport layer and an electron-transport layer used in the layer 553G(j) containing a light-emitting material can be used in the layer 553S(j) containing a photoelectric conversion material. In that case, the manufacturing process can be simplified.

For example, an electron-accepting organic semiconductor material such as fullerene (e.g., $C_{60}$ or $C_{70}$) or its derivative can be used for the n-type semiconductor film.

For example, an electron-donating organic semiconductor material such as copper(II) phthalocyanine (CuPc) or tetraphenyldibenzoperiflanthene (DBP) can be used for the p-type semiconductor film.

For example, a film obtained by co-evaporation of an electron-accepting semiconductor material and an electron-donating semiconductor material can be used as the i-type semiconductor film.

<Structure Example 2 of Functional Panel 700>

The functional panel 700 includes the insulating film 528 and an insulating film 573 (see FIG. 9A).

《Insulating Film 528》

The insulating film 528 includes a region positioned between the functional layer 520 and the base 770 and has an opening in a region overlapping with the light-emitting element 550G(i,j) (see FIG. 9A).

For example, a material that can be used for the insulating film 521 can be used for the insulating film 528. Specifically, a silicon oxide film, a film containing an acrylic resin, a film containing polyimide, or the like can be used as the insulating film 528.

《Insulating Film 573》

The insulating film 573 includes a region where the light-emitting element 550G(i,j) is positioned between the functional layer 520 and the insulating film 573 (see FIG. 9A).

For example, a single film or a stacked-layer film in which a plurality of films are stacked can be used as the insulating film 573. Specifically, a stacked-layer film in which an insulating film 573A capable of being formed by a method that hardly damages the light-emitting element 550G(i,j) and a dense insulating film 573B with a few defects are stacked can be used as the insulating film 573. Furthermore, with the use of a film 573C, the insulating film 573 can be flat (see FIG. 3A). Thus, diffusion of impurities into the light-emitting element 550G(i,j) can be inhibited. Alternatively, the reliability of the light-emitting element 550G(i,j) can be increased.

<Structure Example 3 of Functional Panel 700>

The functional panel 700 includes a functional layer 720 (see FIG. 9A).

«Functional Layer 720»

The functional layer 720 includes the light-blocking layer BM, the coloring film CF(G), the color conversion layer CC(G), and an insulating film 771.

«Light-Blocking Layer BM»

The light-blocking layer BM has an opening in a region overlapping with the pixel 702G(i,j). Moreover, the light-blocking layer BM has an opening in a region overlapping with the pixel 702S(i,j).

For example, a material of a dark color can be used for the light-blocking layer BM. Thus, the display contrast can be increased.

«Coloring Film CF(G)»

The coloring film CF(G) includes a region positioned between the base 770 and the light-emitting element 550G (i,j). For example, a material that selectively transmits light of a predetermined color can be used for the coloring film CF(G). Specifically, a material that transmits red light, green light, or blue light can be used for the coloring film CF(G).

«<Structure Example of Insulating Film 771»

The insulating film 771 includes a region positioned between the base 770 and the light-emitting element 550G (i,j).

The insulating film 771 includes a region positioned between the base 770 and the microlens ML.

The insulating film 771 includes a region where the color conversion layer CC(G), the light-blocking layer BM, or the coloring film CF(G) is positioned between the base 770 and the insulating film 771. Thus, unevenness due to the thickness of the color conversion layer CC(G), the light-blocking layer BM, or the coloring film CF(G) can be reduced or eliminated.

«Color Conversion Layer CC(G)»

The color conversion layer CC(G) includes a region positioned between the base 770 and the light-emitting element 550G(i,j).

For example, a material that emits light with a wavelength longer than that of incident light can be used for the color conversion layer CC(G). For example, a material that absorbs blue light or ultraviolet light, converts it into green light, and emits green light; a material that absorbs blue light or ultraviolet light, converts it into red light, and emits red light; or a material that absorbs ultraviolet light, converts it into blue light, and emits blue light can be used for the color conversion layer. Specifically, quantum dots with a diameter of several nanometers can be used for the color conversion layer. Thus, light with a narrow spectral half-width can be released. Alternatively, light with high saturation can be released.

<Structure Example 4 of Functional Panel 700>

The functional panel 700 includes a light-blocking film KBM (see FIG. 9A).

«Light-Blocking Film KBM»

The light-blocking film KBM has an opening in a region overlapping with the pixel 702S(i,j). Moreover, the light-blocking film KBM includes a region positioned between the functional layer 520 and the base 770, and has a function of providing a certain space between the functional layer 520 and the base 770. For example, a material of a dark color can be used for the light-blocking film KBM. Thus, stray light that would enter the pixel 702S(i,j) can be reduced.

<Structure Example 5 of Functional Panel 700>

The functional panel 700 includes a functional film 770P (see FIG. 9A).

«Functional Film 770P»

The functional film 770P includes a region overlapping with the light-emitting element 550G(i,j).

For example, an anti-reflection film, a polarizing film, a retardation film, a light diffusion film, a condensing film, or the like can be used as the functional film 770P.

For example, an anti-reflection film with a thickness of 1 μm or less can be used as the functional film 770P. Specifically, a stacked-layer film in which three or more, preferably five or more, further preferably 15 or more dielectrics are stacked can be used as the functional film 770P. This allows the reflectivity to be as low as 0.5% or less, preferably 0.08% or less.

For example, a circularly polarizing film can be used as the functional film 770P.

Furthermore, an antistatic film preventing the attachment of a foreign substance, a water repellent film preventing stains, an oil repellent film preventing stains, an anti-reflection film, an anti-glare (non-glare) film, a hard coat film inhibiting a scratch in use, a self-healing film that self-heals from scratches, or the like can be used as the functional film 770P.

Note that this embodiment can be combined with any of the other embodiments in this specification as appropriate.

Embodiment 5

In this embodiment, a structure of a functional panel of one embodiment of the present invention will be described with reference to FIG. 12, FIGS. 13A and 13B, and FIG. 14.

Figure 12:
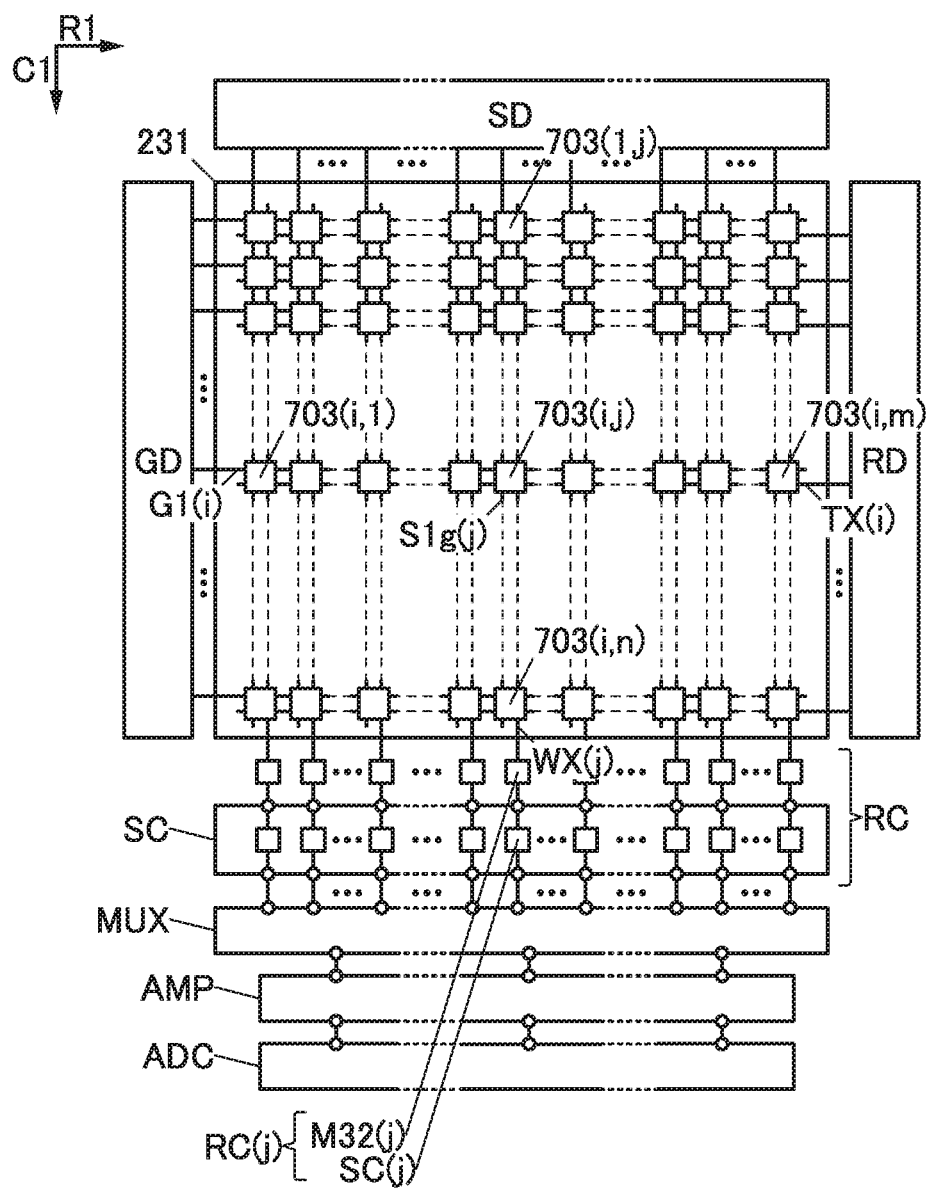
FIG. 12 illustrates a structure of a functional panel of one embodiment.

FIG. 12 illustrates a structure of a functional panel of one embodiment of the present invention.

Figure 13A:
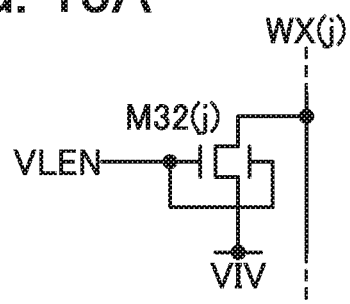
FIGS. 13A and 13B are circuit diagrams illustrating a structure of a functional panel of one embodiment.
Figure 13B:
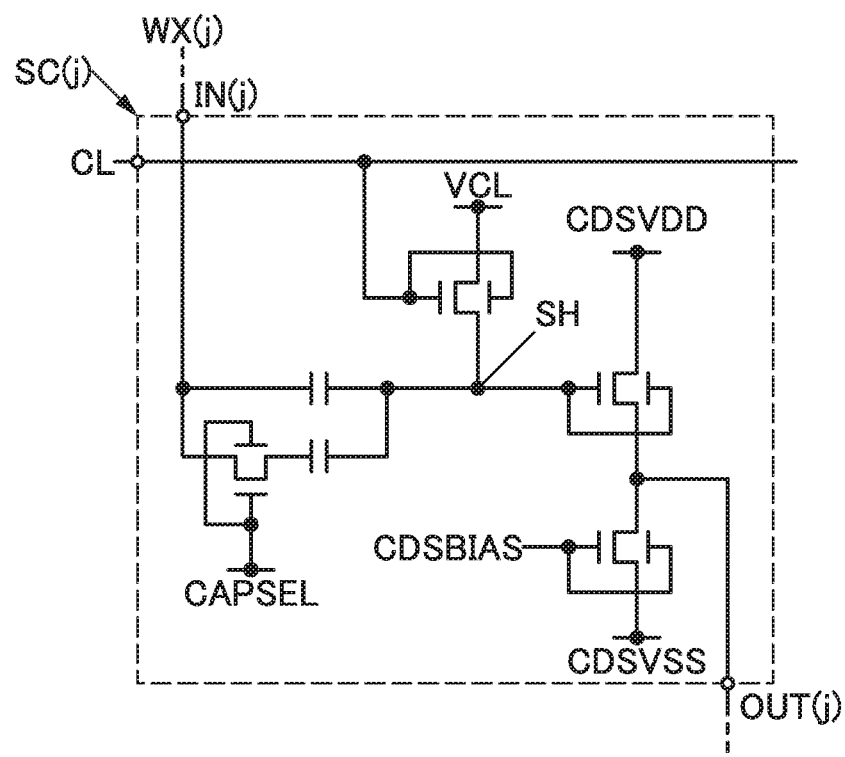

FIGS. 13A and 13B are circuit diagrams illustrating a structure of a functional panel of one embodiment of the present invention. FIG. 13A is a circuit diagram illustrating part of an amplifier circuit that can be used in a functional panel of one embodiment of the present invention. FIG. 13B is a circuit diagram illustrating part of a sampling circuit that can be used in a functional panel of one embodiment of the present invention.

Figure 14:
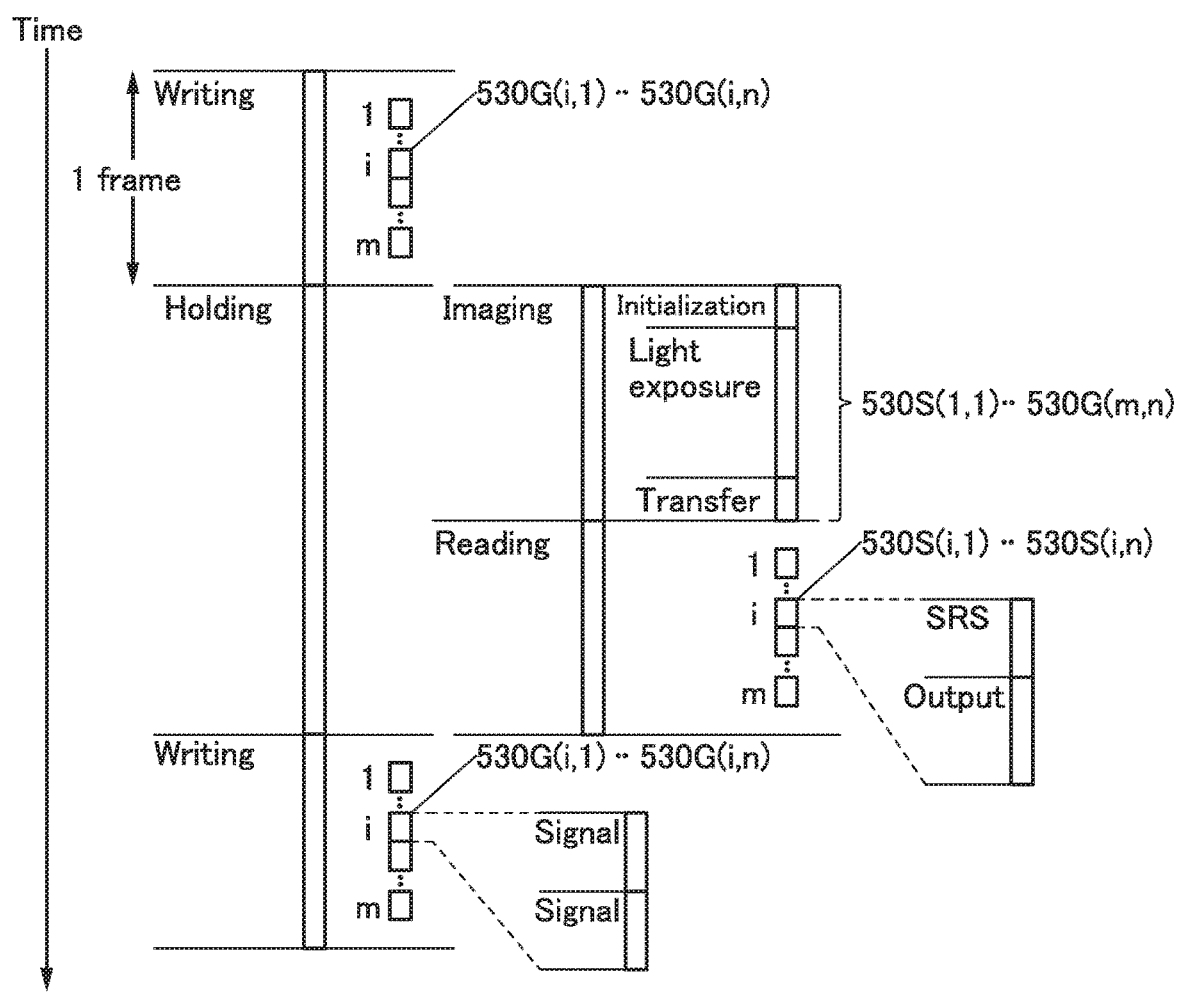
FIG. 14 illustrates operation of a functional panel of one embodiment.

FIG. 14 illustrates operation of a functional panel of one embodiment of the present invention.

<Structure Example 1 of Functional Panel 700>

The functional panel 700 of one embodiment of the present invention includes a region 231 (see FIG. 12).

«Structure Example 1 of Region 231»

The region 231 includes a group of pixels 703(i,l) to 703(i,n) and another group of pixels 703(l,j) to 703(m,j). The region 231 also includes the conductive film G1(i), the conductive film TX(i), the conductive film S1g(j), and the conductive film WX(j).

The group of pixels 703(i,l) to 703(i,n) are arranged in the row direction (the direction indicated by the arrow R1 in FIG. 12) and include the pixel 703(i,j).

The group of pixels 703(i,l) to 703(i,n) are electrically connected to the conductive film G1(i) and the conductive film TX(i).

The another group of pixels 703(l,j) to 703(m,j) are arranged in the column direction intersecting the row direction (the direction indicated by the arrow C1 in FIG. 12) and include the pixel 703(i,j).

The another group of pixels 703(l,j) to 703(m,j) are electrically connected to the conductive film S1g(j) and the conductive film WX(j).

With the above structure, imaging data can be obtained from a plurality of pixels. Alternatively, image data can be supplied to a plurality of pixels. Thus, a novel functional panel that is highly convenient, useful, or reliable can be provided.

«Structure Example 2 of Region 231»

The region 231 includes 600 or more pixels per inch. Note that the pixels include the pixel 702G(i,j).

«Structure Example 3 of Region 231»

The region 231 includes a plurality of pixels in a matrix. For example, the region 231 includes 7600 or more pixels in the row direction and 4300 or more pixels in the column direction. Specifically, 7680 pixels are provided in the row direction, and 4320 pixels are provided in the column direction.

Such a structure makes it possible to display a high-definition image. Thus, a novel functional panel that is highly convenient, useful, or reliable can be provided.

«Structure Example 4 of Region 231»

The region 231 has a diagonal greater than or equal to 114 cm and less than or equal to 200 cm.

Thus, a realistic image can be displayed. Thus, a novel functional panel that is highly convenient, useful, or reliable can be provided.

Although not illustrated, the region 231 includes a conductive film VCOM2 and the conductive film ANO.

<Structure Example 2 of Functional Panel 700>

The functional panel described in this embodiment includes the driver circuit GD (see FIG. 12).

«Structure Example 1 of Driver Circuit GD»

The driver circuit GD supplies a first selection signal.

«Structure Example 1 of Pixel Circuit 530G(i,j)»

The pixel circuit 530G(i,j) is supplied with the first selection signal and obtains an image signal in accordance with the first selection signal. For example, the first selection signal can be supplied using the conductive film G1(i) (see FIG. 5B). The image signal can be supplied using the conductive film S1g(j). Note that the operation of supplying the first selection signal and making the pixel circuit 530G(i,j) obtain an image signal can be referred to as "writing" (see FIG. 14).

The light-emitting element 550G(i,j) emits light on the basis of the image signal.

The light-emitting element 550G(i,j) includes the electrode 551G(i,j) electrically connected to the pixel circuit 530G(i,j), and the electrode 552 electrically connected to the conductive film VCOM2 (see FIG. 6 and FIG. 9A).

<Structure Example 3 of Functional Panel 700>

A functional panel of one embodiment of the present invention includes a read circuit RC(j), a conductive film VLEN, a conductive film VIV, and a conductive film CL (see FIG. 12, FIG. 7, and FIGS. 13A and 13B).

«Structure Example of Read Circuit RC(j)»

The read circuit RC(j) includes an amplifier circuit and a sampling circuit SC(j) (see FIG. 12).

«Structure Example of Amplifier Circuit»

The amplifier circuit includes a transistor M32(j) (see FIG. 13A).

The transistor M32(j) includes a gate electrode electrically connected to the conductive film VLEN, a first electrode electrically connected to the conductive film WX(j), and a second electrode electrically connected to the conductive film VIV.

Note that the conductive film WX(j) connects the transistor M31 and the transistor M32(j) when the switch SW33 is on (see FIG. 7 and FIG. 13A). Thus, a source follower circuit can be configured with the transistor M31 and the transistor M32(j). Alternatively, the potential of the conductive film WX(j) can be changed on the basis of the potential of the node FD.

«Structure Example of Sampling Circuit SC(j)»

The sampling circuit SC(j) includes a first terminal IN(j), a second terminal, and a third terminal OUT(j) (see FIG. 13B).

The first terminal IN(j) is electrically connected to the conductive film WX(j). The second terminal is electrically connected to the conductive film CL. The third terminal OUT(j) has a function of supplying a signal that changes on the basis of the potential of the first terminal IN(j).

Accordingly, an imaging signal can be obtained from the pixel circuit 530S(i,j). Alternatively, a correlated double sampling method can be employed, for example. Alternatively, the sampling circuit SC(j) can be provided for each conductive film WX(j). Alternatively, a differential signal of the pixel circuit 530S(i,j) can be obtained by the corresponding conductive film WX(j). Alternatively, the operating frequency of the sampling circuit SC(j) can be low. Alternatively, noise can be reduced. As a result, a novel functional panel that is highly convenient, useful, or reliable can be provided.

<Structure Example 4 of Functional Panel 700>

The functional panel 700 includes the driver circuit RD (see FIG. 12).

«Structure Example 1 of Driver Circuit RD»

The driver circuit RD supplies a second selection signal and a third selection signal.

«Structure Example 1 of Pixel Circuit 530S(i,j)»

The pixel circuit 530S(i,j) is supplied with the second selection signal and the third selection signal in a period during which the first selection signal is not supplied (see FIG. 14). In addition, the pixel circuit 530S(i,j) obtains an imaging signal on the basis of the second selection signal, and supplies the imaging signal on the basis of the third selection signal. For example, the second selection signal can be supplied using the conductive film TX(i), and the third selection signal can be supplied using the conductive film SE(i) (see FIG. 7).

Note that the operation of supplying the second selection signal and making the pixel circuit 530S(i,j) obtain an imaging signal can be referred to as "imaging" (see FIG. 14). The operation of reading an imaging signal from the pixel circuit 530S(i,j) can be referred to as "reading". The operation of supplying a predetermined voltage to the photoelectric conversion element PD(i,j) can be referred to as "initialization", the operation of exposing the initialized photoelectric conversion element PD(i,j) to light in a predetermined period as "light exposure", and the operation of reflecting a voltage that has been changed along with the light exposure on the pixel circuit 530S(i,j) as "transfer". Moreover, in FIG. 14, "SRS" corresponds to the operation of supplying a reference signal used in a correlated double sampling method, and "output" corresponds to the operation of supplying an imaging signal.

For example, image data for one frame can be written in 16.7 ms. Specifically, the operation can be performed at a frame rate of 60 Hz. Note that an image signal can be written to the pixel circuit 530G(i,j) in 15.2 µs.

For example, image data of one frame can be held in a period corresponding to 16 frames. Alternatively, imaging data of one frame can be captured and read out in a period corresponding to 16 frames.

Specifically, it is possible to perform the initialization in 15 μs, the light exposure in a period from 1 ms to 5 ms, and the transfer in 150 μs. Moreover, the reading can be performed in 250 ms.

The photoelectric conversion element PD(i,j) includes the electrode 551S(i,j) electrically connected to the pixel circuit 530S(i,j), and the electrode 552 electrically connected to a conductive film VPD (see FIG. 7 and FIG. 10A). The electrode 552 used in the light-emitting element 550G(i,j) can be used in the photoelectric conversion element PD(i,j). In this manner, the structure and the manufacturing process of the functional panel can be simplified.

Accordingly, imaging can be performed in a period during which the first selection signal is not supplied. Alternatively, noise in imaging can be suppressed. Alternatively, an imaging signal can be read out in a period during which the first selection signal is not supplied. Alternatively, noise in reading can be suppressed. Thus, a novel functional panel that is highly convenient, useful, or reliable can be provided.

«Structure Example 4 of Pixel 703(i,j)»

The pixel 703(i,j) is supplied with the second selection signal in a period during which the pixel 703(i,j) holds one image signal. For example, in a period during which the pixel circuit 530G(i,j) holds one image signal, the pixel 703(i,j) can emit light with the use of the light-emitting element 550G(i,j) on the basis of the image signal (see FIG. 14). Alternatively, the pixel circuit 530S(i,j) is supplied with the second selection signal after the pixel circuit 530G(i,j) obtains one image signal on the basis of the first selection signal until the pixel circuit 530G(i,j) is supplied with the first selection signal again.

Accordingly, the intensity of light emitted from the light-emitting element 550G(i,j) can be controlled using the image signal. Alternatively, light having a controlled intensity can be emitted to a subject. Alternatively, an image of the subject can be taken using the photoelectric conversion element PD(i,j). Alternatively, an image of the subject can be taken using the photoelectric conversion element PD(i,j) while the intensity of emitted light is controlled. Alternatively, the influence of a change from one to another of image signals held in the pixel circuit 530G(i,j) on an imaging signal can be eliminated. Thus, a novel functional panel that is highly convenient, useful, or reliable can be provided.

<Structure Example 5 of Functional Panel 700>

The functional panel 700 of one embodiment of the present invention includes a multiplexer MUX, an amplifier circuit AMP, and an analog-to-digital converter circuit ADC (see FIG. 12).

«Structure Example of Multiplexer MUX»

The multiplexer MUX has a function of obtaining an imaging signal from one selected from a plurality of sampling circuits SC(j) and supplying the imaging signal to the amplifier circuit AMP, for example.

For example, the multiplexer MUX is electrically connected to the third terminal OUT(j) of the sampling circuit SC(j) (see FIG. 13B). Specifically, the multiplexer MUX is electrically connected to the plurality of sampling circuits SC(j), and can obtain an imaging signal from a given sampling circuit and supply the image signal to the amplifier circuit AMP.

Thus, imaging data can be obtained by selecting a given pixel from a plurality of pixels arranged in the row direction. Alternatively, the number of imaging signals acquired at the same time can be limited to a predetermined number. Alternatively, it is possible to use the analog-to-digital converter circuit ADC in which the number of input channels is smaller than the number of pixels arranged in the row direction. Thus, a novel functional panel that is highly convenient, useful, or reliable can be provided.

«Structure Example of Amplifier Circuit AMP»

The amplifier circuit AMP can amplify an imaging signal and supply the amplified signal to the analog-to-digital converter circuit ADC.

Note that the functional layer 520 includes the multiplexer MUX and the amplifier circuit AMP.

Accordingly, for example, in a step of forming the semiconductor film used in the pixel circuit 530G(i,j), semiconductor films used in the multiplexer MUX and the amplifier circuit AMP can be formed. Alternatively, the manufacturing process of the functional panel can be simplified. As a result, a novel functional panel that is highly convenient, useful, or reliable can be provided.

«Structure Example of Analog-to-Digital Converter Circuit ADC»

The analog-to-digital converter circuit ADC has a function of converting an analog imaging signal into a digital signal.

Note that this embodiment can be combined with any of the other embodiments in this specification as appropriate.

Embodiment 6

In this embodiment, a structure of a display device of one embodiment of the present invention will be described with reference to FIGS. 15A to 15D.

Figure 15A:
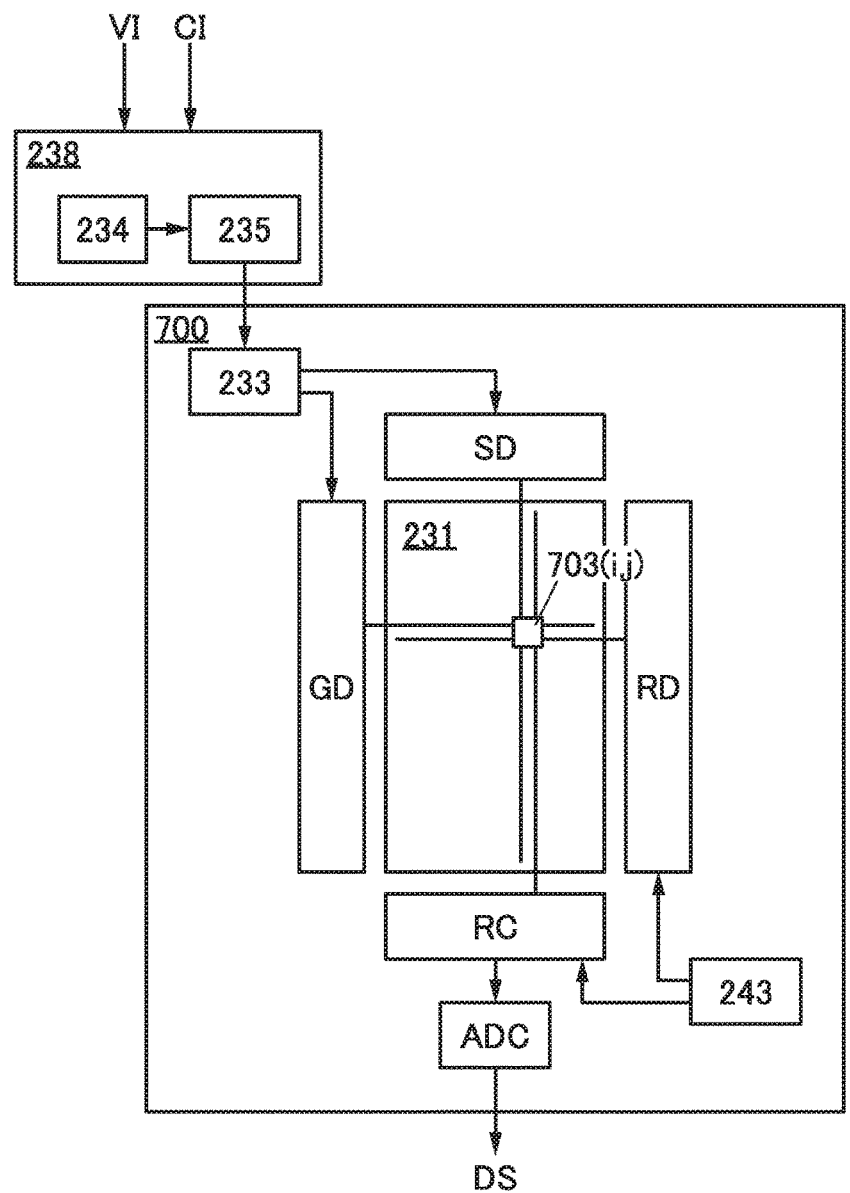
FIGS. 15A to 15D each illustrate a structure of a display device of one embodiment.
Figure 15B:
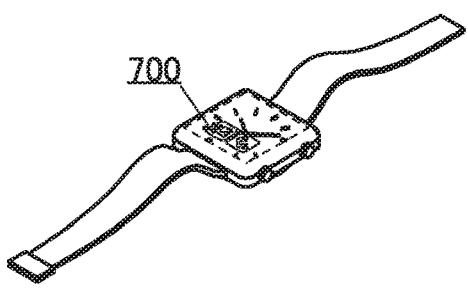
Figure 15C:
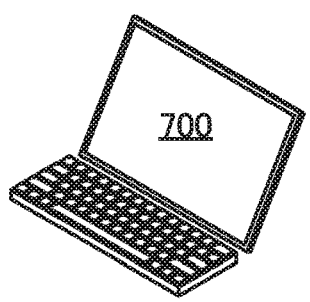
Figure 15D:
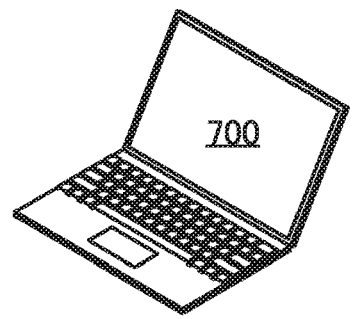

FIGS. 15A to 15D each illustrate a structure of a display device of one embodiment of the present invention. FIG. 15A is a block diagram of a display device of one embodiment of the present invention. FIGS. 15B to 15D are projection views each illustrating the appearance of a display device of one embodiment of the present invention.

<Structure Example of Display Device>

The display device described in this embodiment includes the functional panel 700 and a control unit 238 (see FIG. 15A).

«Structure Example 1 of Control Unit 238»

The control unit 238 is supplied with image data VI and control data CI. For example, a clock signal, a timing signal, or the like can be used as the control data CI.

The control unit 238 generates data on the basis of the image data VI and generates a control signal on the basis of the control data CI. Moreover, the control unit 238 supplies the data and the control signal.

For example, the data includes gray levels of 8 bits or more, preferably 12 bits or more. A clock signal, a start pulse, or the like of a shift register used in a driver circuit, for example, can be used as the control signal.

«Structure Example 2 of Control Unit 238»

For example, a decompression circuit 234 and an image processing circuit 235M can be used in the control unit 238.

«Decompression Circuit 234»

The decompression circuit 234 has a function of decompressing the image data VI that is supplied in a compressed state. The decompression circuit 234 includes a memory unit. The memory unit has a function of storing decompressed image data, for example.

«Image Processing Circuit 235»

The image processing circuit 235 includes a memory region, for example. The memory region has a function of storing data contained in the image data VI, for example.

The image processing circuit 235 has a function of generating data by correcting the image data VI on the basis of a predetermined characteristics curve and a function of supplying the data, for example.

«Structure Example 1 of Functional Panel»

The functional panel 700 is supplied with the data and the control signal. For example, the functional panel 700 described in any of Embodiments 1 to 5 can be used.

«Structure Example 5 of Pixel 703$(i,j)$»

The pixel 703$(i,j)$ performs display on the basis of the data.

Thus, the image data can be displayed using a display element. Consequently, a novel display device that is highly convenient or reliable can be provided. For example, a smartwatch (see FIG. 15B), a video monitor (see FIG. 15C), and a laptop computer (see FIG. 15D) can be provided.

«Structure Example 2 of Functional Panel»

For example, the functional panel 700 includes driver circuits and control circuits (see FIG. 15A).

«Driver Circuit»

The driver circuit operates on the basis of the control signal. The use of the control signal enables a plurality of driver circuits to operate in synchronization with each other.

For example, the driver circuit GD can be used in the functional panel 700. The driver circuit GD is supplied with the control signal and has a function of supplying a first selection signal.

For example, a driver circuit SD can be used in the functional panel 700. The driver circuit SD is supplied with the control signal and the data, and can supply an image signal.

For example, the driver circuit RD can be used in the functional panel 700. The driver circuit RD is supplied with the control signal and can supply a second selection signal.

For example, the read circuit RC can be used in the functional panel 700. The read circuit RC is supplied with the control signal, and can read out an imaging signal by a correlated double sampling method, for example.

«Control Circuit»

A control circuit 233 and a control circuit 243 each have a function of generating and supplying the control signal. For example, a clock signal, a timing signal, or the like can be used as the control signal.

Specifically, a control circuit formed over a rigid substrate can be used in the functional panel. Alternatively, a control circuit formed over a rigid substrate can be electrically connected to the control unit 238 with the use of a flexible printed circuit.

«Control Circuit 233»

A timing controller can be used as the control circuit 233, for example.

Note that this embodiment can be combined with any of the other embodiments in this specification as appropriate.

Embodiment 7

In this embodiment, a structure of an input/output device of one embodiment of the present invention will be described with reference to FIG. 16.

Figure 16:
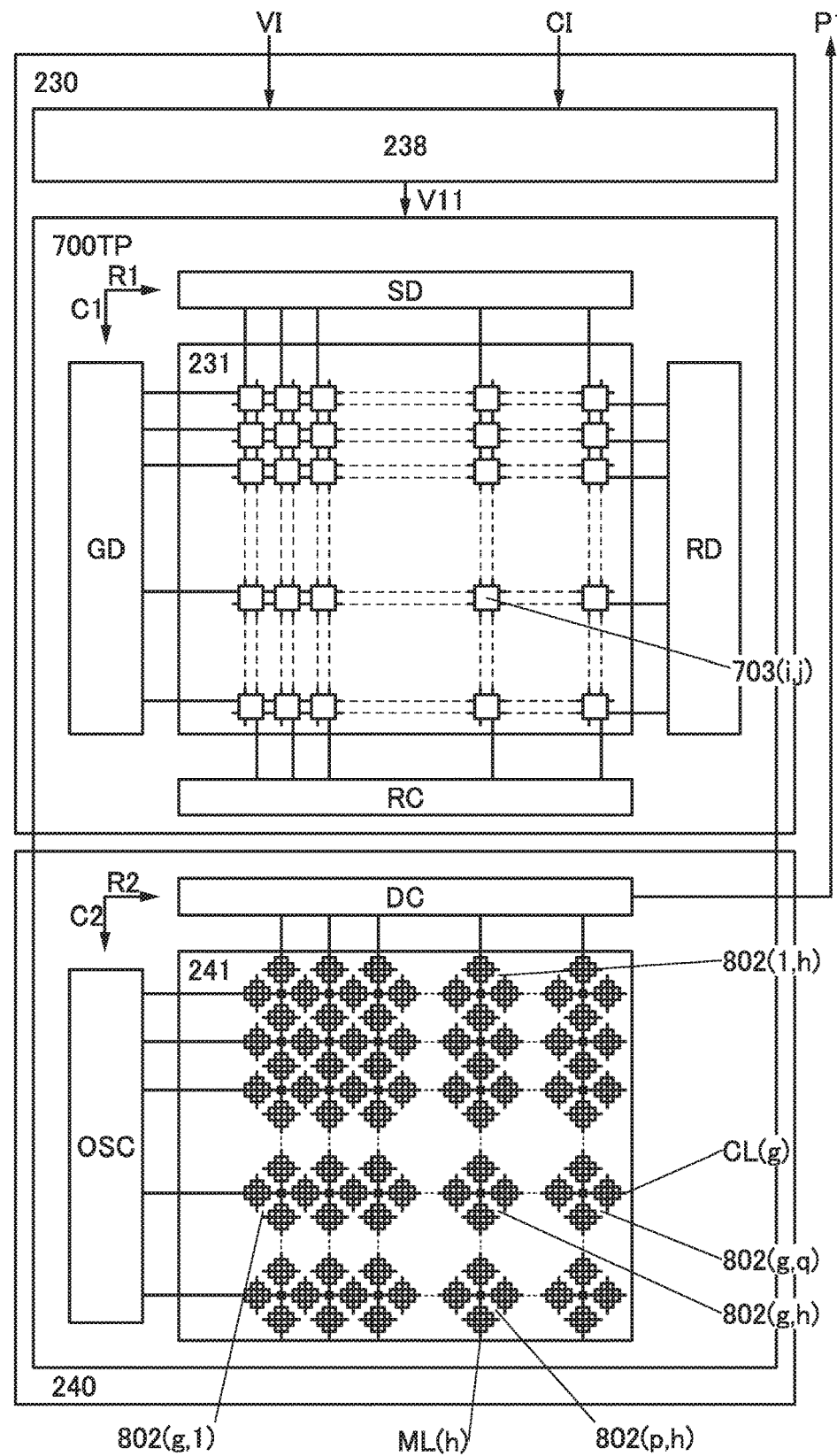
FIG. 16 is a block diagram illustrating a structure of an input/output device of one embodiment.

FIG. 16 is a block diagram illustrating a structure of an input/output device of one embodiment of the present invention.

<Structure Example 1 of Input/Output Device>

The input/output device described in this embodiment includes an input unit 240 and a display unit 230 (see FIG. 16).

«Structure Example of Display Unit 230»

The display unit 230 includes a functional panel. For example, the functional panel 700 described in any of Embodiments 1 to 5 can be used as the display unit 230.

Note that a panel including the input unit 240 and the display unit 230 can be referred to as an input/output panel 700TP.

«Structure Example of Input Unit 240»

The input unit 240 includes a sensing region 241. The input unit 240 has a function of sensing an object approaching the sensing region 241.

The sensing region 241 includes a region overlapping with the pixel 703$(i,j)$.

Accordingly, an object that approaches the region overlapping with the display unit can be sensed while image data is displayed using the display unit. Alternatively, a finger or the like that approaches the display unit can be used as a pointer to input positional data. Alternatively, positional data can be associated with image data displayed on the display unit. Consequently, a novel input/output device that is highly convenient or reliable can be provided.

«Structure Example 1 of Sensing Region 241»

The sensing region 241 can include one or more sensors, for example.

The sensing region 241 includes a group of sensors 802$(g,l)$ to 802$(g,q)$ and another group of sensors 802$(l,h)$ to 802$(p,h)$. Note that g is an integer greater than or equal to 1 and less than or equal to p, h is an integer greater than or equal to 1 and less than or equal to q, and each of p and q is an integer greater than or equal to 1.

The group of the sensors 802$(g,l)$ to 802$(g,q)$ include the sensor 802$(g,h)$ and are arranged in the row direction (the direction indicated by the arrow R2 in FIG. 16). Note that the direction indicated by the arrow R2 may be the same as or different from the direction indicated by the arrow R1.

The another group of sensors 802$(l,h)$ to 802$(p,h)$ include the sensor 802$(g,h)$ and are arranged in the column direction intersecting the row direction (the direction indicated by the arrow C2 in FIG. 16).

«Sensor»

The sensor has a function of sensing an approaching pointer. For example, a finger or a stylus pen can be used as the pointer. For example, a piece of metal or a coil can be used as the stylus pen.

Specifically, a capacitive proximity sensor, an electromagnetic inductive proximity sensor, an optical proximity sensor, a resistive proximity sensor, or the like can be used as the sensor.

Alternatively, a plurality of kinds of sensors can be used in combination. For example, a sensor that senses a finger and a sensor that senses a stylus pen can be used in combination.

Accordingly, the kind of a pointer can be identified. Alternatively, a different instruction can be associated with sensing data on the basis of the kind of the identified pointer. Specifically, when a finger is identified as being used as the pointer, sensing data can be associated with a gesture. Meanwhile, when a stylus pen is identified as being used as the pointer, sensing data can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

«Structure Example 2 of Input Unit 240»

The input unit 240 can include an oscillator circuit OSC and a sensor circuit DC (see FIG. 16).

The oscillator circuit OSC supplies a search signal to the sensor 802(*g,h*). For example, a rectangular wave, a sawtooth wave, a triangular wave, or a sine wave can be used as the search signal.

The sensor 802(*g,h*) generates and supplies a sensing signal that changes in accordance with the search signal and the distance to a pointer approaching the sensor 802(*g,h*).

The sensor circuit DC supplies input data in accordance with the sensing signal.

Accordingly, the distance from an approaching pointer to the sensing region 241 can be sensed. Alternatively, the position in the sensing region 241 where the pointer comes the closest can be sensed.

Note that this embodiment can be combined with any of the other embodiments in this specification as appropriate.

Embodiment 8

In this embodiment, a structure of a data processing device of one embodiment of the present invention will be described with reference to FIGS. 17A to 17C, FIGS. 18A and 18B, and FIGS. 19A to 19C.

Figure 17A:
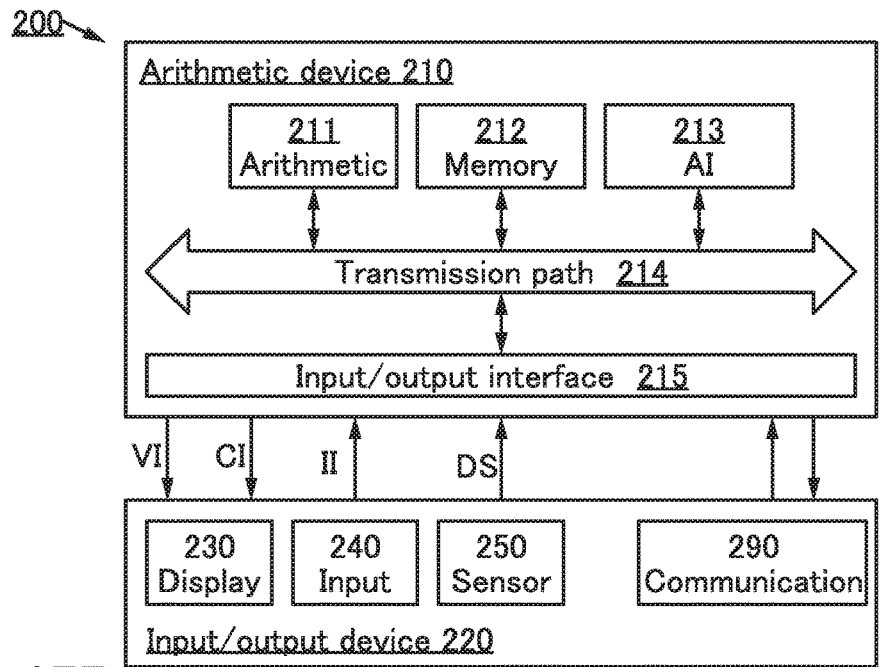
FIGS. 17A to 17C each illustrate a structure of a data processing device of one embodiment.
Figure 17B:
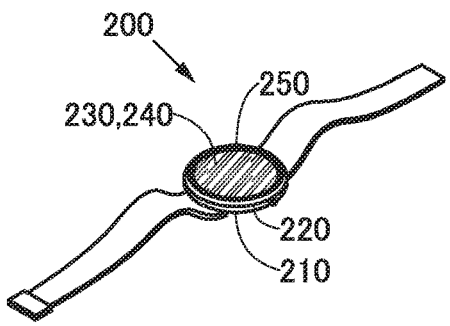
Figure 17C:
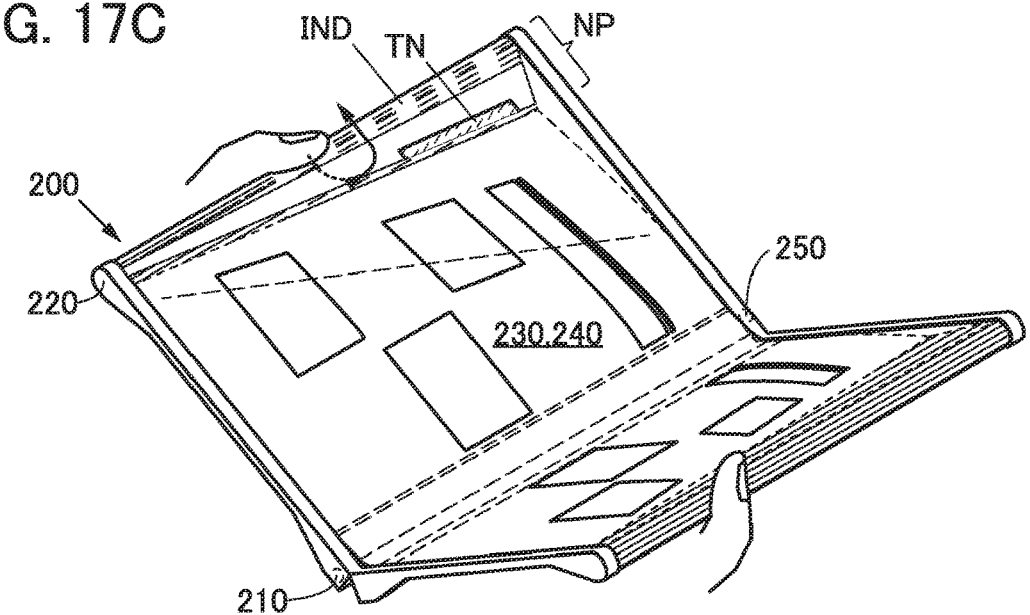

FIG. 17A is a block diagram illustrating a structure of a data processing device of one embodiment of the present invention. FIGS. 17B and 17C are projection views each illustrating an example of the appearance of a data processing device.

Figure 18A:
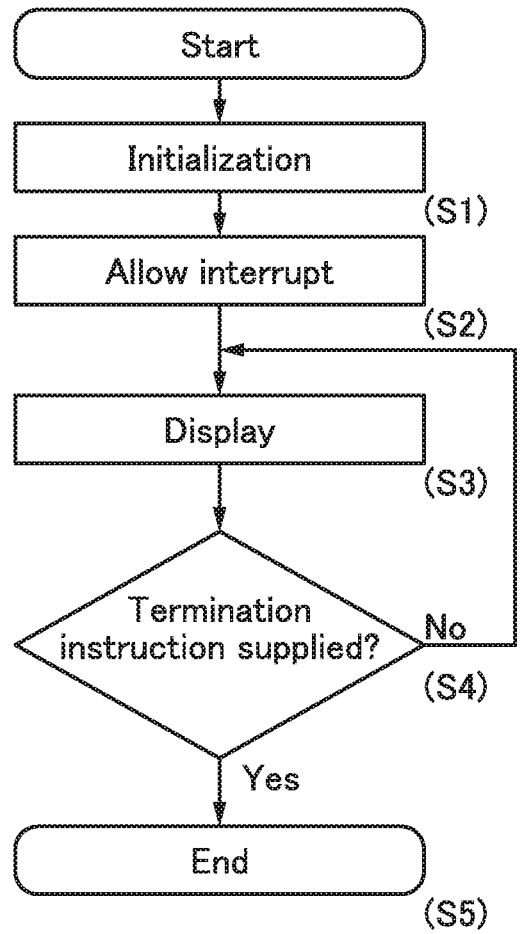
FIGS. 18A and 18B are flowcharts illustrating a method for driving a data processing device of one embodiment.
Figure 18B:
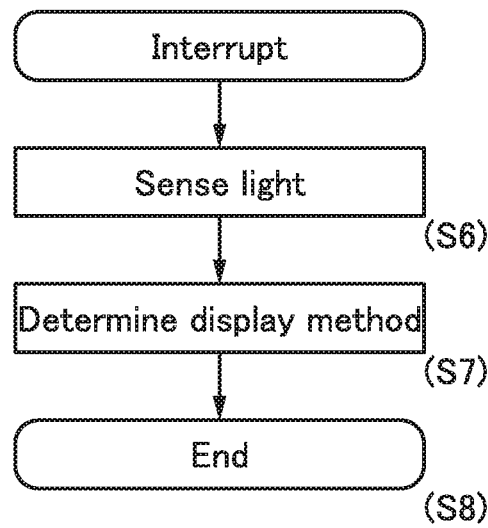

FIGS. 18A and 18B are flow charts illustrating a program of one embodiment of the present invention. FIG. 18A is a flow chart illustrating main processing of the program of one embodiment of the present invention. FIG. 18B is a flow chart illustrating interrupt processing.

Figure 19A:
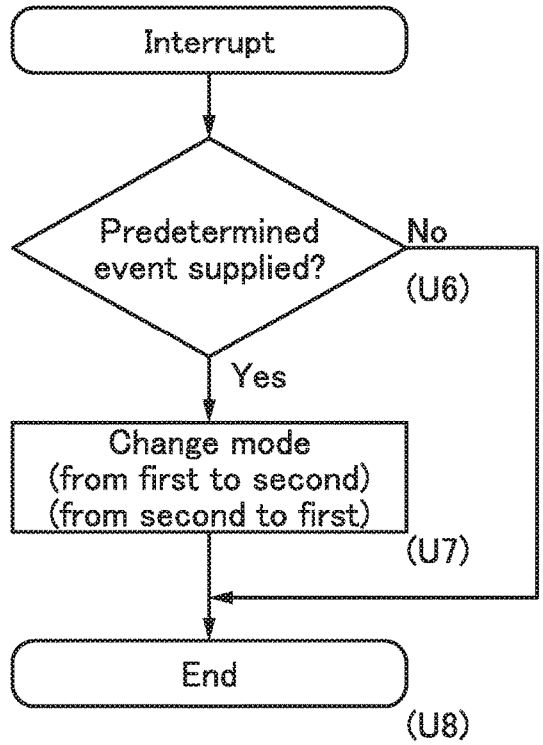
FIGS. 19A to 19C illustrate a method for driving a data processing device of one embodiment.
Figure 19B:
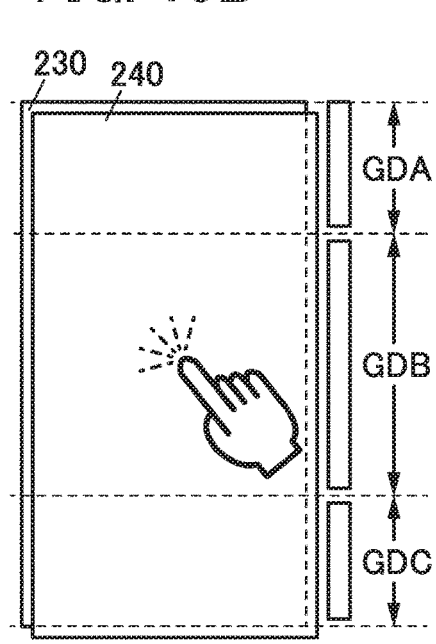
Figure 19C:
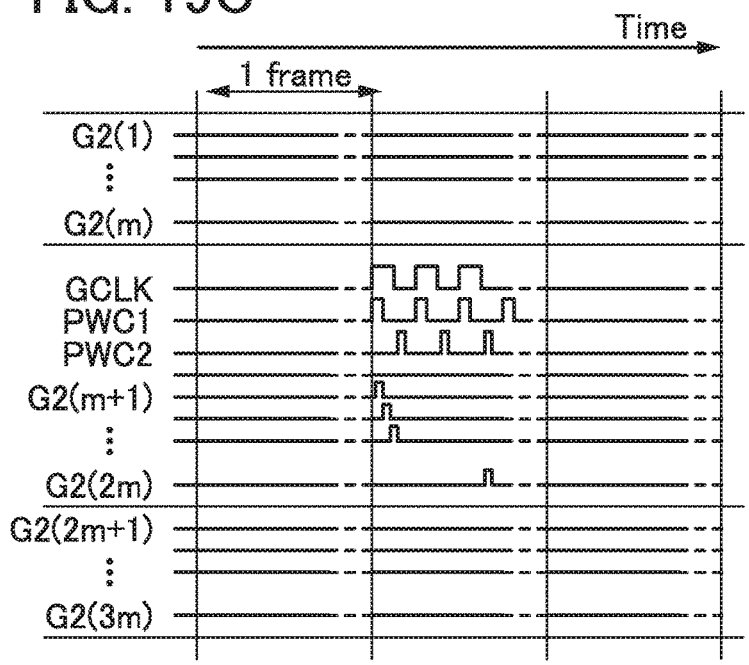

FIGS. 19A to 19C illustrate a program of one embodiment of the present invention. FIG. 19A is a flow chart illustrating interrupt processing of the program of one embodiment of the present invention. FIG. 19B is a schematic view illustrating handling of a data processing device of one embodiment of the present invention, and FIG. 19C is a timing chart illustrating operation of the data processing device of one embodiment of the present invention.

<Structure Example 1 of Data Processing Device>

The data processing device described in this embodiment includes an arithmetic device 210 and an input/output device 220 (see FIG. 17A). The input/output device 220 is electrically connected to the arithmetic device 210. The data processing device 200 can include a housing (see FIG. 17B and FIG. 17C).

«Structure Example 1 of Arithmetic Device 210»

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic unit 211 and a memory unit 212. The arithmetic device 210 also includes a transmission path 214 and an input/output interface 215.

The transmission path 214 is electrically connected to the arithmetic unit 211, the memory unit 212, and the input/output interface 215.

«Arithmetic Unit 211»

The arithmetic unit 211 has a function of executing a program, for example.

«Memory Unit 212»

The memory unit 212 has a function of, for example, storing a program executed by the arithmetic unit 211, initial data, setting data, an image, or the like.

Specifically, a hard disk, a flash memory, a memory using a transistor including an oxide semiconductor, or the like can be used.

«Input/Output Interface 215 and Transmission Path 214»

The input/output interface 215 includes a terminal or a wiring and has a function of supplying data and receiving data. For example, the input/output interface 215 can be electrically connected to the transmission path 214. Moreover, the input/output interface 215 can be electrically connected to the input/output device 220.

The transmission path 214 includes a wiring and has a function of supplying data and receiving data. For example, the transmission path 214 can be electrically connected to the input/output interface 215. In addition, the transmission path 214 can be electrically connected to the arithmetic unit 211, the memory unit 212, or the input/output interface 215.

«Structure Example of Input/Output Device 220»

The input/output device 220 supplies the input data II and the sensing data DS. The input/output device 220 is supplied with the control data CI and the image data VI (see FIG. 17A).

For example, a keyboard scan code, positional data, data on button handling, sound data, or image data can be used as the input data II. For example, data on illuminance, attitude, acceleration, direction, pressure, temperature, or humidity of the environment where the data processing device 200 is used, for instance, can be used as the sensing data DS.

For example, a signal for controlling the luminance, a signal for controlling the color saturation, or a signal for controlling the hue to display the image data VI can be used as the control data CI. Alternatively, a signal for changing part of display based on the image data VI can be used as the control data CI.

The input/output device 220 includes the display unit 230, the input unit 240, and a sensor unit 250. For example, the input/output device described in Embodiment 7 can be used as the input/output device 220. The input/output device 220 can include a communication unit 290.

«Structure Example of Display Unit 230»

The display unit 230 displays the image data VI on the basis of the control data CI.

The display unit 230 includes the control unit 238, the driver circuit GD, the driver circuit SD, and the functional panel 700 (see FIG. 15A). For example, the display device described in Embodiment 6 can be used in the display unit 230.

«Structure Example of Input Unit 240»

The input unit 240 generates the input data II. The input unit 240 has a function of supplying positional data P1, for example.

For example, a human interface or the like can be used as the input unit 240 (see FIG. 17A). Specifically, a keyboard, a mouse, a touch sensor, a microphone, a camera, or the like can be used as the input unit 240.

A touch sensor having a region overlapping with the display unit 230 can be used. Note that an input/output device that includes the display unit 230 and a touch sensor having a region overlapping with the display unit 230 can be referred to as a touch panel or a touch screen.

For example, a user can make various gestures (e.g., tap, drag, swipe, and pinch in) using a finger on the touch panel as a pointer.

The arithmetic device 210, for example, analyzes data on the position, track, or the like of the finger on the touch panel and determines that a predetermined gesture is supplied when the analysis results meet predetermined conditions.

Therefore, the user can supply a certain operating instruction associated with a predetermined gesture by using the gesture.

For instance, the user can supply a scrolling instruction for changing the position where image data is displayed, by using a gesture of touching and moving a finger on the touch panel.

The user can supply a dragging instruction for pulling out and displaying a navigation panel NP at an edge portion of the region 231, by using a gesture of moving a finger touching the edge portion of the region 231 (see FIG. 17C). Moreover, the user can supply a leafing through instruction for displaying index images IND, some parts of other pages, or thumbnail images TN of other pages in an predetermined order on the navigation panel NP so that the user can flip through these images, by using a gesture of moving the position where a finger presses hard or by using the pressure of pressing the finger. Consequently, the user can turn the pages of an e-book like flipping through the pages of a paper book. Moreover, the user can search a given page with the aid of the thumbnail images TN or the index images IND.

«Structure Example of Sensor Unit 250»

The sensor unit 250 generates the sensing data DS. The sensor unit 250 has a function of sensing the illuminance of the environment where the data processing device 200 is used and a function of supplying illuminance data, for example.

The sensor unit 250 has a function of sensing the ambient conditions and supplying the sensing data. Specifically, the sensor unit 250 can supply illuminance data, attitude data, acceleration data, direction data, pressure data, temperature data, humidity data, or the like.

For example, a photosensor, an attitude sensor, an acceleration sensor, a direction sensor, a global positioning system (GPS) signal receiving circuit, a pressure-sensitive switch, a pressure sensor, a temperature sensor, a humidity sensor, or a camera can be used as the sensor unit 250.

«Communication Unit 290»

The communication unit 290 has a function of supplying data to a network and acquiring data from a network.

«Housing»

The housing has a function of housing the input/output device 220 or the arithmetic device 210. Alternatively, the housing has a function of supporting the display unit 230 or the arithmetic device 210.

Accordingly, the control data can be generated on the basis of the input data or the sensing data. Alternatively, the image data can be displayed on the basis of the input data or the sensing data. Alternatively, the data processing device is capable of operating with knowledge of the intensity of light that the housing of the data processing device receives in the environment where the data processing device is used. Alternatively, the user of the data processing device can select a display method. Consequently, a novel data processing device that is highly convenient or reliable can be provided.

Note that in some cases, these components cannot be clearly distinguished from each other and one component may also serve as another component or include part of another component. For example, a touch panel in which a touch sensor overlaps with a functional panel serves as an input unit as well as a display unit.

«Structure Example 2 of Arithmetic Device 210»

The arithmetic device 210 includes an artificial intelligence unit 213 (see FIG. 17A).

The artificial intelligence unit 213 is supplied with the input data II or the sensing data DS, and infers the control data CI on the basis of the input data II or the sensing data DS. Moreover, the artificial intelligence unit 213 supplies the control data CI.

In this manner, the control data CI for performing display which the user finds suitable can be generated. Alternatively, it is possible to perform display which the user finds suitable. Alternatively, the control data CI for performing display which the user finds comfortable can be generated. Alternatively, it is possible to perform display which the user finds comfortable. Consequently, a novel data processing device that is highly convenient or reliable can be provided.

[Natural Language Processing on Input Data II]

Specifically, the artificial intelligence unit 213 can perform natural language processing on the input data II and extract one feature from the whole input data II. For example, the artificial intelligence unit 213 can infer emotion or the like in the input data II and regard the inference as a feature. The artificial intelligence unit 213 can also infer the color, design, font, or the like empirically felt suitable for the feature. The artificial intelligence unit 213 can also generate data specifying the color, design, or font of a letter or data specifying the color or design of the background, and use the generated data as the control data CI.

Specifically, the artificial intelligence unit 213 can perform natural language processing on the input data II and extract some words included in the input data II. For example, the artificial intelligence unit 213 can extract expressions including a grammatical error, a factual error, emotion, or the like. Moreover, the artificial intelligence unit 213 can generate and use the control data CI for displaying extracted part in the color, design, font, or the like different from those of another part.

[Image Processing on Input Data II]

Specifically, the artificial intelligence unit 213 can perform image processing on the input data II and extract one feature from the input data II. For example, the artificial intelligence unit 213 can infer the age where the input data II was captured, whether the input data II was captured indoors or outdoors, or whether the input data II was captured in the daytime or at night, for example, and regard the inference as a feature. The artificial intelligence unit 213 can also infer the color tone empirically felt suitable for the feature and generate the control data CI for using the color tone for display. Specifically, data specifying color (e.g., full color, monochrome, or sepia) used for expressing a gradation can be used as the control data CI.

Specifically, the artificial intelligence unit 213 can perform image processing on the input data II and extract some images included in the input data II. For example, the artificial intelligence unit 213 can generate the control data CI for displaying a boundary between one part and another part of the extracted image. Specifically, the artificial intelligence unit 213 can generate the control data CI for displaying a rectangle surrounding part of the extracted image.

[Inference Using Sensing Data DS]

Specifically, the artificial intelligence unit 213 can make inference with the use of the sensing data DS. Alternatively, the artificial intelligence unit 213 can generate the control data CI on the basis of the inference so that the user of the data processing device 200 can feel comfortable.

Specifically, the artificial intelligence unit 213 can generate the control data CI for adjusting display brightness on the basis of the ambient illuminance or the like to provide comfortable display brightness. The artificial intelligence unit 213 can also generate the control data CI for adjusting volume on the basis of the ambient noise or the like to provide comfortable volume.

As the control data CI, a clock signal, a timing signal, or the like that is supplied to the control unit 238 included in the display unit 230 can be used. A clock signal, a timing signal, or the like that is supplied to a control unit included in the input unit 240 can also be used as the control data CI.

<Structure Example 2 of Data Processing Device>

Another structure of the data processing device of one embodiment of the present invention will be described with reference to FIGS. 18A and 18B.

«Program»

A program of one embodiment of the present invention includes the following steps (see FIG. 18A).

[First Step]

In a first step, the setting is initialized (see S1 in FIG. 18A). For example, predetermined image data that is to be displayed on start-up and data for determining a predetermined mode of displaying the image data and a predetermined method of displaying the image data are acquired from the memory unit 212. Specifically, still image data or moving image data can be used as the predetermined image data. Furthermore, a first mode or a second mode can be used as the predetermined mode.

[Second Step]

In a second step, interrupt processing is allowed (see S2 in FIG. 18A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is always ready to be executed after the program is started up.

[Third Step]

In a third step, image data is displayed in a predetermined mode or a predetermined display method selected in the first step or the interrupt processing (see S3 in FIG. 18A). Note that the predetermined mode identifies a mode for displaying the image data, and the predetermined display method identifies a method of displaying the image data. For example, the image data VI can be used as data to be displayed.

For example, one method of displaying the image data VI can be associated with the first mode. Another method of displaying the image data VI can be associated with the second mode. Thus, a display method can be selected on the basis of the selected mode.

«First Mode»

Specifically, a method of supplying selection signals to a scan line at a frequency of 30 Hz or more, preferably 60 Hz or more and performing display in accordance with the selection signals can be associated with the first mode.

For example, the supply of selection signals at a frequency of 30 Hz or more, preferably 60 Hz or more enables motion in a moving image to be displayed smoothly.

For example, refreshing an image at a frequency of 30 Hz or more, preferably 60 Hz or more allows the data processing device 200 that the user is using to display an image smoothly following the user's operation.

«Second Mode»

Specifically, a method of supplying selection signals to a scan line at a frequency less than 30 Hz, preferably less than 1 Hz, further preferably less than once a minute and performing display in accordance with the selection signals can be associated with the second mode.

The supply of selection signals at a frequency less than 30 Hz, preferably less than 1 Hz, further preferably less than once a minute allows display with flickering reduced. Furthermore, power consumption can be reduced.

For example, when the data processing device 200 is used in a clock or a watch, the display can be refreshed once a second, once a minute, or the like.

For example, when a light-emitting element is used as a display element, the light-emitting element can be made to emit light in a pulsed manner to display image data. Specifically, an organic EL element can be made to emit light in a pulsed manner, and its afterglow can be used for display. Since an organic EL element has excellent frequency characteristics, time for driving the light-emitting element can be shortened, and thus power consumption can be reduced in some cases. Alternatively, heat generation can be inhibited, and thus the deterioration of the light-emitting element can be suppressed in some cases.

[Fourth Step]

In a fourth step, the program moves to a fifth step when a termination instruction has been supplied, whereas the program moves to the third step when the termination instruction has not been supplied (see S4 in FIG. 18A).

For example, a termination instruction supplied in the interrupt processing can be used to determine the next step.

[Fifth Step]

In the fifth step, the program terminates (see S5 in FIG. 18A).

«Interrupt Processing»

The interrupt processing includes sixth to eighth steps described below (see FIG. 18B).

[Sixth Step]

In the sixth step, the illuminance of the environment where the data processing device 200 is used is sensed using the sensor unit 250, for example (see S6 in FIG. 18B). Note that the color temperature or chromaticity of ambient light may be sensed instead of the illuminance of the environment.

[Seventh Step]

In the seventh step, a display method is determined on the basis of the sensed illuminance data (see S7 in FIG. 18B). For example, a display method is determined such that the brightness of display is not too bright or too dark.

In the case where the color temperature or chromaticity of the ambient light is sensed in the sixth step, the color of display may be adjusted.

[Eighth Step]

In the eighth step, the interrupt processing terminates (see S8 in FIG. 18B).

<Structure Example 3 of Data Processing Device>

Another structure of the data processing device of one embodiment of the present invention will be described with reference to FIGS. 19A to 19C.

FIG. 19A is a flow chart illustrating a program of one embodiment of the present invention. The interrupt processing in the flow chart in FIG. 19A is different from that in FIG. 18B.

Note that the structure example 3 of the data processing device is different from the interrupt processing in FIG. 18B in that the interrupt processing includes a step of changing a mode on the basis of a supplied predetermined event. Here, the differences will be described in detail below, and the above description is referred to for similar portions.

«Interrupt Processing»

The interrupt processing includes the following sixth to eighth steps (see FIG. 19A).

[Sixth Step]

In the sixth step, the processing proceeds to the seventh step when a predetermined event has been supplied, whereas the processing proceeds to the eighth step when the predetermined event has not been supplied (see U6 in FIG. 19A). For example, whether the predetermined event is supplied in a predetermined period or not can be a branch condition. Specifically, the predetermined period can be a period longer than 0 seconds and 5 seconds or less, 1 second or less, 0.5 seconds or less, preferably 0.1 seconds or less.

[Seventh Step]

In the seventh step, the mode is changed (see U7 in FIG. 19A). Specifically, the mode is changed from the first mode to the second mode, or the mode is changed from the second mode to the first mode.

For example, a display mode of part of a region in the display unit 230 can be changed. Specifically, it is possible to change a display mode of a region where one driver circuit in the display unit 230 including a driver circuit GDA, a driver circuit GDB, and a driver circuit GDC supplies a selection signal (see FIG. 19B).

For example, the display mode of the region where a selection signal is supplied from the driver circuit GDB can be changed when a predetermined event is supplied to the input unit 240 in a region overlapping with the region where a selection signal is supplied from the driver circuit GDB (see FIGS. 19B and 19C). Specifically, the frequency of the selection signal supplied from the driver circuit GDB can be changed in accordance with a "tap" event supplied to a touch panel with a finger or the like.

A signal GCLK is a clock signal for controlling the operation of the driver circuit GDB, and signals PWC1 and PWC2 are pulse width control signals for controlling the operation of the driver circuit GDB. The driver circuit GDB supplies selection signals to conductive films G2($m$+1) to G2(2m) on the basis of the signals GCLK, PWC1, PWC2, and the like.

Thus, for example, the driver circuit GDB can supply selection signals without supply of selection signals from the driver circuits GDA and GDC. Alternatively, the display of the region where selection signals are supplied from the driver circuit GDB can be refreshed without any change in the display of regions where selection signals are supplied from the driver circuits GDA and GDC. Alternatively, power consumed by the driver circuits can be reduced.

[Eighth Step]

In the eighth step, the interrupt processing terminates (see U8 in FIG. 19A). Note that the interrupt processing may be repeatedly executed in a period during which the main processing is executed.

«Predetermined Event»

For example, the following events can be used: events supplied using a pointing device such as a mouse (e.g., click and drag) and events supplied to a touch panel with a finger or the like used as a pointer (e.g., tap, drag, and swipe).

For example, the position of a slide bar pointed by a pointer, the swipe speed, and the drag speed can be used as parameters assigned to an instruction associated with a predetermined event.

For example, data sensed by the sensor unit 250 is compared to a predetermined threshold value, and the compared results can be used for the event.

Specifically, a pressure sensor or the like in contact with a button or the like that can be pushed in a housing can be used as the sensor unit 250.

«Instruction Associated with Predetermined Event»

For example, a termination instruction can be associated with a predetermined event.

For example, a page-turning instruction for switching displayed image data from one to another can be associated with a predetermined event. Note that a parameter determining the page-turning speed or the like when the page-turning instruction is executed can be supplied using the predetermined event.

For example, a scroll instruction for moving the position of displayed part of image data and displaying another part continuing from that part can be associated with a predetermined event. Note that a parameter determining the moving speed of the display position, for instance, when the scroll instruction is executed can be supplied using the predetermined event.

For example, an instruction for setting the display method or an instruction for generating image data can be associated with a predetermined event. Note that a parameter determining the brightness of a generated image can be associated with the predetermined event. A parameter determining the brightness of a generated image may be determined on the basis of ambient brightness sensed by the sensor unit 250.

For example, an instruction for acquiring data distributed via a push service using the communication unit 290 can be associated with a predetermined event.

Note that positional data sensed by the sensor unit 250 may be used to determine the presence or absence of a qualification for acquiring data. Specifically, the user may be considered to have a qualification for acquiring data when the user is in a predetermined class room, school, conference room, office, building, or the like. Accordingly, for example, the data processing device 200 that receives educational materials distributed in a classroom of a school or a university can be used as a schoolbook or the like (see FIG. 17C). Alternatively, materials distributed in a company's conference room, for instance, can be received and used for a conference material.

<Structure Example 4 of Data Processing Device>

Another structure of the data processing device of one embodiment of the present invention will be described with reference to FIGS. 20A to 20C.

Figure 20A:
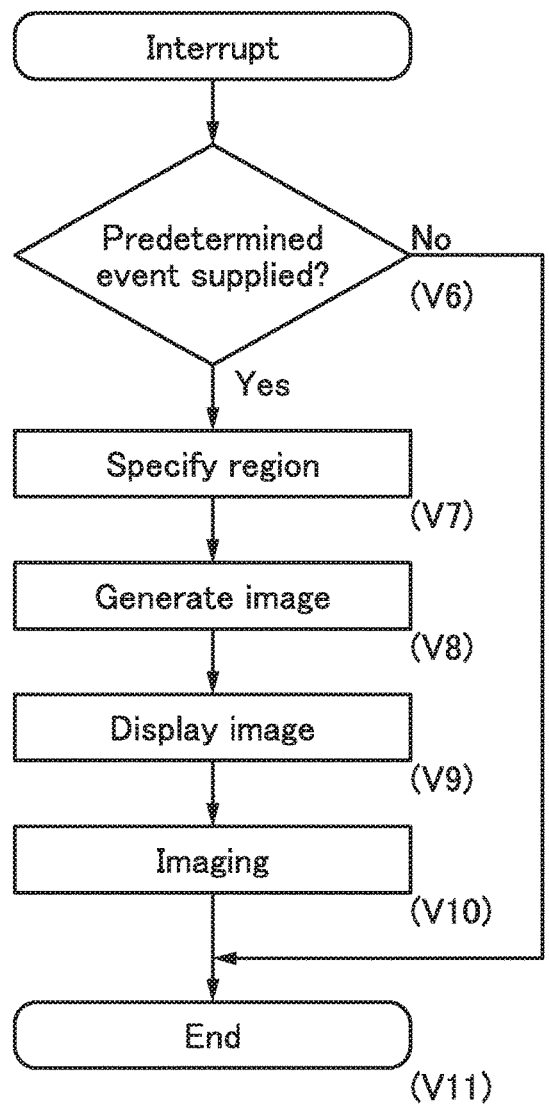
FIGS. 20A to 20C illustrate a method for driving a data processing device of one embodiment.

FIG. 20A is a flow chart illustrating a program of one embodiment of the present invention. The interrupt processing in the flow chart in FIG. 20A is different from that in FIG. 18B. FIG. 20B is a schematic diagram illustrating the operation of the program illustrated in FIG. 20A. FIG. 20C is a schematic diagram of a captured fingerprint.

Note that the structure example 4 of the data processing device described with FIG. 20A is different from the structure example described with FIG. 18B in the interrupt processing. Specifically, the interrupt processing in this example includes a step of specifying a region, a step of generating an image, a step of displaying the image, and a step of taking an image on the basis of a supplied predetermined event. Here, the differences will be described in detail below, and the above description is referred to for similar portions.

«Interrupt Processing»

The interrupt processing includes sixth to eleventh steps (see FIG. 20A).

[Sixth Step]

In the sixth step, the processing proceeds to the seventh step when a predetermined event has been supplied, whereas the processing proceeds to the eleventh step when the predetermined event has not been supplied (see V6 in FIG. 20A).

The predetermined event can be supplied with the sensor unit 250, for example. Specifically, a motion such as lifting of the data processing device can be used as the predetermined event. For example, a motion of the data processing device can be sensed using an angular sensor or an acceleration sensor. Alternatively, contact or proximity of an object such as a finger can be sensed using a touch sensor.

[Seventh Step]

In the seventh step, a first region SH is specified (see V7 in FIG. 20A).

For example, a region where an object such as a finger touches or approaches the input/output device 220 of one embodiment of the present invention can be the first region SH. Alternatively, a region that is set in advance by the user or the like can be used as the first region SH.

Figure 20B:
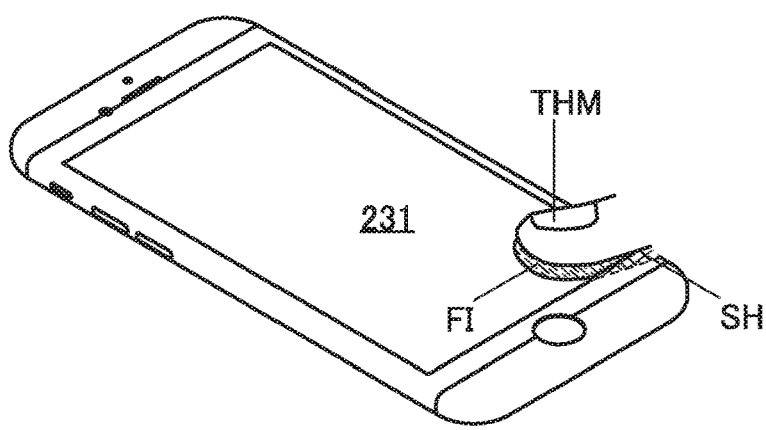
Figure 20C:

Specifically, an image of a finger THM or the like that touches or approaches the functional panel of one embodiment of the present invention is taken using the pixel 703$(i,j)$ and subjected to image processing, whereby the first region SH can be specified (see FIG. 20B).

For example, an image of a shadow caused when external light is blocked by contact or proximity of an object such as the finger THM is taken using the pixel 703$(i,j)$ in the functional panel of one embodiment of the present invention and subjected to image processing, whereby the first region SH can be specified.

Alternatively, with the use of the pixel 703$(i,j)$ in the functional panel of one embodiment of the present invention, an object such as the finger THM that touches or approaches the functional panel is irradiated with light, and an image of light reflected by the object is taken using the pixel 703$(i,j)$ and subjected to image processing, whereby the first region SH can be specified.

Alternatively, a region where an object such as the finger THM touches can be specified as the first region SH by a touch sensor.

[Eighth Step]

In the eighth step, an image FI including a second region and a third region is generated in accordance with the first region SH (see V8 in FIG. 20A and FIG. 20B). For example, the shape of the first region SH is used as the shape of the second region, and a region excluding the first region SH is used as the third region.

[Ninth Step]

In the ninth step, the image FI is displayed so that the second region overlaps with the first region SH (see V9 in FIG. 20A and FIG. 20B).

For example, an image signal is generated from the image FI and supplied to the region 231, and light is emitted from the pixel 703$(i,j)$. Alternatively, in a period during which the first selection signal is supplied to the conductive film G1$(i)$, the generated image signal is supplied to the conductive film S1g$(j)$, and the image signal can be written to the pixel 703$(i,j)$. Alternatively, the generated image signal is supplied to the conductive film S1g$(j)$ and the conductive film S2g$(j)$, and an enhanced image signal can be written to the pixel 703$(i,j)$. Alternatively, the use of an enhanced image signal enables display with higher luminance.

Thus, the image FI can be displayed to overlap with the region 231 where an object such as a finger touches or the first region SH where the object approaches. Alternatively, the region where an object such as a finger touches can be irradiated with light with the use of the pixel 703$(i,j)$. Alternatively, a touching or approaching object such as the finger THM can be illuminated. Alternatively, the user can be encouraged to make an object such as a finger touch or approach a region that is set in advance by the user or the like.

[Tenth Step]

In the tenth step, an image of an object that touches or approaches the first region SH is taken while the image FI is displayed (see V10 in FIG. 20A and FIG. 20B).

For example, an image of the finger THM or the like approaching the region 231 is taken while the finger THM or the like is irradiated with light. Specifically, an image of a fingerprint FP of the finger THM in contact with the region 231 can be taken (see FIG. 20C).

For example, the supply of the first selection signal can be stopped while an image is displayed with the pixel 703$(i,j)$. For example, an image can be taken using the pixel 703$(i,j)$ while the supply of the first selection signal to the pixel circuit 530G$(i,j)$ is stopped.

Accordingly, an image of a touching or approaching object such as a finger can be taken while the object is illuminated. Alternatively, an image can be taken in a period during which the first selection signal is not supplied. Alternatively, noise in imaging can be suppressed. Alternatively, a clear image of a fingerprint can be obtained. Alternatively, an image that can be used for the authentication of the user can be obtained. Alternatively, a clear image of the fingerprint of a finger that touches any position in the region 231 can be taken. Consequently, a novel data processing device that is highly convenient or reliable can be provided.

[Eleventh Step]

In the eleventh step, the interrupt processing terminates (see V11 in FIG. 20A).

Note that this embodiment can be combined with any of the other embodiments in this specification as appropriate.

Embodiment 9

In this embodiment, a structure of a data processing device of one embodiment of the present invention will be described with reference to FIGS. 21A to 21E, FIGS. 22A to 22E, and FIGS. 23A and 23B.

Figure 21A:
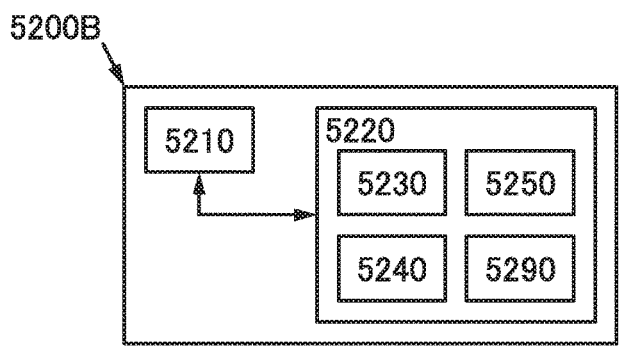
FIGS. 21A to 21E each illustrate a structure of a data processing device of one embodiment.
Figure 21B:
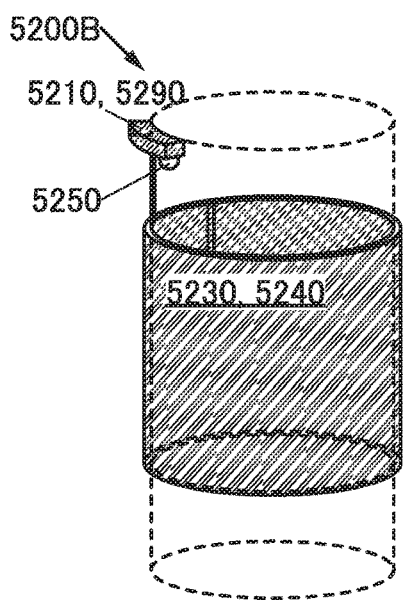
Figure 21C:
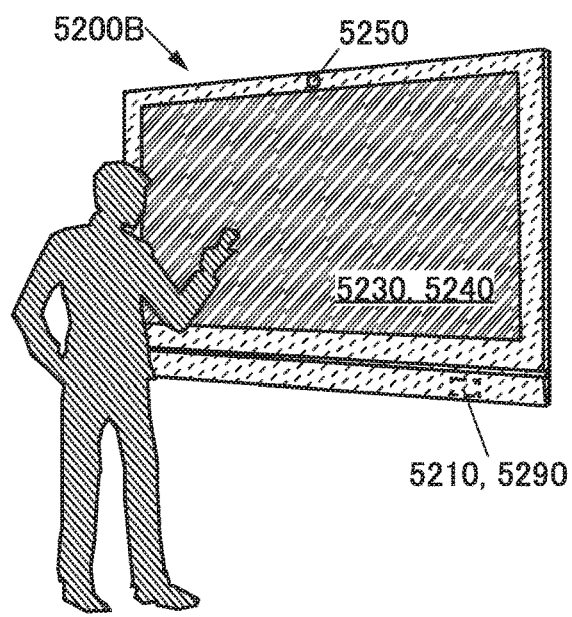
Figure 21D:
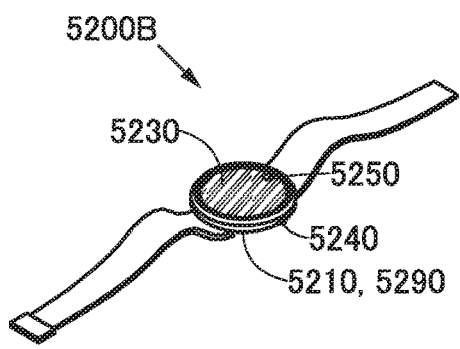
Figure 21E:
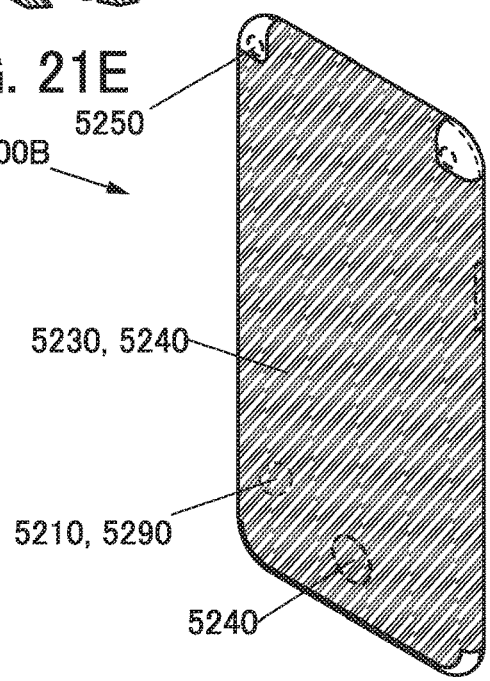
Figure 22A:
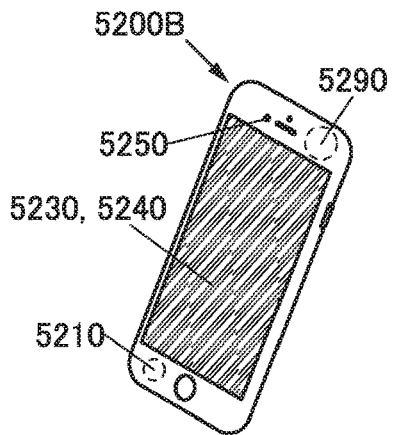
FIGS. 22A to 22E each illustrate a structure of a data processing device of one embodiment.
Figure 22B:
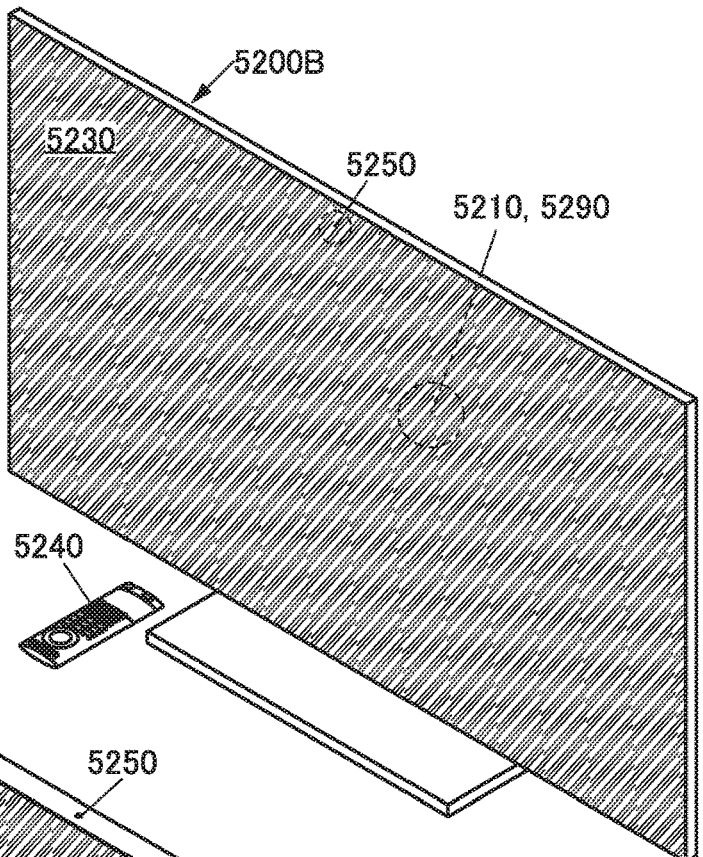
Figure 22C:
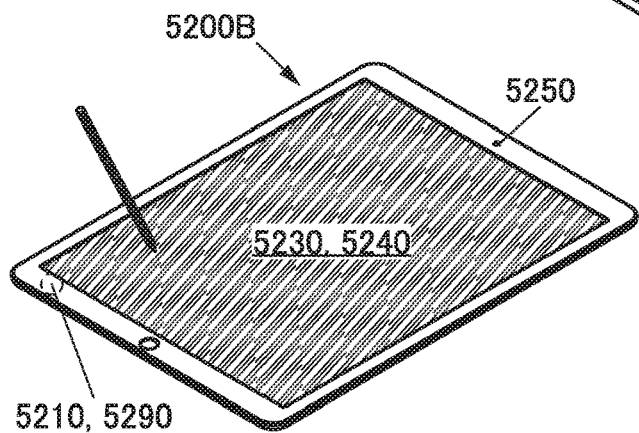
Figure 22D:
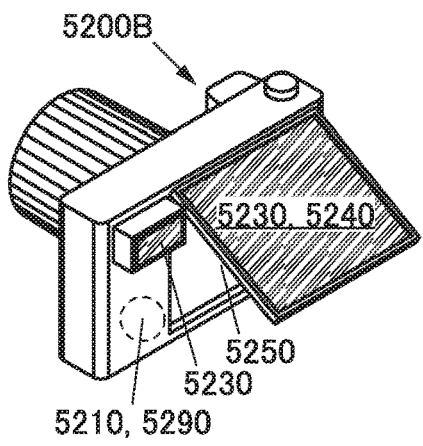
Figure 22E:
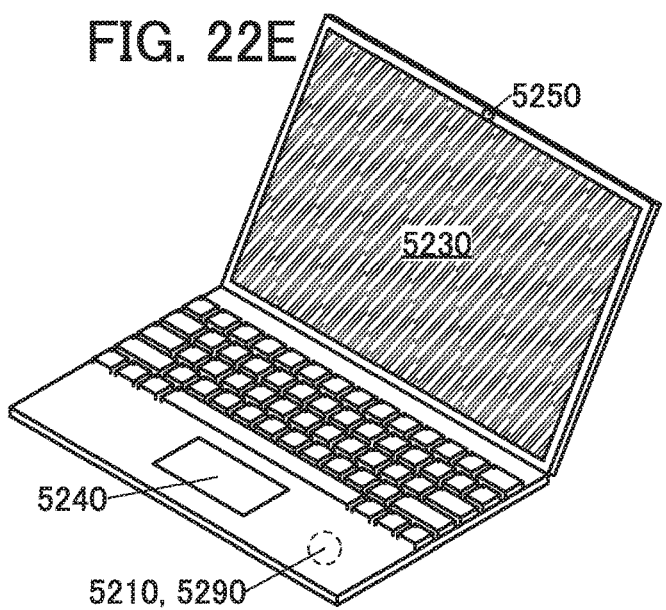
Figure 23A:
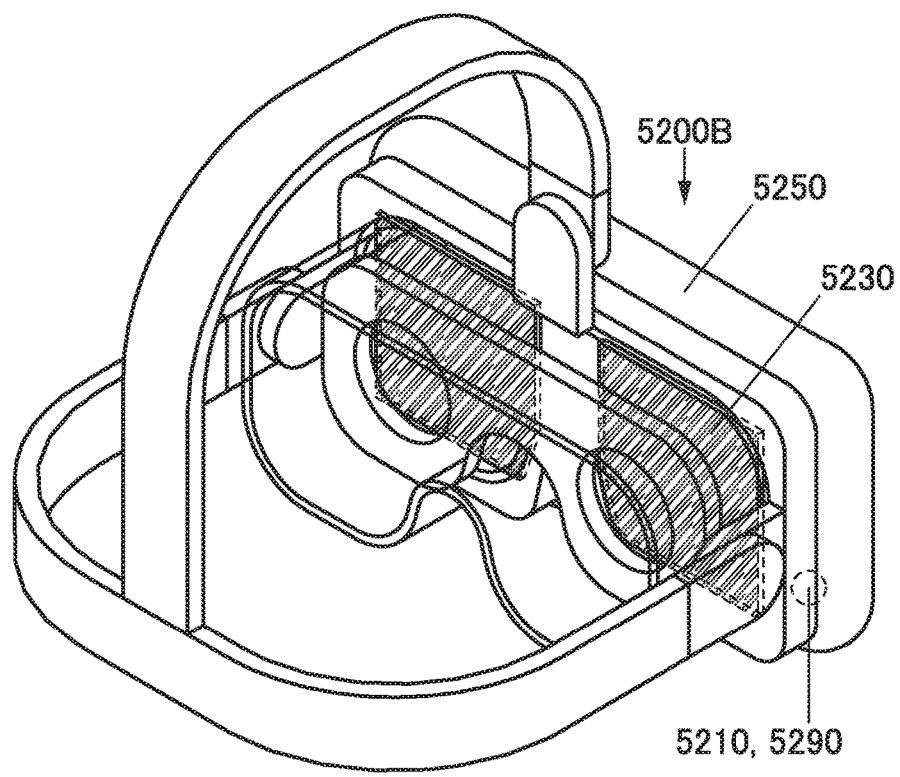
FIGS. 23A and 23B each illustrate a structure of a data processing device of one embodiment.
Figure 23B:
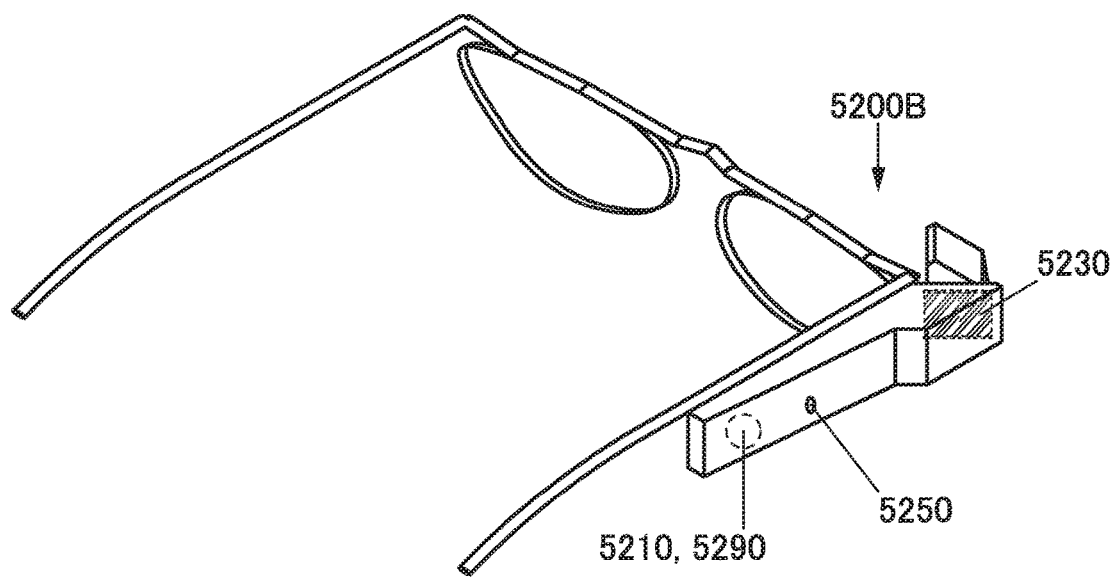

FIGS. 21A to 21E, FIGS. 22A to 22E, and FIGS. 23A and 23B illustrate structures of a data processing device of one embodiment of the present invention. FIG. 21A is a block diagram of a data processing device, and FIGS. 21B to 21E are perspective views each illustrating a structure of the data processing device. FIGS. 22A to 22E are perspective views each illustrating a structure of the data processing device. FIGS. 23A and 23B are perspective views each illustrating a structure of the data processing device.

<Data Processing Device>

A data processing device 5200B described in this embodiment includes an arithmetic device 5210 and an input/output device 5220 (see FIG. 21A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290 and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a functional panel and has a function of displaying image data. For example, the functional panel described in any of Embodiments 1 to 5 can be used in the display unit 5230.

The sensor unit 5250 has a function of supplying sensing data. For example, the sensor unit 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network through wireless communication or wired communication. Specifically, the communication unit 5290 has a function of wireless local area network communication, telephone communication, or near field communication, for example.

«Structure Example 1 of Data Processing Device»

For example, the display unit 5230 can have an outer shape along a cylindrical column (see FIG. 21B). The data processing device has a function of changing its display method in accordance with the illuminance of a usage environment. In addition, the data processing device has a function of changing the displayed content when sensing the existence of a person. This allows the data processing device to be provided on a column of a building, for example. The data processing device can display advertising, guidance, or the like. The data processing device can be used for digital signage or the like.

«Structure Example 2 of Data Processing Device»

For example, the data processing device has a function of generating image data on the basis of the path of a pointer used by a user (see FIG. 21C). Specifically, a functional panel with a diagonal size of 20 inches or longer, preferably 40 inches or longer, further preferably 55 inches or longer can be used. Alternatively, a plurality of functional panels can be arranged and used as one display region. Alternatively, a plurality of functional panels can be arranged and used as a multiscreen. Thus, the data processing device can be used for an electronic blackboard, an electronic bulletin board, or digital signage, for example.

«Structure Example 3 of Data Processing Device»

The data processing device can receive data from another device, and the data can be displayed on the display unit 5230 (see FIG. 21D). Moreover, several options can be displayed. The user can choose some from the options and send a reply to the data transmitter. As another example, the data processing device has a function of changing its display method in accordance with the illuminance of a usage environment. Thus, it is possible to obtain a smartwatch with reduced power consumption, for example. As another example, it is possible to obtain a smartwatch which can display an image such that the smartwatch can be suitably used in an environment under strong external light, e.g., outdoors in fine weather.

«Structure Example 4 of Data Processing Device»

For example, the display unit 5230 has a surface gently curved along a side surface of a housing (see FIG. 21E). The display unit 5230 includes a functional panel that is capable of displaying an image on the front surface, the side surfaces, the top surface, and the rear surface, for example. Thus, it is possible to obtain a mobile phone that can display image data on not only its front surface but also its side surfaces, top surface, and rear surface, for example.

«Structure Example 5 of Data Processing Device»

For example, the data processing device can receive data via the Internet and display the data on the display unit 5230 (see FIG. 22A). The user can check a created message on the display unit 5230 or send the created message to another device. As another example, the data processing device has a function of changing its display method in accordance with the illuminance of a usage environment. Thus, it is possible to obtain a smartphone with reduced power consumption. Alternatively, for example, it is possible to obtain a smartphone which can display an image such that the smartphone can be suitably used in an environment under strong external light, e.g., outdoors in fine weather.

«Structure Example 6 of Data Processing Device»

A remote controller can be used as the input unit 5240 (see FIG. 22B). For example, the data processing device can receive data from a broadcast station or via the Internet and display the data on the display unit 5230. Alternatively, the data processing device can take an image of the user with the sensor unit 5250 and transmit the image of the user. The data processing device can acquire a viewing history of the user and provide it to a cloud service. The data processing device can acquire recommendation data from a cloud service and display the data on the display unit 5230. A program or a moving image can be displayed on the basis of the recommendation data. As another example, the data processing device has a function of changing its display method in accordance with the illuminance of a usage environment. Accordingly, for example, it is possible to obtain a television system which can display an image such that the television system can be suitably used even when irradiated with strong external light that enters the room from the outside in fine weather.

«Structure Example 7 of Data Processing Device»

For example, the data processing device can receive educational materials via the Internet and display them on the display unit 5230 (see FIG. 22C). The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, the display unit 5230 can perform display using an image signal received from another data processing device. When the data processing device is placed on a stand or the like, the display unit 5230 can be used as a sub-display. Thus, for example, it is possible to obtain a tablet computer which can display an image such that the tablet computer is favorably used even in an environment with intense external light, e.g., in the open air under fine weather.

«Structure Example 8 of Data Processing Device»

The data processing device includes, for example, a plurality of display units 5230 (see FIG. 22D). For example, the display unit 5230 can display an image that the sensor unit 5250 is capturing. Alternatively, a captured image can be displayed on the sensor unit. Alternatively, a captured image can be decorated using the input unit 5240. Alternatively, a message can be attached to a captured image. Alternatively, a captured image can be transmitted via the Internet. Alternatively, the data processing device has a function of changing shooting conditions in accordance with the illuminance of a usage environment. Accordingly, for example, it is possible to obtain a digital camera that can display a subject such that an image is favorably viewed even in an environment with intense external light, e.g., in the open air under fine weather.

«Structure Example 9 of Data Processing Device»

For example, the data processing device of this embodiment is used as a master and another data processing device is used as a slave, whereby the other data processing device can be controlled (see FIG. 22E). As another example, part of image data can be displayed on the display unit 5230 and another part of the image data can be displayed on a display unit of another data processing device. Image signals can be supplied to another data processing device. Alternatively, with the communication unit 5290, data to be written can be obtained from an input unit of another data processing device. Thus, a large display region can be utilized by using a portable personal computer, for example.

«Structure Example 10 of Data Processing Device»

The data processing device includes, for example, the sensor unit 5250 that senses an acceleration or a direction (see FIG. 23A). The sensor unit 5250 can supply data on the position of the user or the direction in which the user faces. The data processing device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on a goggles-type data processing device, for example.

«Structure Example 11 of Data Processing Device»

The data processing device includes, for example, an imaging device and the sensor unit 5250 that senses an acceleration or a direction (see FIG. 23B). The sensor unit 5250 can supply data on the position of the user or the direction in which the user faces. Alternatively, the data processing device can generate image data in accordance with the position of the user or the direction in which the user faces. Accordingly, the data can be shown together with a real-world scene, for example. Alternatively, an augmented reality image can be displayed on a glasses-type data processing device.

Note that this embodiment can be combined with any of the other embodiments in this specification as appropriate.

When this specification and the like explicitly states that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows electrical connection between X and Y provided therebetween.

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is turned on or off to determine whether current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For instance, even if another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that an explicit description "X and Y are electrically connected" means that the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween) are regarded as being disclosed in this specification and the like. That is, the explicit description "X and Y are electrically connected" is considered to be disclosure of the same contents as ones using a simple and explicit description "X and Y are connected" in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path"; and "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

This application is based on Japanese Patent Application Serial Nos. 2019-105180 and 2019-105181 filed with Japan Patent Office on Jun. 5, 2019, the entire contents of which are hereby incorporated by reference.

What is claimed is:

1. A functional panel comprising a first pixel, the first pixel comprising:
    a light-emitting device configured to emit a first light; and
    a microlens array configured to collect the first light, the microlens array comprising a plurality of microlenses,
    wherein each of the plurality of microlenses comprises a cross section having a first shape on a first plane parallel to the light-emitting device,
    wherein the first shape is a polygon with each corner rounded,
    wherein the microlens array has a maximum filling factor on the first plane among planes parallel to the light-emitting device,
    wherein the first plane has a region filled by the plurality of microlenses and a flat region surrounded with some of the plurality of microlenses,
    wherein each of the microlenses comprises a curved surface on a plane orthogonal to the first plane, and
    wherein a convex side of the curved surface faces the light-emitting device.

2. The functional panel according to claim 1, wherein the plurality of microlenses is a Fresnel lens.

3. The functional panel according to claim 1, further comprising an insulating film,
    wherein the insulating film comprises an opening,
    wherein the opening and the light-emitting device overlap each other,
    wherein the opening comprises an inclined surface on a side wall, and
    wherein the inclined surface reflects the first light toward the microlens.

4. The functional panel according to claim 1,
    wherein the first pixel comprises a color conversion layer,
    wherein the microlens is between the light-emitting device and the color conversion layer,
    wherein the microlens is configured to collect the first light and to focus the first light on the color conversion layer,
    wherein the color conversion layer is configured to convert the first light into a second light, and
    wherein a peak wavelength of a spectrum of the second light is larger than a peak wavelength of a spectrum of the first light.

5. The functional panel according to claim 4, wherein the color conversion layer comprises a quantum dot and a light-transmitting resin.

6. The functional panel according to claim 1, further comprising a light-blocking layer,
    wherein the light-blocking layer comprises an opening, and
    wherein the opening and the light-emitting device overlap each other.

7. The functional panel according to claim 4, further comprising a coloring layer, wherein the coloring layer has a lower transmittance of the first light than a transmittance of the second light.

8. The functional panel according to claim 1,
wherein the light-emitting device comprises a first layer, a second layer, a third layer, and a fourth layer,
wherein the third layer is between the second layer and the fourth layer,
wherein the second layer is between the first layer and the third layer,
wherein the first layer comprises a first material and a second material,
wherein the second layer comprises a third material,
wherein the third layer comprises a light-emitting material and a fourth material,
wherein the fourth layer comprises a fifth material and a sixth material,
wherein the first material has a HOMO level higher than or equal to −5.7 eV and lower than or equal to −5.4 eV,
wherein the second material has an acceptor property,
wherein the third material has a lower HOMO level than the first material,
wherein the fourth material has a lower HOMO level than the third material,
wherein the fifth material has a HOMO level higher than or equal to −6.0 eV, and
wherein the sixth material is an organic complex of alkali metal or an organic complex of alkaline earth metal.

9. The functional panel according to claim 8, wherein the fifth material has an electron mobility higher than or equal to $1\times10^{-7}$ cm$^2$/Vs and lower than or equal to $5\times10^{-5}$ cm$^2$/Vs when an electric field strength is 36000 V/cm.

10. The functional panel according to claim 9,
wherein the light-emitting device comprises a first light-emitting unit, a second light-emitting unit, and an intermediate layer,
wherein the intermediate layer comprises a region between the first light-emitting unit and the second light-emitting unit, and
wherein the intermediate layer supplies a hole to one of the first light-emitting unit and the second light-emitting unit and supplies an electron to the other of the first light-emitting unit and the second light-emitting unit.

11. The functional panel according to claim 10, further comprising a set of pixels,
wherein the set of pixels comprises the first pixel and a second pixel,
wherein the first pixel comprises a first pixel circuit,
wherein the second pixel comprises a second pixel circuit and a photoelectric conversion device,
wherein the light-emitting device is electrically connected to the first pixel circuit, and
wherein the photoelectric conversion device is electrically connected to the second pixel circuit.

12. The functional panel according to claim 11, further comprising a functional layer,
wherein the functional layer comprises the first pixel circuit,
wherein the first pixel circuit comprises a first transistor,
wherein the functional layer comprises the second pixel circuit,
wherein the second pixel circuit comprises a second transistor,
wherein the functional layer comprises a driver circuit,
wherein the driver circuit comprises a third transistor,
wherein the first transistor comprises a semiconductor film,
wherein the second transistor comprises a semiconductor film formed in a step of forming the semiconductor film of the first transistor, and
wherein the third transistor comprises a semiconductor film formed in the step of forming the semiconductor film of the first transistor.

13. A display device comprising:
the functional panel according to claim 1; and
a control unit,
wherein the control unit is configured to be supplied with image data and control data,
wherein the control unit is configured to generate data on the basis of the image data,
wherein the control unit is configured to generate a control signal on the basis of the control data,
wherein the control unit is configured to supply the data and the control signal,
wherein the functional panel is configured to be supplied with the data and the control signal, and
wherein the first pixel is configured to emit the first light on the basis of the data.

14. An input/output device comprising:
an input unit; and
a display unit comprising the functional panel according to claim 1,
wherein the input unit comprises a sensing region,
wherein the input unit senses an object approaching the sensing region, and
wherein the sensing region and the first pixel overlap each other.

15. A data processing device comprising:
an arithmetic device; and
an input/output device,
wherein the arithmetic device is configured to be supplied with one of input data and sensing data,
wherein the arithmetic device is configured to generate control data and image data on the basis of the input data or the sensing data,
wherein the arithmetic device is configured to supply the control data and the image data,
wherein the input/output device is configured to supply the input data and the sensing data,
wherein the input/output device is configured to be supplied with the control data and the image data,
wherein the input/output device comprises a display unit, an input unit and a sensor unit,
wherein the display unit comprises the functional panel according to claim 1,
wherein the display unit is configured to display the image data on the basis of the control data,
wherein the input unit is configured to generate the input data, and
wherein the sensor unit is configured to generate the sensing data.

16. A data processing device comprising:
at least one of a keyboard, a hardware button, a pointing device, a touch sensor, an illuminance sensor, an imaging device, an audio input device, an eye-gaze input device, and an attitude sensing device; and
the functional panel according to claim 1.

17. A panel comprising a first pixel and a second pixel, the first pixel and the second pixel each comprising:
a substrate;
a functional layer comprising a transistor over the substrate;
a light-emitting device over the functional layer;

a microlens array over the light-emitting device, the microlens array comprising a plurality of microlenses; and an insulating film, wherein one of the plurality of microlenses comprises a first surface facing the light-emitting device and a second surface opposite to the first surface, wherein the first surface is convex toward the light-emitting device wherein the insulating film comprises an opening, wherein the opening and the light-emitting device overlap each other, wherein the opening comprises an inclined surface on a side wall, and wherein the inclined surface reflects light toward the microlens.

18. The panel according to claim 17, further comprising a color conversion layer over the microlens array.

19. The panel according to claim 17, wherein the second surface is a flat surface.

20. The panel according to claim 17, wherein the microlens array of the first pixel and the microlens array of the second pixel have the same shape.

21. The panel according to claim 17, wherein the microlens array is configured to collect light emitted from the light-emitting device.

* * * * *